US005714833A

United States Patent [19]
Zumeris

[11] Patent Number: 5,714,833
[45] Date of Patent: Feb. 3, 1998

[54] CERAMIC MOTOR

[75] Inventor: Jona Zumeris, Nesher, Israel

[73] Assignee: Nanomotion Ltd., Haifa, Israel

[21] Appl. No.: 618,503

[22] Filed: Mar. 19, 1996

Related U.S. Application Data

[63] Continuation-in-part of Ser. No. 101,174, Aug. 3, 1993, Pat. No. 5,453,653, and a continuation-in-part of Ser. No. 272,921, Jul. 8, 1994, Pat. No. 5,616,980, and a continuation-in-part of Ser. No. 374,435, Jan. 19, 1995.

[30] Foreign Application Priority Data

Jul. 18, 1995 [IL] Israel ......................... 114656

[51] Int. Cl.$^6$ .................... H01L 41/08; H02N 2/00
[52] U.S. Cl. ............................ 310/328; 310/331
[58] Field of Search ..................... 310/323, 328, 310/330, 331

[56] References Cited

U.S. PATENT DOCUMENTS

| | | | |
|---|---|---|---|
| 4,727,278 | 2/1988 | Staufenberg et al. | 310/328 |
| 4,905,107 | 2/1990 | Klein | 360/75 |
| 5,087,851 | 2/1992 | Nakazawa et al. | 310/323 |
| 5,202,863 | 4/1993 | Miyatake et al. | 369/13 |
| 5,291,472 | 3/1994 | Lemelson | 369/100 |
| 5,400,192 | 3/1995 | Mizoshita et al. | 360/77.16 |
| 5,432,395 | 7/1995 | Grahn | 310/328 |
| 5,453,653 | 9/1995 | Zumeris | 310/323 |
| 5,521,778 | 5/1996 | Boutaghou et al. | 350/106 |
| 5,557,486 | 9/1996 | Akagi et al. | 360/97.01 |

FOREIGN PATENT DOCUMENTS

| | | |
|---|---|---|
| 52-29192 | 3/1977 | Japan . |
| 60-176471 | 9/1985 | Japan . |
| 2-26283 | 1/1990 | Japan . |
| 4-145877 | 5/1992 | Japan . |
| 5-258481 | 10/1993 | Japan . |

*Primary Examiner*—Thomas M. Dougherty
*Attorney, Agent, or Firm*—Darby & Darby

[57] ABSTRACT

A disc drive including a piezoelectric plate having two long and two short edges and a spacer attached to one of the long edges and at least one arm pivotable about an axis, the arm having first and second ends spaced from the axis and on opposite sides thereof, a read/write head attached to the first end of the arm and a rigid element on the second end of the arm, wherein the spacer of the piezoelectric plate is resiliently urged against the rigid element. In one preferred embodiment of the invention, the piezoelectric plate is stationary. In another preferred embodiment of the invention, the piezoelectric plate is movable with respect to the axis.

59 Claims, 37 Drawing Sheets

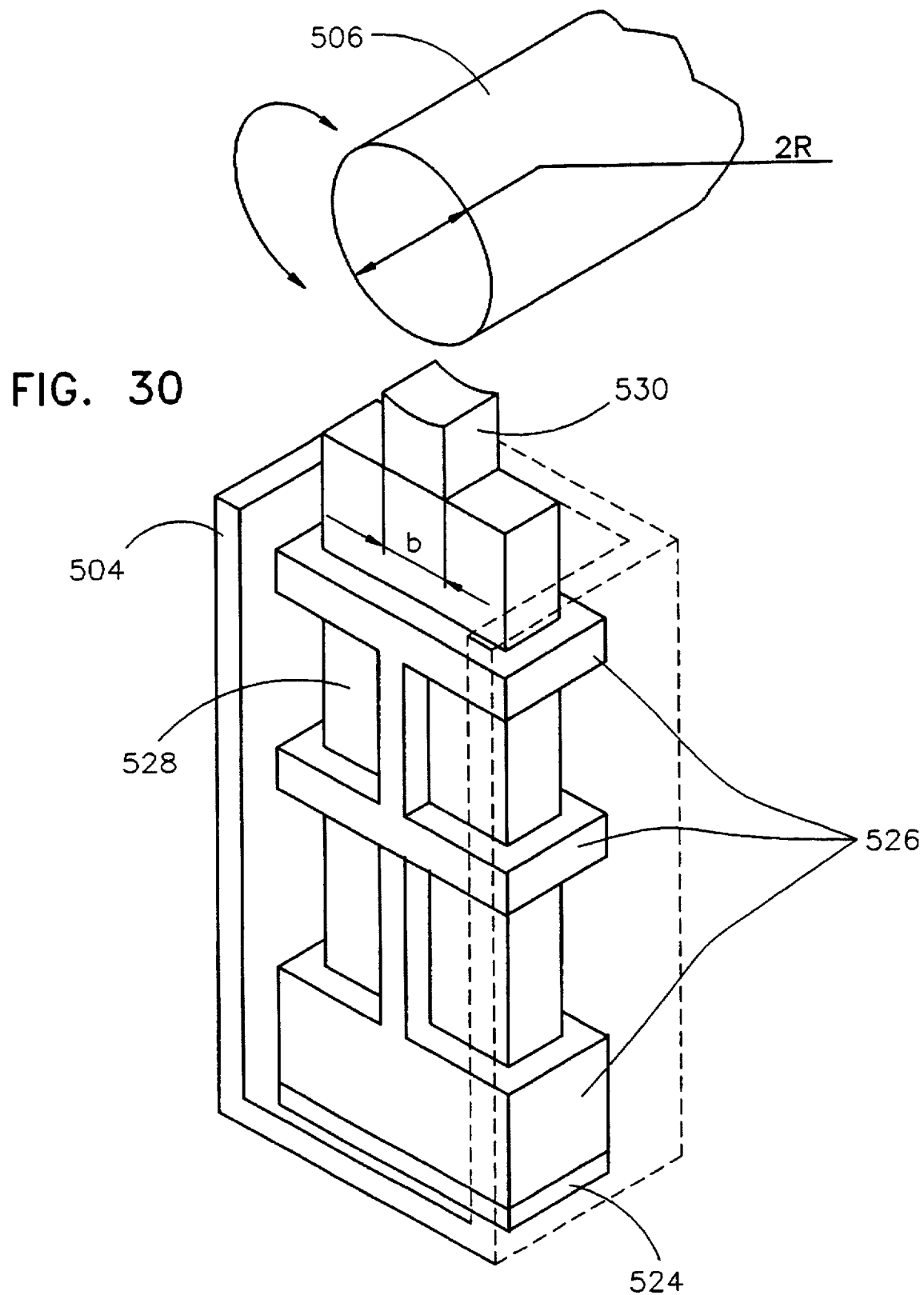

CERAMIC MOTOR

RELATED APPLICATIONS

This application is a continuation in part of U.S. patent application Ser. No. 08/101,174, filed Aug. 3, 1993, now U.S. Pat. No. 5,453,653 and of U.S. patent application Ser. No. 08/272,921, filed Jul. 8, 1994, now U.S. Pat. No. 5,616,980 and of U.S. patent application Ser. No. 08/374,435, filed Jan. 19, 1995.

FIELD OF THE INVENTION

This invention relates to micro-motors and more particularly to piezoelectric motors.

BACKGROUND OF THE INVENTION

The use of resonant piezoelectric ceramics to provide linear and rotational motion is well known. The major advantages of such systems is the capability of achieving very fine motion without the use of moving mechanical parts. In general such systems are limited to 1 micrometer of motion accuracy in open loop operation and 50 nanometers in closed loop operation. The velocity is limited to 5 to 10 mm/sec when the weight of a plate to be moved is 0.5 kg. Under these circumstances the force applied to the plate in the direction of motion is limited to about 5N. It would be useful in many situations to achieve better resolution, higher velocities and greater motional drive force for such motors. Improved resolution would be especially useful if the ability to move at relatively high velocities was also preserved.

SU 693493 describes a piezoelectric motor comprising a flat rectangular piezoelectric plate having one electrode covering essentially all of one large face of the plate (the "back" face) and four electrodes each covering a quadrant of the front face. The back electrode is grounded and diagonal electrodes are electrically connected. Two ceramic pads are attached to one of the long edges of the plate and these pads are pressed against the object to be moved by a spring mechanism which presses against the other long edge.

The long and short directions have nearby resonant frequencies (for different mode orders) such that when one pair of connected electrodes is excited with an AC voltage to which the ceramic is responsive, the object moves in one direction, and when the other pair is excited the object moves in the other direction.

SUMMARY OF THE INVENTION

It is an object of some aspects of the present invention to provide a micromotor having higher speed, greater driving force and smaller minimum step size than micromotors of the prior art.

One aspect of the present invention comprises a thin rectangular piezoelectric ceramic having at least one electrode on one of the large faces thereof and a plurality of electrodes on the other large face. Preferably, a single spacer of hard material is attached to the center of a short edge of the piezoelectric ceramic and is pressed against a body. When at least some of the electrodes are electrified, as described below, movement of either the piezoelectric ceramic or the body along the length of the edge of the piezoelectric ceramic occurs.

In one embodiment of this aspect of the invention, the dimensions of the rectangular large face are preferably chosen such that the piezoelectric ceramic has closely spaced resonances for x and y (the dimensions of the large rectangular face of the piezoelectric ceramic), albeit in different modes. Preferably the resonances have overlapping response curves.

Excitation of the piezoelectric ceramic is achieved by connecting an AC voltage at a frequency at which both modes are excited to selected ones of the plurality of electrodes. In this embodiment, the resonant excitation is applied for at least some minimal period if a small displacement is required and can be applied for a longer period if greater displacement is required.

In a second embodiment of this aspect of the invention, the excitation is a non-resonant non-symmetrical pulse of voltage to certain of the plurality of electrodes. The present inventor has found that when such a pulse, for example, a triangular pulse having a relatively higher rise than fall time, is used, extremely small motion can be achieved. Such excitation is especially useful where it is desired that no residual voltage remain on the electrodes after the motion.

In a third embodiment of this aspect of the invention, the excitation is switched between resonant AC excitation for relatively large steps and pulsed, preferably triangular, excitation, when small steps are required.

A number of electrode configurations are possible in accordance with the invention. In one configuration, the plurality of electrodes comprise two rectangular electrodes, each covering half of one of the rectangular surfaces of the piezoelectric ceramic, and lying along the long direction of the large rectangular face of the ceramic.

A second preferred electrode configuration provides four electrodes which cover the four quarters of the large face of the piezoelectric ceramic. One, two or three of these electrodes can be excited, where the different modes of excitation (AC and pulsed) and excitation configurations result in larger or small minimum step sizes for the movement caused by the motor.

Another aspect of the invention includes the use of a plurality of stacked piezoelectric ceramics, which have the same resonant frequencies, but which are preferably fabricated of different piezoelectric materials, one of which is substantially softer than the other. The ceramics having different hardnesses are driven by out of phase signals at the same frequency. In such a system, the harder material provides a high driving force during the part of the cycle in which it drives the body and the softer material provides a longer contact time but with a smaller force. This combination allows for a high starting drive to overcome inertia and static friction forces, combined with a smooth operation during movement.

A preferred embodiment of the invention includes the use of a mode suppressor which increases the efficiency of the micromotor by suppressing resonant modes other than the desired one.

According to yet another aspect of the invention an arm is attached at one of its ends to the short edge of the piezoelectric ceramic, opposite the spacer bearing edge. A spacer which is to be urged against the body is attached to a second end of the arm. In operation the two spacers execute similar, out of phase motion at the body to be moved, increasing the force output of the micromotor and providing a smoother motion of the body which is urged against the spacers, by utilizing the motion and force of both ends of the piezoelectric ceramic.

Another aspect of the invention includes the use of resilient elements which exert resilient force to the long edges of the piezoelectric plate, at points thereof having substantially zero movement perpendicular to the long edges. Such elements are used to provide symmetric motion to the body in both directions parallel to the short edges of the piezoelectric plate.

According to still another aspect of the invention a piezoelectric micromotor according to the invention is utilized to move an optical or magnetic read/write head of a disc drive.

There is therefore provided, in a preferred embodiment of the invention, a micromotor for moving a body comprising:
- at least one rectangular piezoelectric plate having long and short edges and first and second faces, electrodes attached to the first and second faces and a ceramic spacer attached to a first one of the edges, preferably at the center thereof and preferably to a short edge thereof, and operative to be pressed against the body;
- a source of resilient force applied to a second edge opposite the first edge, preferably to the center thereof and pressing the ceramic spacer against the body; and
- a voltage source which electrifies at least some of the electrodes.

In a preferred embodiment of the invention the voltage source electrifies at least some of the electrodes with asymmetric unipolar pulsed excitation.

Preferably, the voltage source is operative to selectively electrify some of the electrodes with either asymmetric unipolar pulsed or AC excitation.

In a preferred embodiment of the invention the electrodes comprise a plurality of electrodes on the first face of the piezoelectric plate, preferably comprising an electrode in each quadrant thereof, and at least one electrode on the second face.

In a preferred embodiment of the invention electrodes in the quadrants along one long edge of the first face of the plate are electrified with a unipolar asymmetrical pulsed voltage of a first polarity and electrodes in the quadrants along the other long edge of the first face are electrified with a unipolar asymmetrical pulsed voltage of opposite polarity.

Alternatively, electrodes in the respective quadrants closest to the ceramic spacer are electrified with unipolar asymmetrical pulsed voltages of opposite polarities or electrodes in the respective quadrants further from the ceramic spacer are electrified with unipolar asymmetrical pulsed voltages of opposite polarities.

In a preferred embodiment of the invention electrodes in a first pair of diagonally situated quadrants are electrified with a unipolar asymmetrical pulsed voltage of a given polarity and, preferably, electrodes in a second pair of diagonally situated quadrants are electrified with a unipolar asymmetrical pulsed voltage of a polarity opposite that of the given polarity.

In a preferred embodiment of the invention the micromotor comprises a plurality of said piezoelectric plates, the ceramic spacer of each of the plates being resiliently pressed against the body. Preferably, at least one of the plurality of plates is formed of a relatively harder piezoelectric material and at least one of the plurality of plates is formed of a relatively softer piezoelectric material. In a further preferred embodiment of the invention the voltage source is operative to electrify at least one of the plurality of plates out of phase with each other.

There is further provided, in accordance with a preferred embodiment of the invention, a micromotor for moving a body comprising:
- at least one rectangular piezoelectric plate having long and short edges and first and second faces and having electrodes attached to the first and second faces, at least some of the electrodes being electrified with asymmetric unipolar pulsed excitation; and
- a source of resilient force which resiliently urges one of the edges or one or more extensions of the edge against the body.

There is further provided, in accordance with a preferred embodiment of the invention, a micromotor for moving a body comprising:
- at least one rectangular piezoelectric plate having long and short edges and first and second faces and having electrodes attached to the first and second faces;
- a source of resilient force which resiliently urges one of the edges or one or more extensions of the edge against the body; and
- a voltage source operative to selectively electrify at least some of the electrodes with asymmetric unipolar pulsed excitation or AC excitation.

There is further provided, in accordance with a preferred embodiment of the invention, a micromotor for moving a body comprising:
- a plurality of rectangular piezoelectric plates having long and short edges and first and second faces and having electrodes attached to the first and second faces, at least some of the electrodes on each plate being electrified; and
- a source of resilient force which urges one of the edges or one or more extensions of the edge of each of the plurality of plates against the body.

There is further provided, in accordance with a preferred embodiment of the invention, a micromotor for moving a body comprising:
- at least one rectangular piezoelectric plate having long and short edges and first and second faces and having electrodes attached to the first and second faces, one of the electrodes being energized with a voltage which causes a force essentially only toward one edge of the plate and at least one of the other electrodes is energized with a voltage which causes movement of at least a portion of the edge having a component along said edge.

There is further provided, in accordance with a preferred embodiment of the invention, a micromotor for moving a body comprising:
- a rectangular piezoelectric plate having two long and two short edges, first and second faces and electrodes attached to the first and second faces;
- an electrical power supply for electrifying at least some of the electrodes to establish a desired resonant mode of the piezoelectric plate; and
- a mode suppressor which suppresses resonant modes other than the desired resonant mode.

In a preferred embodiment of the invention, the mode suppressor comprises at least one constraining member adapted to constrain dimensional variation of the piezoelectric plate which are caused by resonant modes other than the desired resonant mode.

There is further provided, in accordance with a preferred embodiment of the invention, a micromotor for moving a body comprising:
- a rectangular piezoelectric plate having two long and two short edges, first and second faces and a first ceramic spacer attached to the center of a first short edge of the piezoelectric plate and operative to be pressed against the body; and an arm having a second spacer attached to one end thereof and having the second end thereof attached to a second short edge of the piezoelectric plate, the first and second spacers having adjacent, parallel and coplanar faces.

There is further provided, in accordance with a preferred embodiment of the invention, a micromotor for moving a body comprising:

a plurality of rectangular piezoelectric plates having long and short edges and first and second faces and having electrodes attached to the first and second faces, at least some of the electrodes on each plate being electrified, said rectangular plate having holes therein spaced along a central longitudinal axis thereof; and at least one lever having one end thereof rotatably mounted in a hole.

Preferably, the other end of the lever is rotatably mounted on a fixed plate or, alternatively, on a plate which is constrained to move only in the direction of said axis.

In all of the above described embodiments, the ceramic spacer is preferably attached to one of the short edges of the piezoelectric plate, preferably to the center of the short edge thereof, such that the long dimension of the plate is substantially perpendicular to the engaged surface, since optimal driving motion is produced at the short edges of the ceramic plate. For systems in which the available space perpendicular to the engaged surface is limited, in a preferred embodiment of the invention an alternative ceramic micromotor is provided in which motion of a short edge of the piezoelectric ceramic plate is utilized to drive a body juxtaposed with a long edge of the plate using a spacer attached to the long edge of the plate near the corner of the long edge and the short edge.

According to this aspect of the present invention, the spacer moves substantially in accordance with the resonant motion at the short edge but the engaged surface is driven in parallel to the long axis of the ceramic plate. To avoid asymmetry for right and left motion, two juxtaposed piezoelectric ceramic plates are preferably used, with the spacer bearing corners adjacent to each other.

There is thus further provided, in accordance with a preferred embodiment of the invention, a paired piezoelectric micromotor for providing motion relative to a body including:

first and second rectangular piezoelectric plates, each having first and second long edges, first and second short edges and front and back faces, the first short edge of the first plate being juxtaposed and substantially parallel to the first short edge of the second plate, each plate having electrodes attached to the front and back faces thereof and each plate having a ceramic spacer attached to the first long edge at the end thereof near the first short edge, the ceramic spacer engaging a surface of the body;

a source of resilient force applied to the plate which presses the ceramic spacer against the surface of the body; and a voltage source which electrifies at least some of the electrodes with an excitation voltage.

In one preferred embodiment of the invention, the source of resilient force is applied to at least a portion of the second long edge. Additionally or alternatively, the source of resilient force is applied to points on the piezoelectric plates where the motional amplitude perpendicular to the surface is substantially zero.

There is further provided, in accordance with a preferred embodiment of the invention, a micromotor comprising:

first and second substantially rectangular piezoelectric plates spaced from each other, each plate having two long and two short edges and first and second faces, the faces of adjacent plates being parallel and facing each other and long edges of adjacent plates being parallel; and at least one fixed support engaging a first long edge of a first plate and at least one resilient support engaging a second long edge of the first plate; at least one resilient support engaging the first long edge of the second plate and at least one fixed support engaging the second long edge of the second plate, the first long edge of the first plate being adjacent to the first long edge of the second plate.

Preferably, each support engages a respective long edge at a point of substantially zero movement in a direction perpendicular to the long edges, and is slidable in a direction substantially parallel to the long edges.

There is further provided, in accordance with a preferred embodiment of the invention, a micromotor comprising at least one substantially rectangular piezoelectric plate having long and short edges and first and second faces, electrodes attached to the first and second faces, resilient elements which exert resilient force against each of the long edges of the piezoelectric plate at two points of substantially zero movement in a direction perpendicular to the long edges; and an electrical power supply for selectively electrifying at least some of the electrodes in two modes, one mode which provides motion at a short edge in a first direction parallel to that short edge, and a second mode which provides motion in a second direction, opposite to the first direction.

In another preferred embodiment of the invention, the micromotor further comprises a structural assembly adapted to provide symmetric motion and force in the first and second directions. Preferably, the structural assembly incorporates the resilient elements.

In a preferred embodiment of the invention, the voltage source electrifies at least some of the electrodes with AC excitation.

Additionally, in a preferred embodiment, the electrodes include a plurality of electrodes on the front face of each piezoelectric plate and at least one electrode on the back face of each piezoelectric plate. Preferably, the plurality of electrodes include an electrode in each quadrant of the front face and the voltage source is operative to electrify at least some of the electrodes on each front face with AC excitation.

In a preferred embodiment of the invention, electrodes of diagonally situated quadrants in each plate are electrified with excitation voltages of the same polarity.

Further, in a preferred embodiment, the electrode of the quadrant between the first long edge and the first short edge of the first plate is electrified with an excitation voltage of a first polarity and the electrode of the quadrant between the first long edge and the first short edge of the second plate is electrified with a voltage of a second polarity opposite the first polarity.

In one preferred embodiment of the present invention, the voltage source electrifies at least some of the electrodes with a pulsed excitation voltage including pulses of AC excitation separated by intervals of a DC voltage having an absolute value greater than the amplitude of the AC excitation. Preferably, the pulsed rate of the pulsed excitation voltage substantially corresponds to a self-resonance frequency of the body.

In a further preferred embodiment of the present invention, each of the first and second rectangular piezoelectric plates has at least one additional electrode attached to at least one of the long edges thereof and the voltage source electrifies at least some of the additional electrodes. Preferably, the at least one additional electrode includes an electrode on the first long edge near the first short edge.

More preferably, the at least one additional electrode also includes an electrode on the second long edge near the second short edge.

The voltage source preferably electrifies the additional electrodes with an excitation voltage which enhances motion of the ceramic spacers in a direction generally perpendicular to the surface of the body. Preferably, the voltage source electrifies each additional electrode with an excitation voltage of the same polarity as that of the electrode on the front face quadrant adjacent to the additional electrode.

In a preferred embodiment of the invention, the first and second piezoelectric plates are resiliently supported at points on the plates where the motional amplitude perpendicular to the surface of the body is substantially zero.

In a preferred embodiment of the invention, the source of resilient force is adjustable.

In a preferred embodiment of the invention, the micromotor includes a plurality of the first piezoelectric plates and a plurality of the second piezoelectric plates, the ceramic spacer of each of the plates being resiliently pressed against the body.

In some preferred embodiments of the present invention, the micromotor further includes a counter-bearing arrangement which engages a surface of the body opposite the surface engaged by the spacers so as to provide counter forces to forces applied to the body by the spacers. Preferably, the counter-bearing arrangement includes a piezoelectric ceramic bearing having electrodes attached to at least one flat surface thereof and the voltage source electrifies at least some of these electrodes.

There is further provided, in accordance with a preferred embodiment of the invention, a disc drive including:

an arm pivotable about an axis, the arm having first and second ends spaced from the axis and on opposite sides thereof, a read/write head attached to the first end and a rigid element attached to the second end; and at least one piezoelectric plate micromotor resiliently urged against the rigid element.

In a preferred embodiment of the invention, the piezoelectric plate is stationary. In an alternative preferred embodiment of the invention, the piezoelectric plate is movable with respect to the axis.

There is further provided, in accordance with a preferred embodiment of the invention, a disc drive including an arm pivotable about an axis, the arm having first and second ends spaced from the axis, a read/write head attached to the first end and a piezoelectric plate attached to the second end and movable with the arm.

In a preferred embodiment of the invention, the axis extends through the piezoelectric plate.

In a preferred embodiment of the invention, the micromotor further includes a rigid element which is urged against the piezoelectric plate.

There is further provided, in accordance with a preferred embodiment of the invention, a micromotor for moving a body including first and second substantially rectangular piezoelectric plates, each plate having two long and two short edges, the first piezoelectric plate being pivotable about an axis, and a ceramic spacer attached to a short edge of the second piezoelectric plate and operative to be urged against an edge of the first piezoelectric plate.

Preferably, the spacer attached to the second piezoelectric plate is urged against a long edge of the first piezoelectric plate.

In some preferred embodiments of the invention, the micromotor further includes a rigid arc shaped element situated between the spacer of the second piezoelectric plate and the edge of the first piezoelectric plate against which the spacer is urged.

Additionally, in accordance with a preferred embodiment of the invention, there is provided a disc drive including:

a housing;

an arm having first and second ends and having at least one read/write head mounted near the first end thereof;

an axle fixedly connected to the arm near the second end thereof and extending substantially perpendicularly with respect to the arm and through a portion of the housing; and at least one piezoelectric plate having a spacer attached to an edge thereof, wherein the spacer of the at least one piezoelectric plate is resiliently urged against at least one, respective, portion of the axle outside the housing.

In a preferred embodiment of the invention, the portion of the housing forms a substantially dust-proof barrier between the at least one piezoelectric plate and the interior of the housing. Preferably, the disc drive further includes a sealed bearing where the axle extends through the portion of the housing.

In a preferred embodiment of the invention, each of the at least one piezoelectric plate includes two long edges and two short edges and the spacer is attached to one of the short edges.

According to one, preferred, embodiment of the present invention, the at least one piezoelectric plate includes at least two piezoelectric plates and the spacers of the two piezoelectric plates engage and disengage the axle at two different locations. Preferably, in this preferred embodiment, the spacers of the two piezoelectric plates engage and disengage the axle substantially simultaneously. Additionally or alternatively, in this embodiment, the spacers of the two piezoelectric plates engage and disengage the axle from substantially opposite directions.

According to another, preferred embodiment of the present invention, the at least one piezoelectric plate includes at least three piezoelectric plates and the spacers of each of the at least three plates engage at least three, respective, locations on the axle. Preferably, in this preferred embodiment of the invention, at least two of the at least three plates do not engage and disengage the axle simultaneously.

Further, in accordance with a preferred embodiment of the present invention, there is provided a double disc drive including:

a first arm having first and second, spaced apart, sites;

a second arm substantially parallel to the first arm and having first and second, spaced apart, sites;

a first axle fixedly connected to the first site of the first arm and extending substantially perpendicularly with respect to the arm;

a second axle fixedly connected to the first site of the second arm and extending substantially co-axially with the first axle;

at least one read/write head attached to the second site of the first arm;

at least one read/write head attached to the second site of the second arm;

first and second piezoelectric plates each plate having a spacer attached to an edge thereof, wherein the spacer of the first piezoelectric plate is resiliently urged against a portion of the first axle and wherein the spacer of the second piezoelectric plate is resiliently urged against a portion of the second axle.

In a preferred embodiment of the invention, the double disc drive further includes a housing and the first and second axles extend through a portion of the housing such that the first and second piezoelectric plates are urged against the first and second axles outside the housing.

In a preferred embodiment of the invention, the disc drive further includes a first sealed bearing between the first axle and the portion of the housing and a second sealed bearing between the first axle and the second axle.

BRIEF DESCRIPTION OF THE DRAWINGS

The present invention will be understood and appreciated more fully from the following detailed description, taken in conjunction with the drawings in which:

FIG. 30 is a more detailed, schematic, perspective illustration of a portion of the piezoelectric micromotor arrangement of FIGS. 29A and 29B;

DETAILED DESCRIPTION OF PREFERRED EMBODIMENTS

Figure 1D:
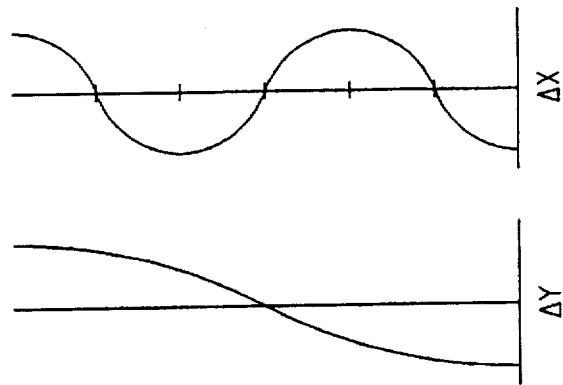
FIGS. 1D and 1E show a second excitation configuration (1E), in accordance with a preferred embodiment of the invention, for the element of FIG. 1 together with mode plots (1D) for that configuration.
Figure 1E:
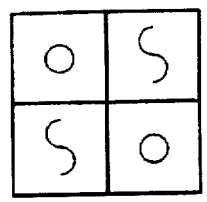
Figure 1A:
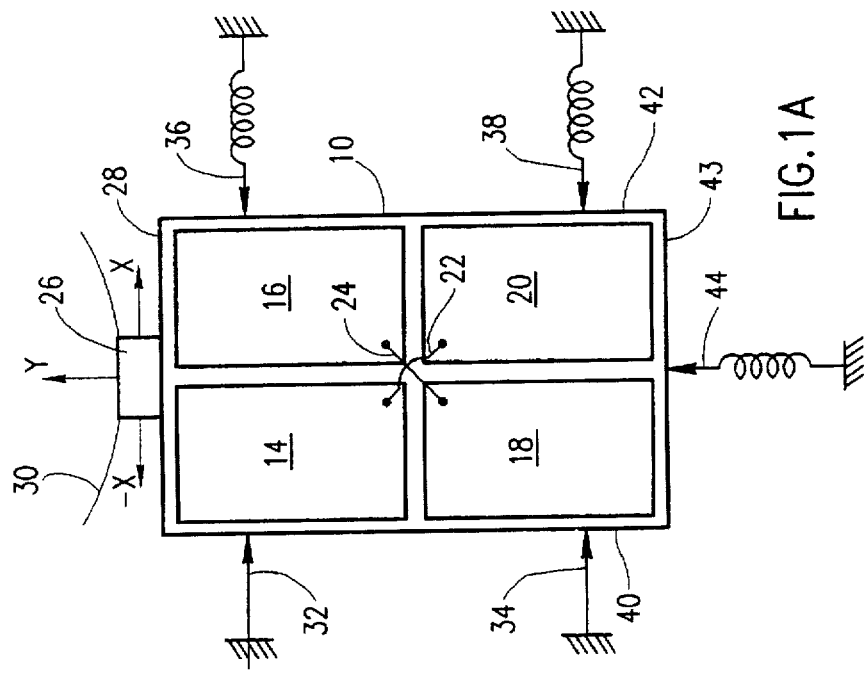
FIG. 1A is a simplified view of a piezoelectric ceramic element useful in a motor in accordance with a preferred embodiment of the present invention.

Reference is made to FIG. 1A which shows one large face of a relatively thin rectangular piezoelectric ceramic 10 for use in a motor in accordance with a preferred embodiment of the invention. Four electrodes 14, 16, 18 and 20 are plated or otherwise attached onto the face (hereinafter, "the first face") of the piezoelectric ceramic to form a checkerboard pattern of rectangles, each substantially covering one-quarter of the first face. The opposite face of the piezoelectric ceramic (hereinafter "the second face") is preferably substantially fully covered with a single electrode (not shown). Diagonally located electrodes (14 and 20; 16 and 18) are electrically connected by wires 22 and 24 preferably placed near the junction of the four electrodes. The electrode on the second face is preferably grounded. Alternatively, the electrodes can be connected by printed circuit techniques similar to those used to form the electrodes.

A relatively hard ceramic spacer 26 is attached, for example with cement, to a short edge 28 of piezoelectric ceramic 10, preferably at the center of the edge.

Figure 1B:
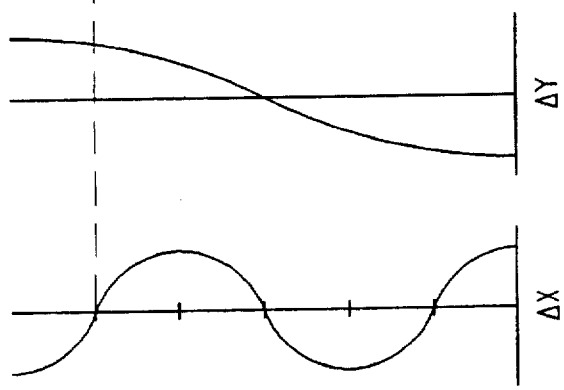
FIGS. 1B and 1C show a first excitation configuration (1C), in accordance with a preferred embodiment of the invention, for the element of FIG. 1 together with mode plots (1B) for that configuration.
Figure 2:
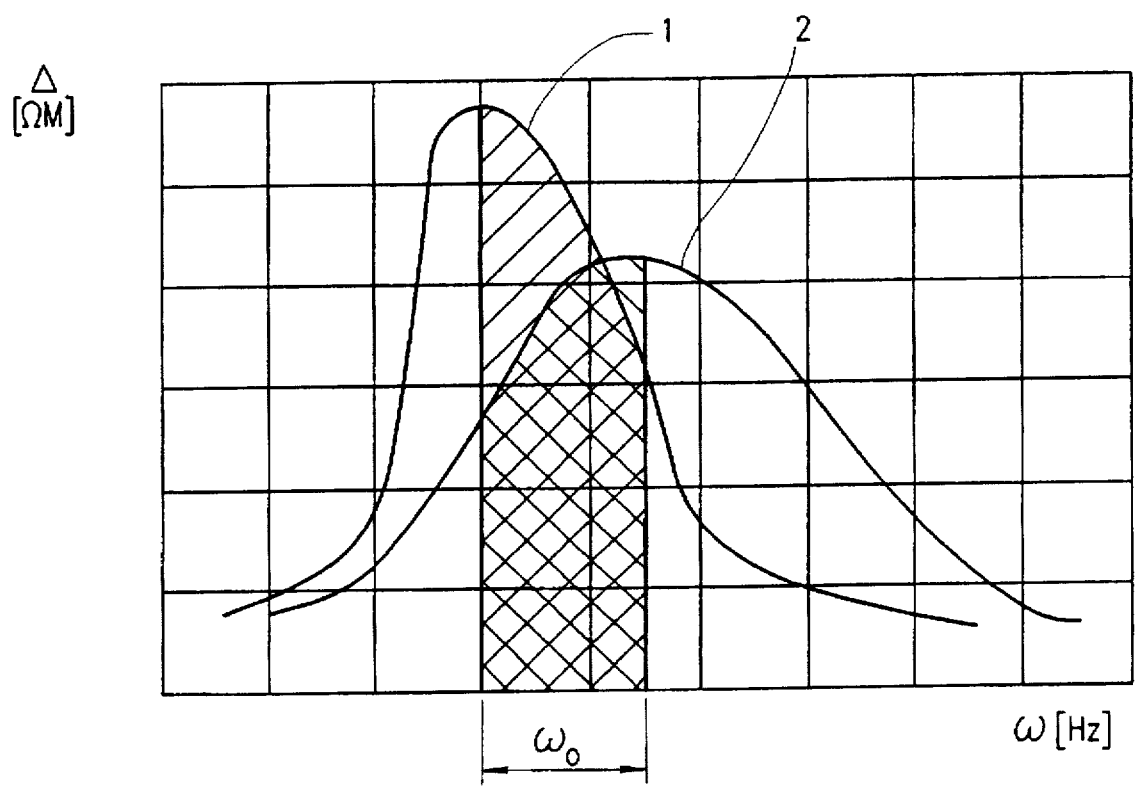
FIG. 2 shows resonance curves for two closely spaced resonant modes of the element of FIG. 1, in accordance with a preferred embodiment of the invention.

Piezoelectric ceramic 10 has a large number of resonances. In particular, the dimensions of piezoelectric ceramic 10 are chosen such that resonances for $\Delta x$ and $\Delta y$ are closely spaced and have overlapping excitation curves as shown in FIG. 2. In particular, the resonances which are preferred in accordance with the present invention are a one-half (½) mode resonance for $\Delta y$ and a one and one-half (1½) mode resonance for $\Delta x$ as shown in FIGS. 1B and 1D. However, other resonances can be used depending on the dimensions of ceramic 10.

Figure 1C:
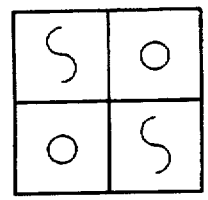

When piezoelectric ceramic 10 is excited by a frequency within the band indicated as $\omega_0$ in FIG. 2, both the $\Delta x$ and $\Delta y$ resonances will be excited. FIG. 1C shows one configuration for electrifying certain electrodes thereby exciting the two resonances. In this configuration, in which electrodes 16 and 18 are electrified and electrodes 14 and 20 are left floating (or less preferably, grounded), the mode amplitudes are shown in FIG. 1B. Excitation in this configuration causes $\Delta x$ to be negative when $\Delta y$ is positive, resulting in leftward movement of a body 30 which is pressed against piezoelectric ceramic 10 if piezoelectric ceramic 10 is constrained from movement. While the surface of body 30 is shown as being curved, such as the surface of a cylinder which is to be rotated, it can also be flat when linear motion is desired.

For the excitation configuration shown in FIG. 1E in which electrodes 14 and 20 are electrified and 16 and 18 are left floating (or less preferably, grounded), the $\Delta y$ mode is the same, but the $\Delta x$ mode is reversed in phase, causing movement to the right.

In a preferred embodiment of the invention, piezoelectric ceramic 10 is constrained from movement by a pair of fixed supports 32 and 34 and two spring loaded supports 36 and 38. Supports 32–38 contact piezoelectric ceramic 10 at points of zero movement in the x direction along a pair of long edges 40 and 42 of the ceramic. These supports are designed to slide in the y direction.

Such spring loading is provided to reduce the effects of wear and to provide a degree of shock protection for the piezoelectric ceramic.

A spring loaded support 44 is preferably pressed against the middle of a second short edge 43 of piezoelectric ceramic 10 opposite short edge 28. Support 44 supplies pressure between ceramic 26 and body 30 which causes the motion of ceramic 26 to be transmitted to body 30. It should be understood that spring loaded support 44 has a much slower time response than a cycle of the frequency at which piezoelectric ceramic 10 is excited. Thus, the face of ceramic 26 which is pressed against body 30 actually moves away from the body during part of the cycle when ceramic 26 is moving opposite the direction of motion applied to body 30.

In a preferred embodiment of the invention, spring loaded supports 36, 38 and 44 are stiff solid rubber cylinders (springs), preferably of Silicone rubber preferably having a Shore A hardness of about 60. In practice such "springs" can be fabricated by cutting a portion of an O-Ring (such as those marketed by Parker-Hannifin) to a desired size. Preferably, the resonance of the springs should be far from that of the piezoelectric ceramics used. In a preferred embodiment of the invention, a hard spherical or hemispherical element is placed between the spring element and the ceramic.

In a preferred embodiment of the invention, the dimensions of piezoelectric ceramic 10 are 30 mm×7.5 mm with a thickness of between 2 and 5 mm when PZT piezoelectric material manufactured by Morgan Matroc Inc. is used. For this configuration, 30–500 volts of AC may be used to excite piezoelectric ceramic 10, depending on the speed desired, the weight of body 30 (and/or the pressure of spring 44) and the power required. Such a device operates at a frequency in the range of 20–100 KHz, has a minimum step size in the range of 10 nanometers (nm) and a maximum velocity of about 15–350 mm/sec (or more). These are nominal ranges only and may vary depending on the material used for piezoelectric ceramic 10, the dimensions, the resonant mode which is selected and other factors.

In practice the larger dimension of the ceramic can be between 20 mm and 80 mm and the smaller dimension can be between 3 mm and 20 mm. For example a very long and thin device (e.g., 3 mm×80 mm) would result in a motor with a very high speed.

Using a spacer 26 attached to a short edge 28 of piezoelectric ceramic 10 urged against body 30 increases the force output of a micromotor of a given size, in comparison to a micromotor of the same size to which no spacer is attached, in which short edge 28 directly engages body 30. This improved operation results from the concentration of the resonant mode energy, which is produced in the piezoelectric ceramic during excitation, into the spacer.

Preferably, spacer 26 should not affect the resonant modes of the system. Furthermore, it is desired to achieve a maximum amplitude obtainable for x directed motion for a given power output. These goals may be achieved by using an extremely thin spacer. However, a spacer which is thin in terms of the resonant frequency is often too thin, physically, to be practical. A more practical solution, in accordance with a preferred embodiment of the invention, is to utilize a spacer very nearly equal in length to two, three or four half wavelengths of the resonant mode in the spacer. Spacer 26 is preferably fabricated of 99% Alumina. Due to the difference in materials between the ceramic and the spacer, a half wavelength of the resonant mode in the spacer is approximately three times shorter than a half wavelength in the ceramic, for the same frequency. In practice a ceramic spacer having a length of approximately 4–5 mm has been found to be suitable.

In the embodiments described above in conjunction with FIGS. 1 and 2, excitation of piezoelectric ceramic 10 in FIG. 1A is by an AC voltage near the resonances of the piezoelectric ceramic. In the method depicted in FIGS. 3 and 4, the excitation is by a pulsed unipolar voltage. In this pulsed excitation embodiment of the invention, electrodes 14, 16, 18 and 20 are not connected together in a fixed manner as in the embodiment of FIG. 1, but are connected in different ways, depending on the minimum step required, as described below.

Figure 3:
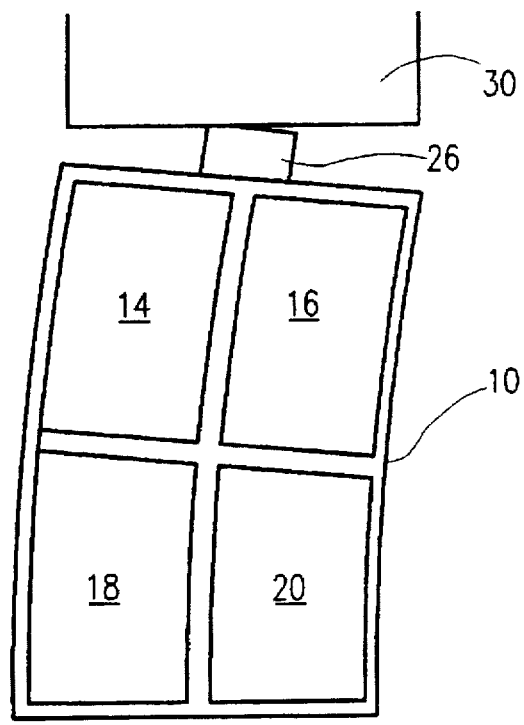
FIG. 3 shows a representation of a bi-morphological movement of a piezoelectric element useful in a motor in accordance with a preferred embodiment of the invention.

The principle by which the pulsed method operates is shown in FIG. 3. In this figure, electrodes 14 and 18 are excited by a positive DC voltage and electrodes 16 and 20 are excited by a negative DC voltage with respect to the electrode on the second side of piezoelectric ceramic 10. Under this excitation the left side of piezoelectric ceramic 10 becomes longer than the right side (shown greatly exaggerated in FIG. 3) and ceramic 26 moves to the right. Of course when the voltage is removed, the ceramic will move back to its original position.

Figure 4:
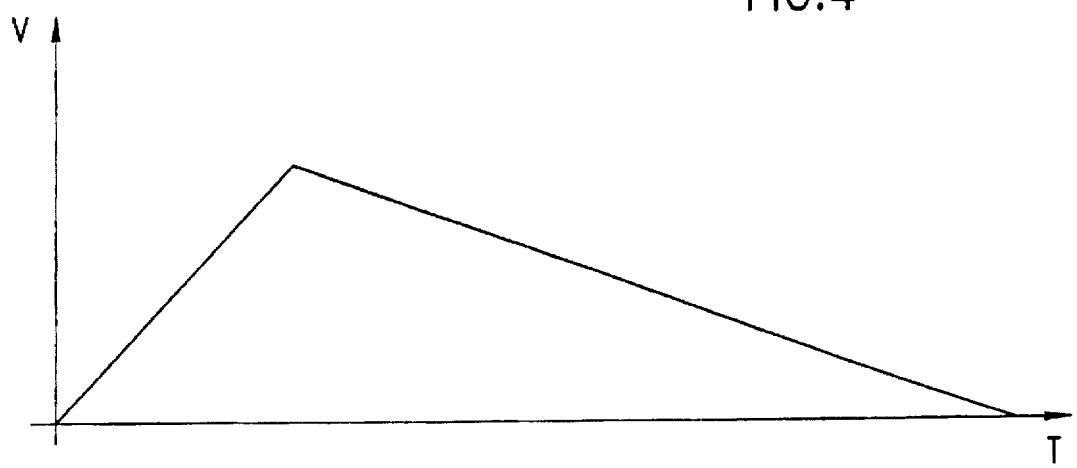
FIG. 4 shows a voltage pulse which, when applied to electrodes on the element shown in FIG. 3, causes controlled motion of a body in contact with the element.

However, the present inventor has found that, if a non-symmetrical voltage pulse, such as that shown in FIG. 4, is applied to the electrodes, then, during the return to zero, the body will not return with ceramic 26 to the starting position. Preferably the fall time of the pulse should be at least four times as long as the rise time. A total pulse time of 10 to 50 milliseconds is preferred, but the exact times will depend on the mass which is moved by the piezoelectric ceramic and on the force of spring 44. Under experimental conditions rise time of 1 microsecond and a fall time of 15 millisecond gave excellent results. The minimum step for this configuration will depend on the pulse voltage and can vary from 2–6 nm for peak voltages of 30–100 volts, with a larger minimum step for greater masses due to the increased inertia of the mass. This mode is generally not used for large movements but is most useful for final placement of the object to be moved. Reversing the polarity of the excitation or applying a pulse having slow rise time and a fast fall time results in travel in the opposite direction. While the operation of the body in this mode is not well understood, extremely small minimum steps can be achieved.

Alternatively only one of the pairs of electrodes is electrified and the other pair is either grounded or allowed to float.

In an alternative embodiment of pulsed operation of the motor, electrodes 14 and 16 are electrified to the same voltage and electrodes 18 and 20 are electrified to a voltage having the opposite polarity (or are grounded or allowed to float). Such electrification will also result in very small movement.

Other configurations of excitation of the electrodes with such pulsed voltages yield other minimum step values. For example, excitation of electrode 14 with a positive pulse and electrode 16 with a negative pulse (while grounding electrodes 18 and 20 or allowing them to float, will result in a minimum step of about 2–5 nm. Excitation of electrodes 18 and 20 with respective positive and negative pulses (while preferably allowing 14 and 16 to float) will result in a minimum step of 5–8 nm. A similar value of minimum step is achieved when electrodes 14 and 18 are pulsed with one polarity and electrode 20 is pulsed with the opposite polarity (electrode 16 is floating). Alternatively, the electrodes which are indicated above as floating can be grounded, however, this will result in a lower efficiency.

In a particularly useful differential mode, electrodes 14 and 20 are pulsed positive and electrodes 16 and 18 are grounded, allowed to float or are pulsed negative. In this mode very small minimum movements can be achieved in the range of 0.1–2 nm. The diagonal electrodes may be pulsed with voltages of the same or differing amplitudes.

While the pulsed excitation is preferably utilized with the configuration shown in FIG. 4, it is also useful when applied to configurations of the prior art such as that of SU 693494 described above, where each of the electrodes is separately excitable.

In a preferred embodiment of a motor according to the invention, piezoelectric ceramic 10 is first excited by an AC voltage as described in conjunction with FIGS. 1 and 2 to produce fast movement to the vicinity of a target position and is then excited by pulsed voltages as described above in conjunction with FIGS. 3 and 4. One preferred embodiment of a motor system including provision for such excitation is shown in block diagram form in FIG. 5.

Figure 5:
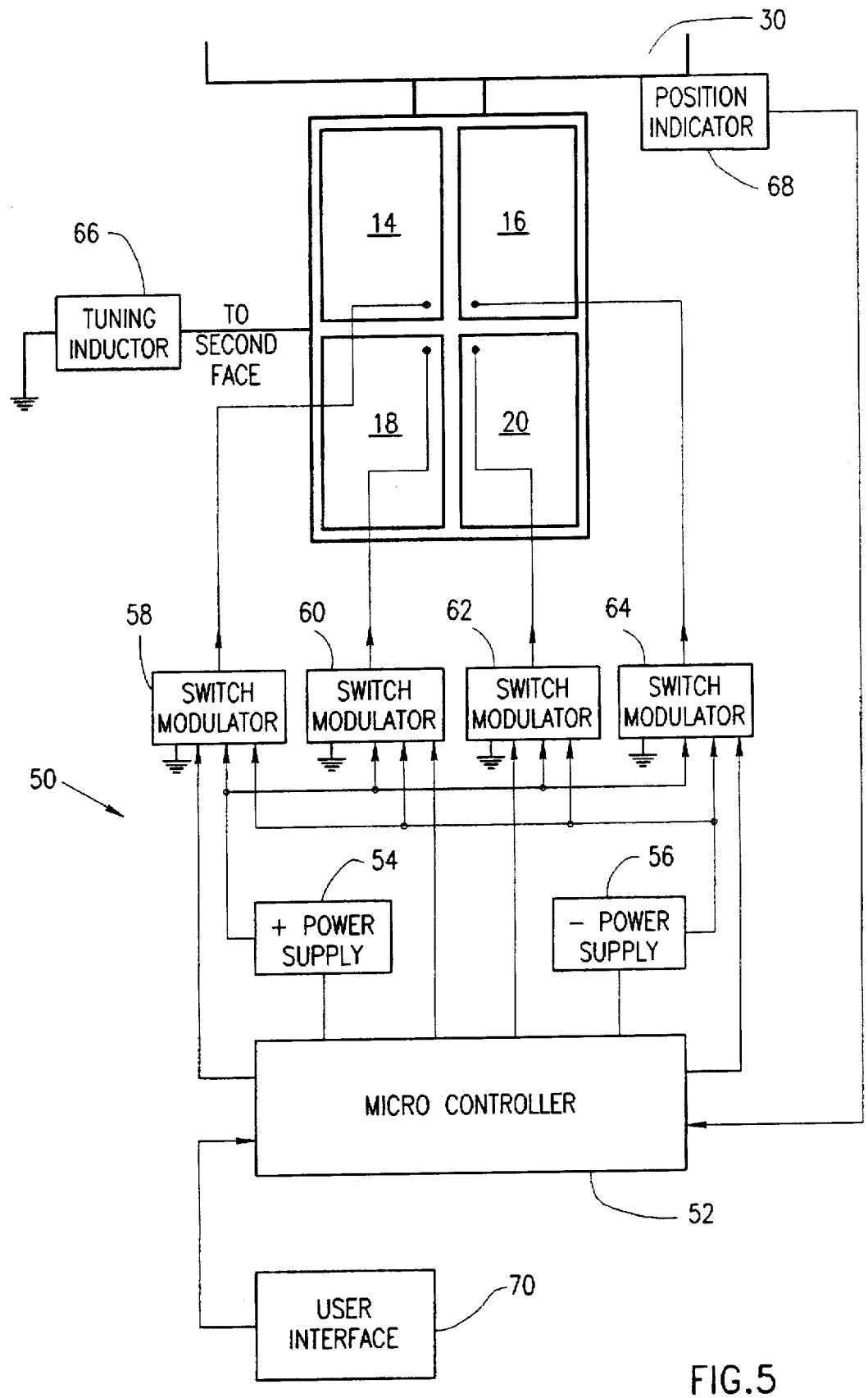
FIG. 5 is a partially schematic, partially block diagram of a micromotor for achieving controlled motion in accordance with a preferred embodiment of the invention.

As shown in FIG. 5, a control system 50 includes a controller, for example, a microcontroller 52 which controls the energizing of a pair of regulated power supplies 54 and 56 respectively and four switch/modulator circuits 58, 60, 62 and 64. Each of the switch modulators is connected to one of electrodes 14, 16, 18 or 20. The electrode on the second face is connected to ground, preferably via a tuning inductor 66.

Microcontroller 52 preferably receives position signals from a position indicator 68, which indicates the position of body 30 and provides feedback to microcontroller 52. Microcontroller 52 also preferably receives position (or movement) and, optionally, velocity commands from a user interface 70.

In operation, microcontroller 52 receives a position command from user interface 70 and compares it to the actual position indicated by indicator 68. If the command is a movement command, the position is only noted for later comparison.

Microcontroller 52 notes the amount of movement which is required and based on predetermined optimization criteria, decides if the AC or pulsed mode is appropriate and in which direction the body most move. Appropriate signals are sent to the switch/modulators so that they produce either AC or pulsed voltages (or no voltage or ground) to each of the electrodes such that piezoelectric ceramic 10 operates in an appropriate excitation configuration as described above. When the remaining distance to be traveled is reduced below an appropriate level, microcontroller 52 switches to a high resolution, low speed mode utilizing appropriate pulsed excitation as described above in conjunction with FIGS. 3 and 4. Several changes in excitation regime may be appropriate when high position accuracies are desired. When body 30 arrives at the target destination, the excitation of the electrodes is terminated.

Inductor 66 is used to tune the electrical resonance of piezoelectric ceramic 10 and its associated wiring to the same frequency as the mechanical resonances of piezoelectric ceramic 10. Since the electrical circuit consists largely of the capacitance formed by the electrodes on the first and second faces of piezoelectric ceramic 10, it is appropriate to add an inductor, such as inductor 66 to "tune-out" this capacitance and improve the efficiency of the system.

While motion control of the system has been described with respect to a closed loop system, open loop operation is possible, at lower accuracy. For closed loop operation, it is believed that the system can achieve accuracies better than about 0.5 nm. For open loop operation, the amount of movement can be estimated fairly closely and the position can be controlled to within about 0.1% to 1% of the total amount of motion.

Figure 22A:
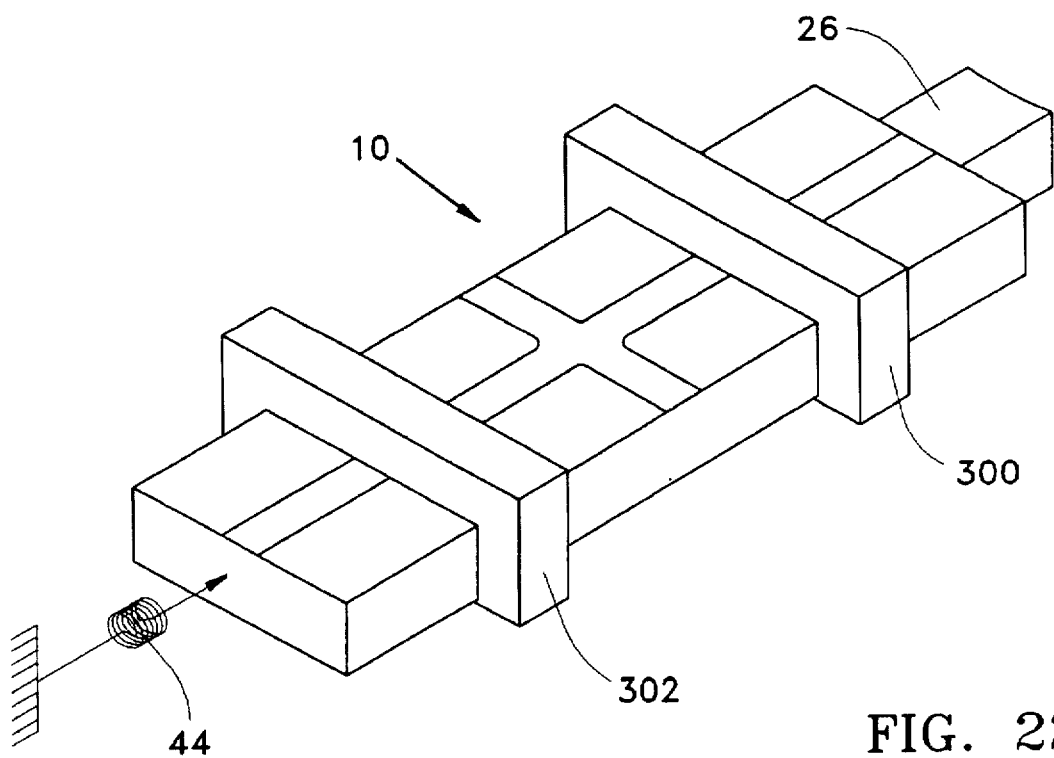
FIG. 22A is a schematic illustration of a piezoelectric micromotor employing constraining members to suppress undesired resonant modes in accordance with a preferred embodiment of the invention.
Figure 22B:
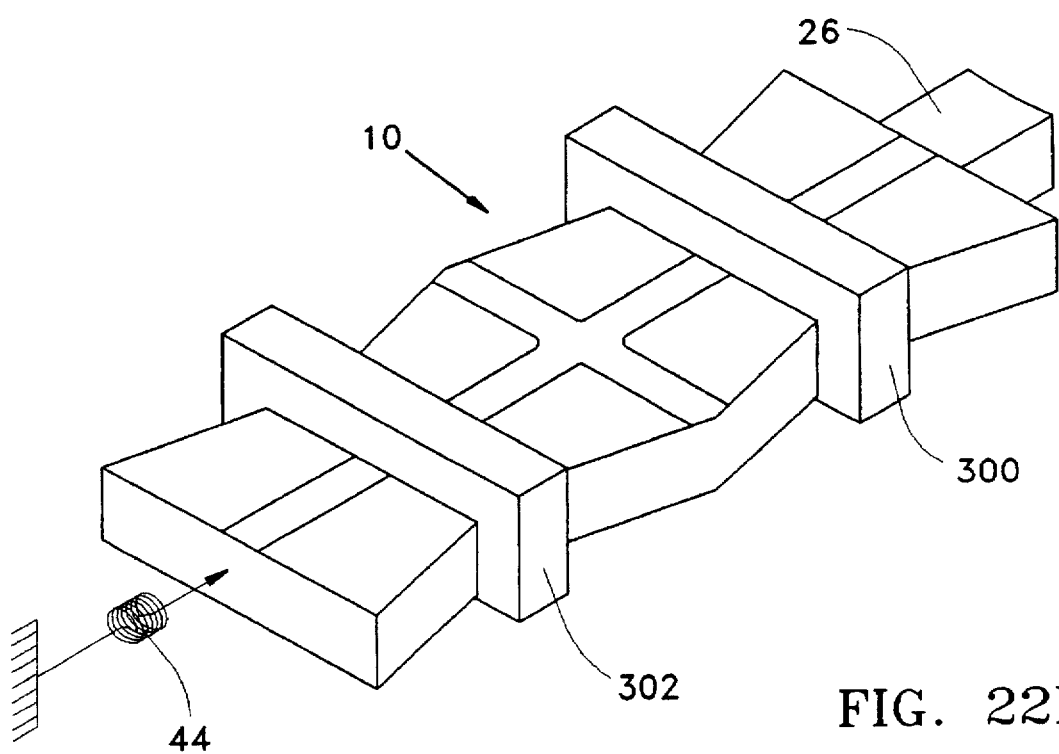
FIG. 22B shows exaggerated vibrational motion in the micromotor of FIG. 22A.

In accordance with a preferred embodiment of the invention, at least one constraining member is employed to increase the efficiency of the micromotor by suppressing resonant modes other than the desired resonant mode. FIG. 22A illustrates a configuration wherein two constraining members are employed, and FIG. 22B illustrates a configuration as in FIG. 22A showing exaggerated dimensional variations of ceramic 10 for the desired mode. Constraining members 300 and 302, which are adapted to tightly fit the profile of piezoelectric ceramic 10, may be fabricated of thread or wire and may be glued to the piezoelectric ceramic. Alternatively, members 300 and 302 may include a plastic or metal molding. Members 300 and 302 are preferably situated at points of zero dimensional variation in x direction for the desired mode of operation, namely at approximately ⅙ and at approximately ⅚ of the length of ceramic 10. Other modes have dimensional variations at one or both of these points, and are therefore suppressed. In such a configuration, the motion amplitude of spacer 26 can be increased by up to 30% compared to the amplitude obtained for the same input power in a micromotor without constraining members. Alternatively, only one constraining member, either 300 or 302, is employed.

Figure 23A:
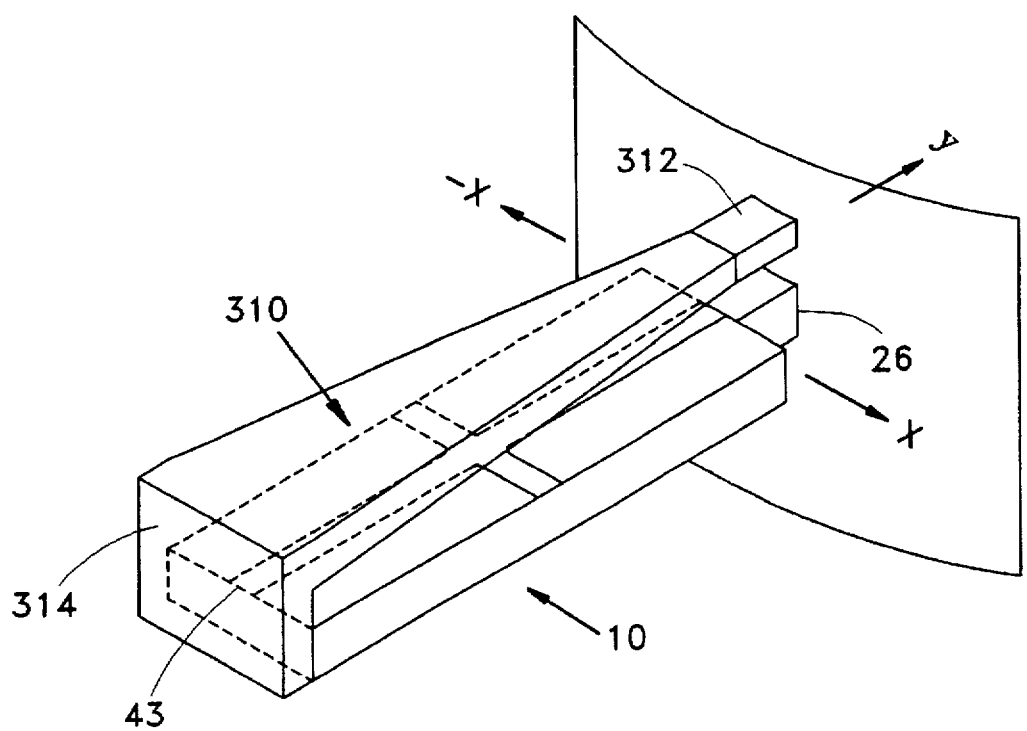
FIG. 23A is a schematic illustration of a piezoelectric micromotor employing a rigid arm to provide increased output and smoother motion in accordance with a preferred embodiment of the invention.

In a preferred embodiment of the invention, as illustrated in FIG. 23A, a rigid arm 310 is attached to the short edge of the piezoelectric ceramic 10 opposite the spacer bearing edge to increase the output force of the micromotor and to smooth the motion of the body which is urged against the spacer. Arm 310 is preferably mounted substantially parallel to a face of piezoelectric ceramic 10 and one end of arm 310 is mounted onto a short edge 43 of ceramic 10 via a vertical member 314. A spacer 312, adapted to be urged against body 30, is attached to the other end of arm 310 near the edge of ceramic 10 at which spacer 26 is attached.

There are a number of possible alternative preferred configurations of the embodiment of FIG. 23A. In one such configuration, spacer 312 is preferably a ceramic, while vertical member 314 is preferably fabricated of aluminum. In this configuration, special care should be taken to avoid vertical member 314 shorting the electrodes on the first face of piezoelectric ceramic 10. In an alternative configuration, vertical member 314 is a ceramic. In the configurations described above, vertical member 314 may be attached along the entire short edge 43 or may be attached only to the center of short edge 43, for example, by a ceramic spacer.

Figure 23B:
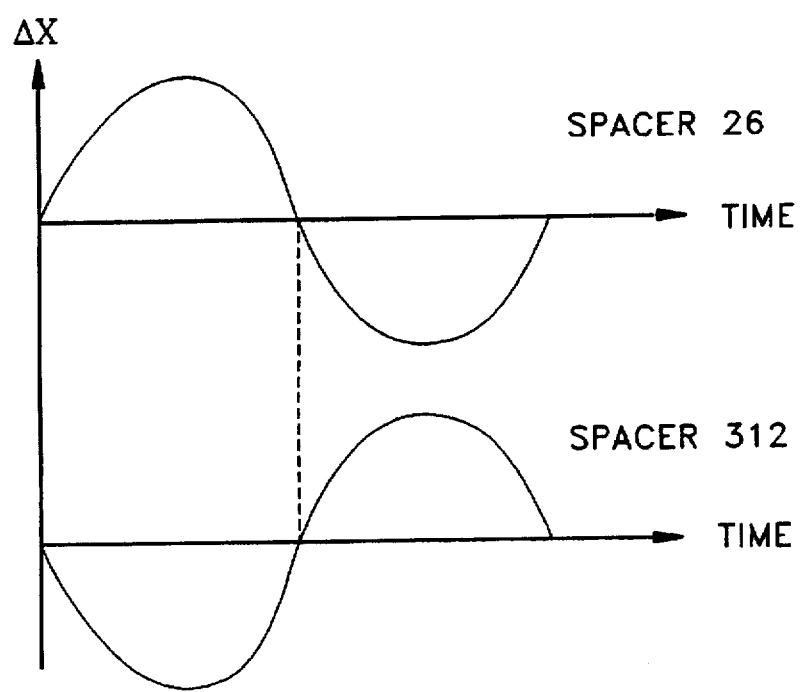
FIG. 23B shows qualitatively the relative motions of the two spacers which are preferably employed by the micromotor of FIG. 23A, for a selected excitation configuration.

Utilization of one of the configurations described above in conjunction with excitation of piezoelectric ceramic 10 by AC voltage in a configuration as shown in FIGS. 1C or 1E, results in an out of phase motion of spacer 312 with respect to spacer 26 (180° phase difference), as illustrated in FIG. 23B. As a result, the force exerted on body 30 is doubled and the motion of body 30 becomes smoother, compared to a micromotor in which no such arm is employed.

Alternatively, other excitations and configurations of element 10, as described herein, may be employed in conjunction with the apparatus shown in FIGS. 22A–23B.

In a preferred embodiment of a motor in accordance with the invention, a plurality of piezoelectric ceramics can be configured to increase the power of the motor and to reduce any variability which exists between different units. One such configuration, shown in FIG. 6, includes two piezoelectric ceramics 10 and 10' in a tandem configuration, i.e., one in which the two ceramics are mounted in tandem in the direction of motion induced by piezoelectric ceramics 10 and 10'. The two piezoelectric ceramics can be driven by a common control system such as control system 50 shown in FIG. 5 or by separate control systems. For clarity, the control systems and electrical connections are not shown in FIG. 6.

Figure 6:
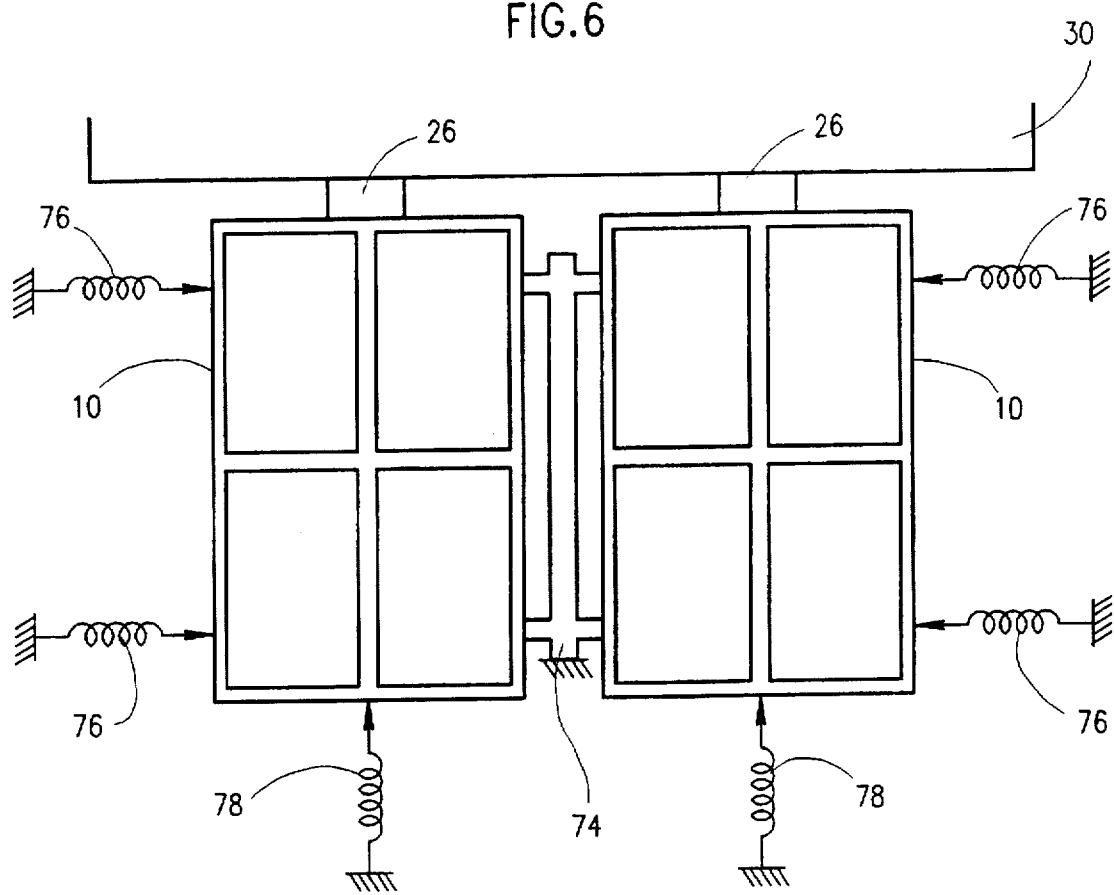
FIG. 6 is a schematic drawing of a tandem configuration of piezoelectric ceramic elements useful in a motor in accordance with a preferred embodiment of the invention.

As shown in FIG. 6, a spacer unit 74 located intermediate piezoelectric ceramics 10 and 10', supports and separates the piezoelectric ceramics. Four spring loaded side supports 76 and two spring loaded end supports 78 support the pair of piezoelectric ceramics in much the same way as described above with respect to the embodiment of FIG. 1. In practice piezoelectric ceramics 10 and 10' are also constrained from moving perpendicular to the face of the piezoelectric ceramics, preferably by extensions of spacer unit 74 and spring loaded supports 76 and 78. Such constraints are shown in FIG. 7.

Figure 7:
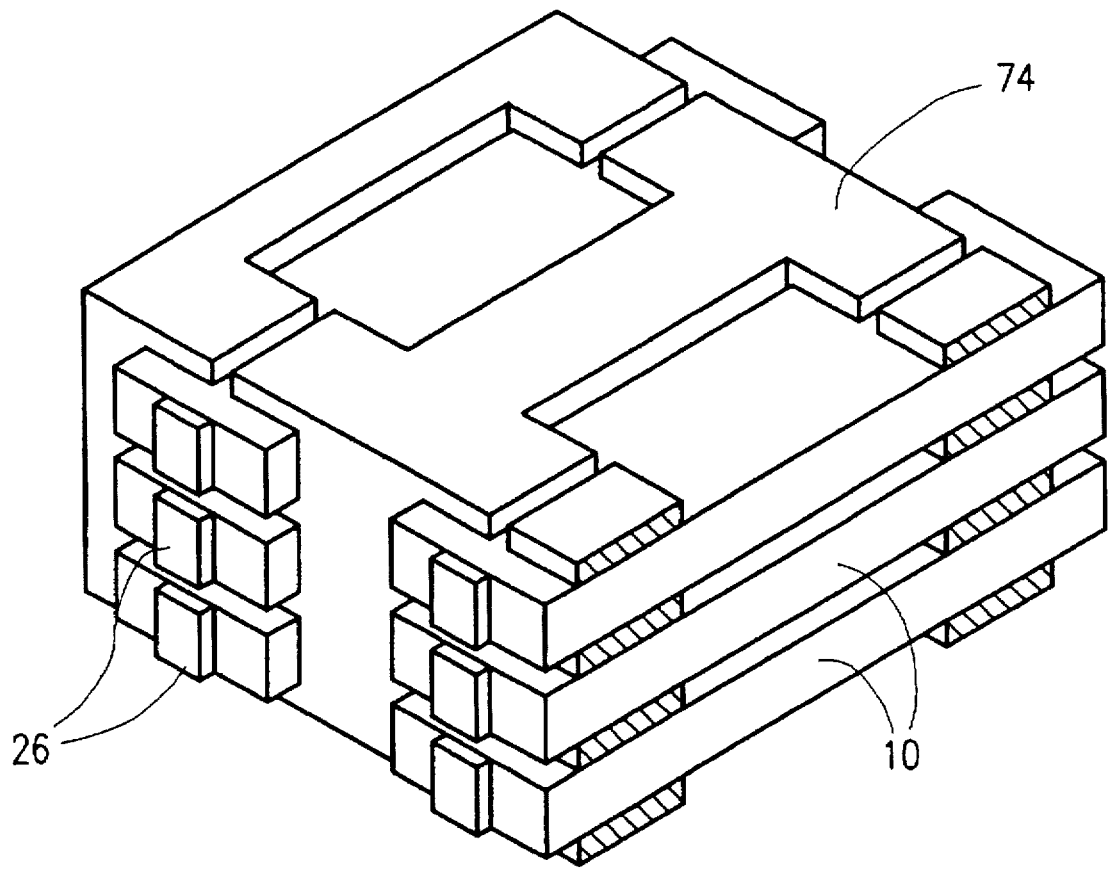
FIG. 7 is a schematic drawing of a tandem/parallel configuration of piezoelectric ceramic elements useful in a motor in accordance with a preferred embodiment of the invention.

FIG. 7 shows six piezoelectric ceramics configured in a 2 by 3 unit tandem/parallel configuration. Due to pictorial constraints, the spring loaded supports and the mechanism for pressing spacer unit 74 against the piezoelectric ceramics are not shown, however, the preferred support mechanism is that shown in FIG. 6. Other configurations, such as a 2×4 tandem/parallel configuration are also useful.

In a preferred embodiment of a motor in accordance with the invention, the piezoelectric ceramics used in the embodiments shown in FIGS. 6 and 7 are not all the same. In this embodiment of the invention, one or more of the piezoelectric ceramics is made from a relatively hard material such as PZT-8 (manufactured by Morgan Matroc Inc.) and one or more of the piezoelectric ceramics is made from a softer material such PZT-5H (manufactured by Morgan Matroc). The two types of materials can be physically configured such that they have the same x and y dimensions and the same resonances and resonant frequencies can be obtained by adjusting the thickness of the various piezoelectric ceramics. Alternatively, the same thickness can be used for both materials. In such a configuration the broader Q of the soft material will assure that both the harder and softer materials are adequately excited at the same frequency.

When the softer piezoelectric ceramic is electrified, the amplitude of the resonance is greater in both $\Delta x$ and $\Delta y$ and the portion (time) of the period during which ceramic 26 contacts the body is greater than for the harder piezoelectric ceramic. However, by its nature, the amount of motive force which the softer piezoelectric ceramic applies is lower and the unevenness of the motion is also lower.

In a preferred embodiment of the invention, where both types of piezoelectric ceramic are used, as described in the previous paragraph, the harder piezoelectric ceramic is operative to overcome static friction and other inertial forces and the softer piezoelectric ceramic is operative to give a smoother, more accurate, motion with smoother stops and starts than when only a hard piezoelectric ceramic is used.

In a preferred embodiment of the invention, the two types of ceramic are excited out of phase with each other (180° phase difference). In this way, the two types of piezoelectric ceramic act in an essentially independent manner (at different parts of the excitation cycle) and there is a minimum of friction due to the differing motions of the two types of piezoelectric ceramic. In a preferred embodiment of the invention, the phase reversal is achieved by using ceramics with reversed polarization directions for the two ceramics. Alternatively, the voltages can be applied out of phase. Reversed phase operation of the ceramics is also useful when two piezoelectric ceramics of identical characteristics are used.

X-Y motion having all of the advantages of the present invention is also possible.

Figure 8B:
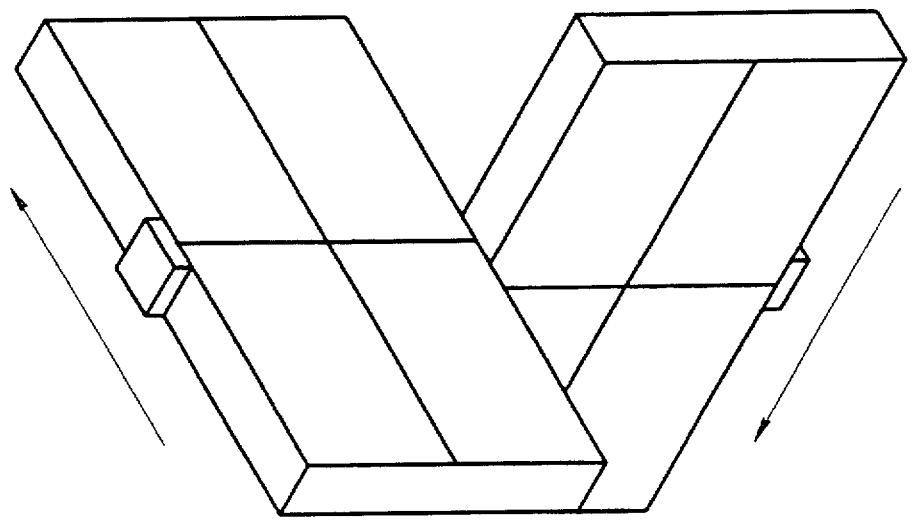
FIG. 8B is a schematic drawing of two piezoelectric ceramic elements configured and adapted for x-y motion in accordance with an alternative preferred embodiment of the invention.
Figure 8A:
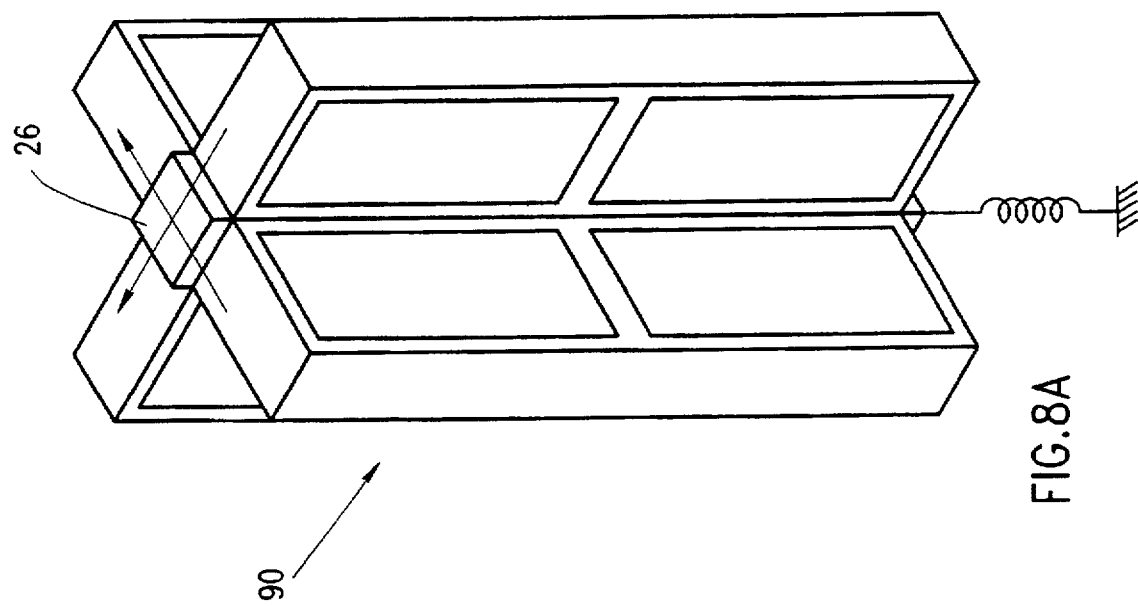
FIG. 8A is a schematic drawing of a piezoelectric ceramic element configured and adapted for x-y motion in accordance with a preferred embodiment of the invention.

One configuration for producing X-Y motion is shown in FIG. 8A. An integral X-shaped section 90 is formed of piezoelectric ceramic material and has front and back electrodes formed on the larger flat internal faces of the section. The internal faces which are not shown (and which oppose the faces which are fully or partially shown) are supplied with a single electrode running the entire face. These single electrodes are grounded (or alternatively connected to the system power supply common return), in accordance with a preferred embodiment of the invention, and the electrodes which are shown are activated in accordance with the schemes previously described. To construct an X-Y table With such a device would only require holding the ceramic as described above in accordance with FIGS. 1 and 7 and adding a flat table contacting ceramic 26. A number of such x-shaped sections 90 of the same or different ceramics may be used in a parallel-tandem configuration as described above with respect to FIGS. 6 and 7.

FIG. 8B shows a second, simpler to visualize, but less compact configuration in which two piezoelectric ceramics such as those shown in FIG. 1 are cemented together to achieve x motion at one end and y motion at the other end.

Figure 8C:
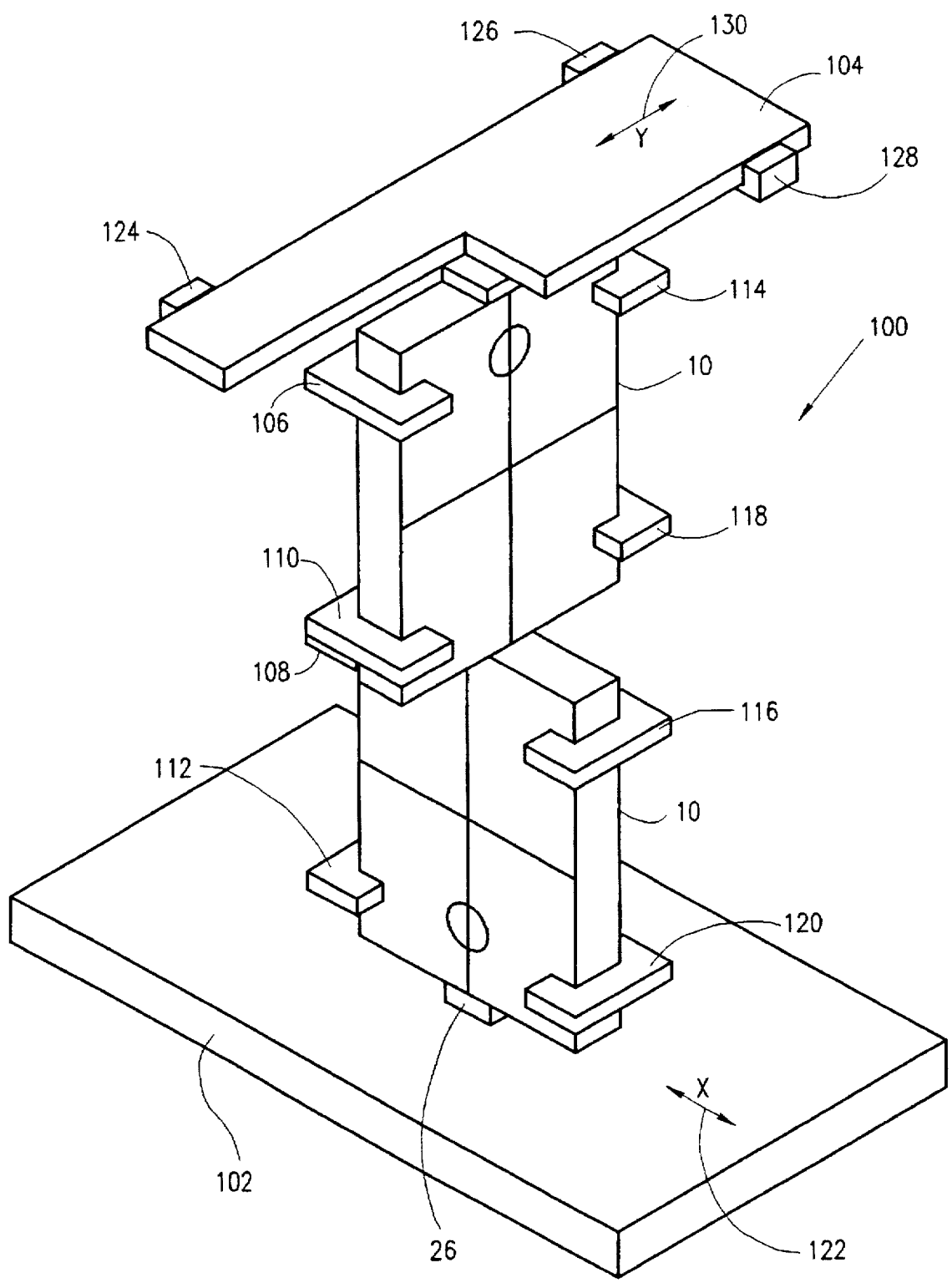
FIG. 8C is a schematic partial drawing of an x-y table utilizing the embodiment of FIG. 8B.

An x-y table 100 constructed in accordance with a preferred embodiment of the present invention and using the configuration of FIG. 8B is shown in simplified form in FIG. 8C. Table 100 comprises two piezoelectric ceramics 10 in the configuration of FIG. 8B sandwiched between a fixed base 102 and a top 104. Supports 106, 108, 110, 112, 114 and 116, 118 and 120 are similar in form and function to supports 32, 34, 36 and 38 of FIG. 1. All of supports 106–120 are mounted together on a fixture (not shown for clarity of presentation) but are not attached to base 102. However, sliders which allow for sliding movement in the x-direction (shown by arrows 122) between the fixture and base 102 are preferably provided and are attached to the fixture.

A set of sliders 124, 126 and 128 are provided for allowing motion of top 104 with respect to the fixture in the y direction shown by arrows 130. Preferably sliders 124–128 are attached to the fixture.

In summary, the fixture includes supports for the upper and lower piezoelectric ceramics 10 and sliders which allow sliding motion of the fixture with respect to base 102 in the x direction and of top 104 with respect to the fixture in the y direction.

In operation, activation of the lower piezoelectric ceramic causes it to move in the x direction. Since top 104 is constrained by the fixture from movement in the x direction with respect to the fixture, top 104 moves by the same amount as the fixture in the x direction. Thus, activation of the lower piezoelectric ceramic causes x motion of top 104. When the upper piezoelectric ceramic is activated, top 104 moves in the y direction with respect to the fixture. Since the fixture is constrained from any movement in the y direction with respect to the base, top 104 moves with respect to base 102.

Selective activation of the upper and lower piezoelectric ceramics results in x-y motion of top 104 with respect to base 102, having all of the advantages of the embodiments for linear motion shown above with respect to the embodiments of FIGS. 1–7. Activation of only one of the piezoelectric ceramics results in motion in only one direction.

Using the principles outlined above x, y, z motion or x, y, θ motion or motion along a plurality of non-orthogonal axes is possible, using a different ceramic to provide motion along each of the axes.

Furthermore, tandem and series arrangements of piezoelectric ceramics of differing or the same hardness will result in similar improvements to those described, with respect to FIGS. 6 and 7, for such tandem arrangements with respect to linear motion devices.

Figure 9:
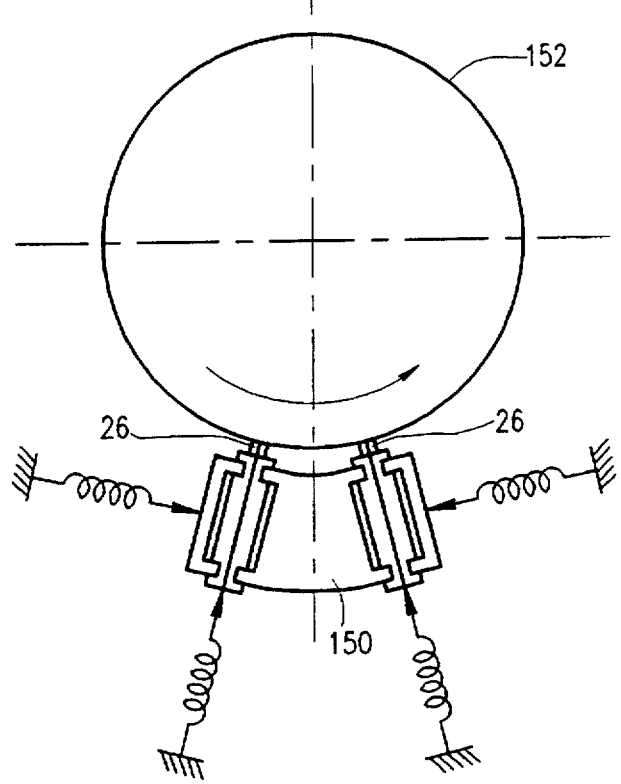
FIG. 9 shows the use of piezoelectric ceramic elements in accordance with a preferred embodiment of the invention configured to rotate a cylinder or a sphere.

Use of piezoelectric ceramics in accordance with the present invention to achieve rotational motion is shown in FIG. 9, in which a tandem configuration of piezoelectric ceramics 150 similar to that shown in FIG. 6 is adapted to conform with and rotate a cylinder 152. In such a configuration, the surfaces of ceramic spacers 26 would preferably have a concave shape conforming with the surface of cylinder 152. A single piezoelectric ceramic similar to that shown in FIG. 1 or any number of circularly arranged piezoelectric ceramics can also be used in place of configuration 150.

When circular motion and three-axis positioning of a sphere are required, a configuration such as that of FIG. 9 would be used modified by providing three orthogonally placed ceramic structures similar to configuration 150 to revolve and position the sphere. If only rotation (and not three-axis positioning) is required, two orthogonal drivers would be sufficient. In this embodiment, the outer surface of ceramic 26 would be shaped to conform with the surface of the sphere.

Utilizing the present invention, an improved combination of velocity, accuracy, and driving force is possible. By utilizing only a single ceramic pad 26, greater force can be employed to push the ceramic against body 30 over the prior art which is subject to cracking when excessive force is used. Use of tandem ceramics unexpectedly results in a large increase in driving force and velocity. In general, both higher velocities and higher driving force can be simultaneously achieved in the present invention for the same volume of piezoelectric ceramic.

Figure 10:
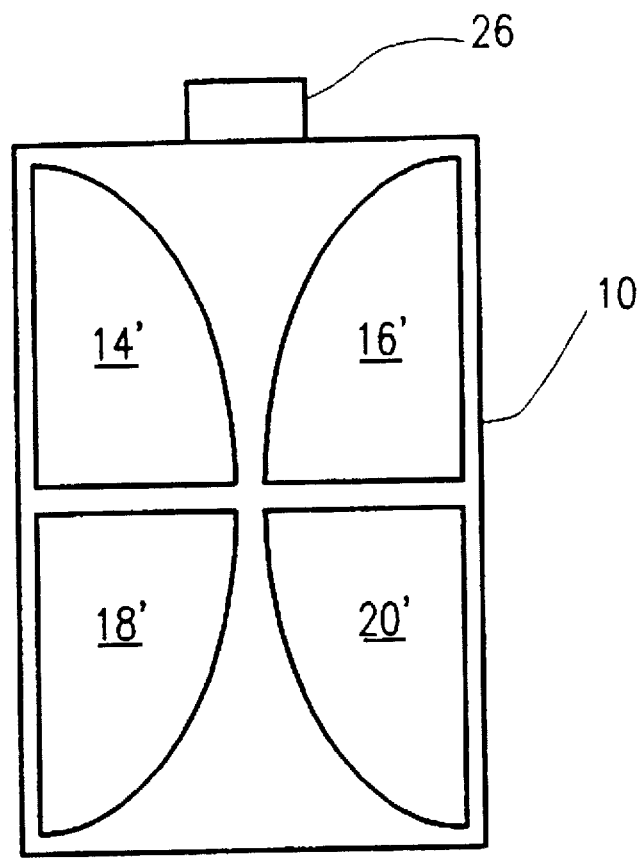
FIG. 10 shows an alternative electrode shape for a piezoelectric ceramic in accordance with a preferred embodiment of the invention.

The present inventor has also found that, when rectangular electrodes are used as shown in the above embodiments, the motion is not completely linear, i.e., due to the rotational nature of the motion of ceramic 26, only one part of the ceramic will touch body 30 during operation. Linearity can be improved by shaping the electrodes as, for example, shown in FIG. 10, where 14', 16', 18' and 20' are linearizing versions of the unprimed electrodes shown in the previous figures. While a sinusoidal variation is shown in FIG. 10, other electrode configurations are also possible to improve the linearity of the device.

Figure 24:
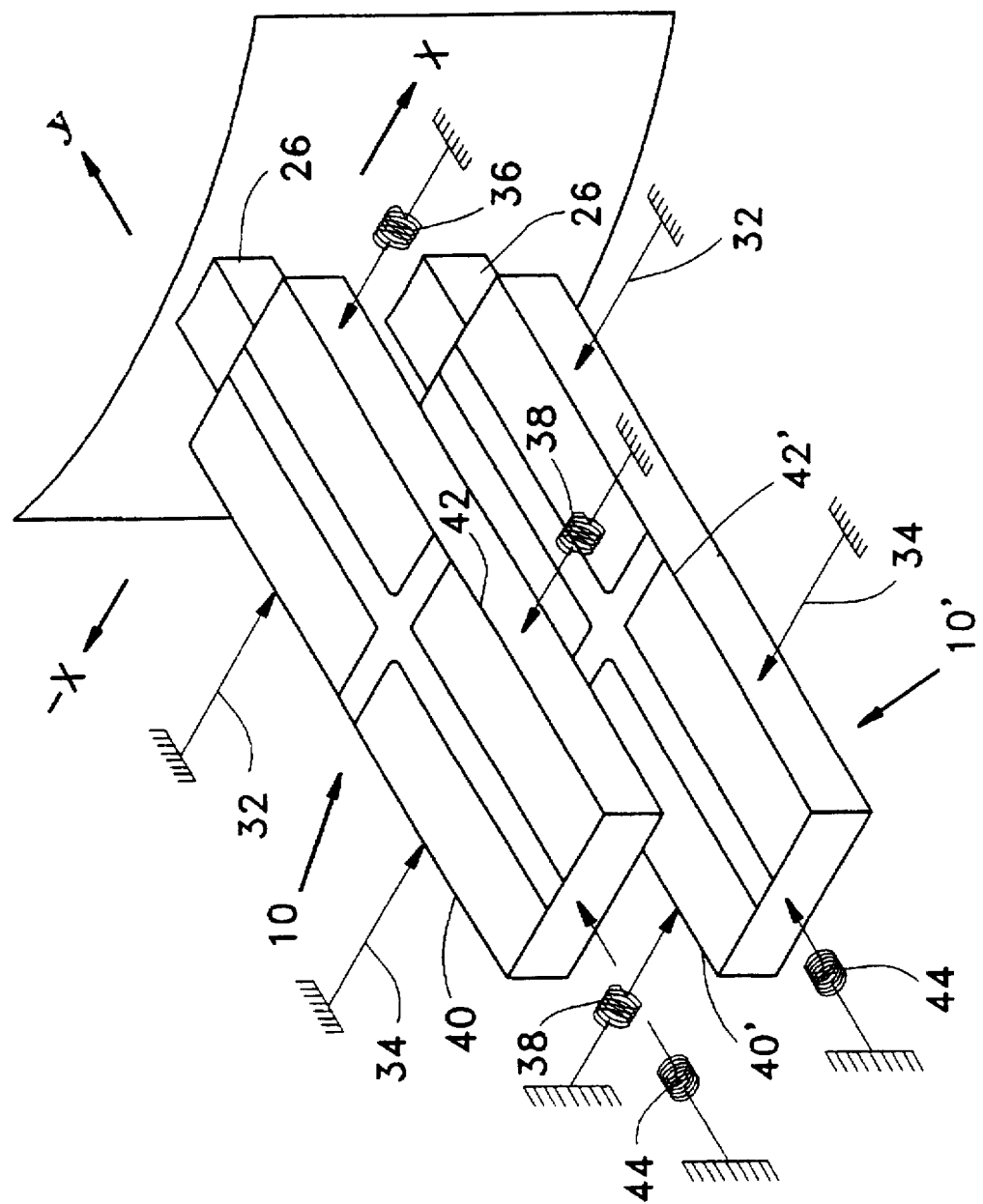
FIGS. 24 and 25 are schematic illustrations of two alternative micromotor arrangements adapted to provide symmetric motion parallel to a short edge of a piezoelectric ceramic in accordance with preferred embodiments of the invention.

In accordance with a preferred embodiment of the invention, one example of which is shown in FIG. 24, an arrangement including a plurality of piezoelectric ceramics is employed to provide symmetric motion for motion of body 30 in opposite directions along the x axis. When this arrangement is used substantially the same force and amplitude can be applied in the x and −x directions. The arrangement shown in FIG. 24 includes two parallel piezoelectric ceramics 10 and 10' with identical orientations in the x-y plane, as defined by x and y directions shown in FIG. 24.

As shown in FIG. 24, each of piezoelectric ceramics 10 and 10' is constrained from movement by a pair of fixed supports 32 and 34 and a pair of resilient supports 36 and 38. Supports 32–38 engage ceramics 10 and 10' along long edges 40, 42 and 40', 42' of the ceramic respectively, at points of substantially zero movement along the x axis. Supports 32–38 are preferably slidable along y axis.

Fixed supports 32 and 34 engage piezoelectric ceramic 10 along long edge 40, while for piezoelectric ceramic 10' fixed supports 32 and 34 engage long edge 42'. Resilient supports 36 and 38 engage piezoelectric ceramic 10 along long edge 42, while for piezoelectric ceramic 10' resilient supports 36 and 38 engage piezoelectric ceramic 10' along long edge 40'. With this arrangement, any difference between the x and −x motion provided by one piezoelectric ceramic will be compensated for by the other identical, but reversed, piezoelectric ceramic.

Figure 25:
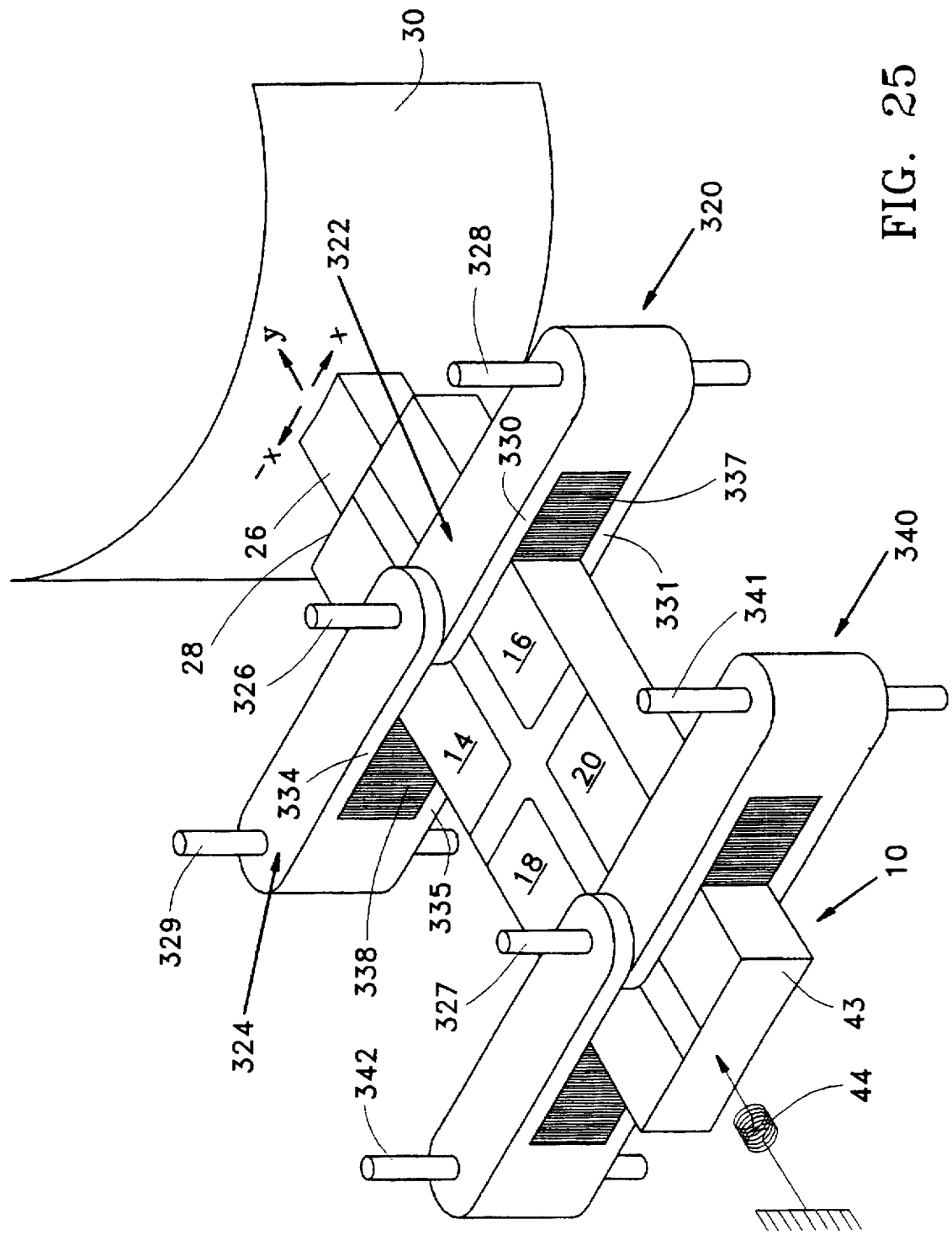

An alternative arrangement for providing symmetric motion along the x axis, in accordance with a preferred embodiment of the invention, is illustrated in FIG. 25. FIG. 25 illustrates an arrangement including two substantially identical equalizing assemblies 320 and 340. Assembly 320 comprises two rigid elements 322 and 324 which are linked by a hinge 326 and mounted on a fixed base (not shown) by hinges 328 and 329, respectively. Corresponding assembly 340 is attached to the fixed base by hinges 327, 341 and 342 respectively.

Hinges 326 and 327 extend through respective holes in piezoelectric ceramic 10, perpendicular to the face of the ceramic. The holes for hinges 326 and 327 are preferably located in the space between two electrodes along a short edge, i.e. between electrodes 14 and 16 and between electrodes 18 and 20, respectively, at points of substantially zero movement along the x axis. In a preferred embodiment of the invention, hinges 326 and 327 are distant from short edge 28 by ⅙ and ⅚ of the length of ceramic 10, respectively.

Each element 322 preferably includes two arms 330 and 331 at opposite faces of ceramic 10, and each element 324 preferably includes two arms 334 and 335 at opposite faces of ceramic 10, such that ceramic 10 is situated between arms 330 and 331 and arms 334 and 335. Preferably, resilient elements 337 and 338 are disposed between arms 330 and 331 of element 322, and between arms 334 and 335 of element 324, respectively. Resilient elements 337 and 338 of assembly 320 provide resilient force against piezoelectric ceramic 10 at approximately ⅙ of the ceramic's length, and corresponding elements on assembly 340 exert such force at the approximately ⅚ of the length of ceramic 10.

In one exemplary arrangement, piezoelectric ceramic 10 is fabricated of PZT-4, having a length of 30 mm, a width of 7 mm and a thickness of 3 mm. Resilient elements 337 and 338 in this arrangement are 5 mm long and 2.5–3 mm in diameter Silicone cylinders having a Shore A hardness of 60–70. Resilient element 44 is 5 mm long and 2.5 mm in diameter, and is capable of exerting a force of approximately 5N on short edge 43 of piezoelectric ceramic 10. The use of this arrangement in conjunction with excitation of the piezoelectric ceramic by 200–300 volts of AC, as shown in FIGS. 1C or 1E, yields a resolution of 0.1–0.2 micrometers and a maximum velocity of approximately 400 mm/sec.

Figure 11A:
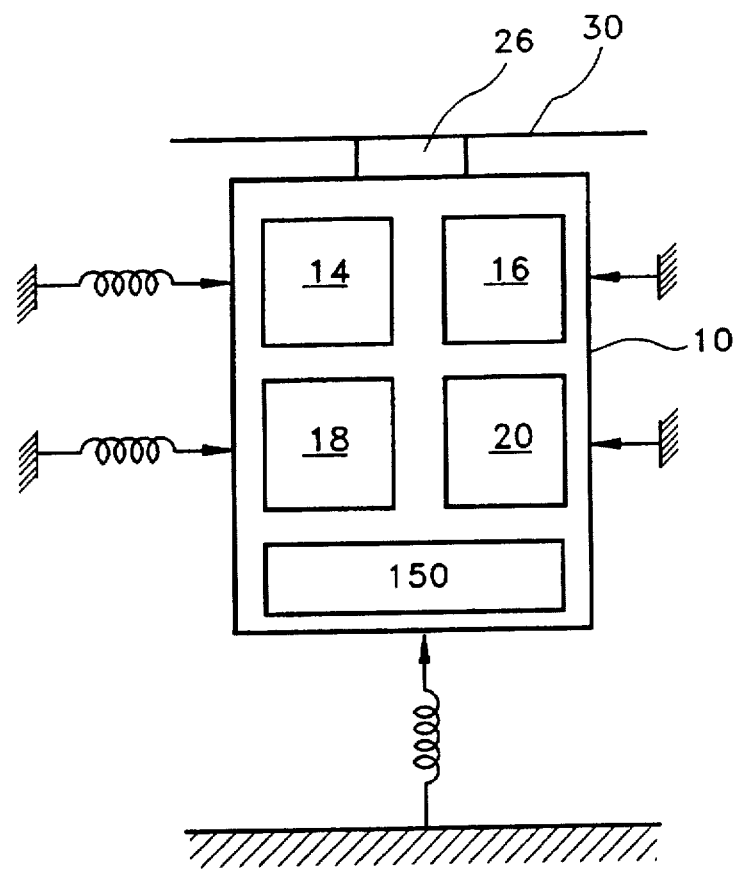
FIGS. 11A, 11B and 11C show electrode configurations suitable for applying a preloading force of the piezoelectric ceramic against a body to be moved in accordance with preferred embodiments of the invention.
Figure 11B:
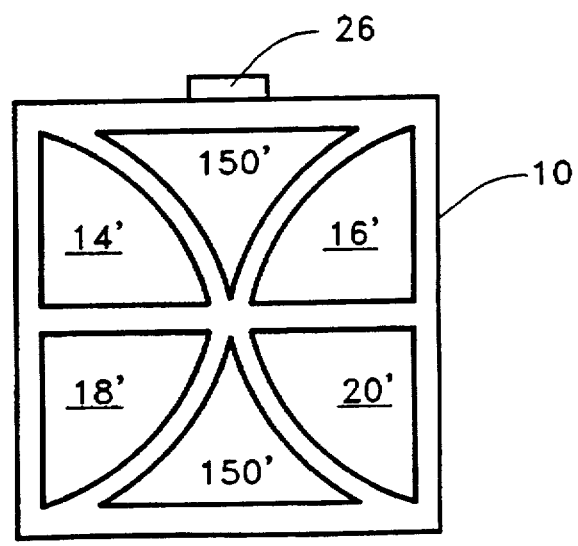
Figure 11C:
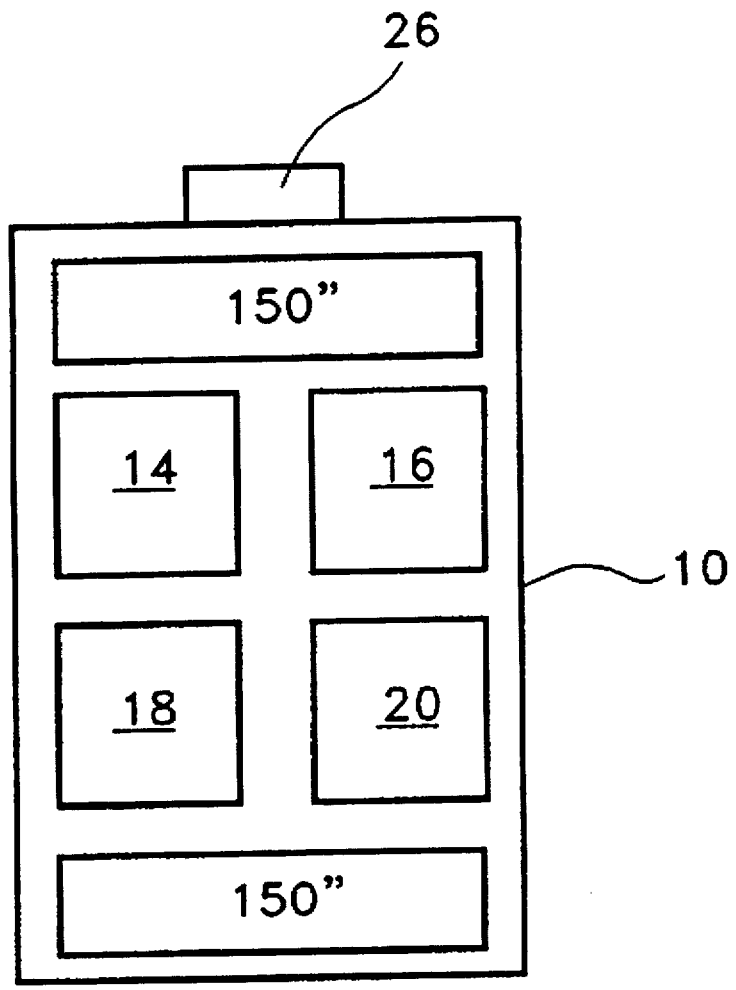

In a preferred embodiment of the invention the electrode configuration shown in FIG. 11A is used. For this embodiment an additional electrode 150, in addition to electrodes 14, 16, 18 and 20 is applied to piezoelectric ceramic 10. Electrode 150, which preferably extends along substantially the entire width of ceramic 10 is energized by DC voltage or by a harmonic of the voltages used on the other electrodes. The effect of such energization is to elongate ceramic 10 and to effect pre-loading of the motor against the object to be moved. By using harmonic excitation this pre-loading can be synchronized with the excitation of the other electrodes to give an increased contact time between ceramic 26 and the object being moved. While in principle it may be possible to omit spring 44 from such a system, in practice the use of some resilient loading (which responds much more slowly than the piezoelectric ceramic) is useful and may even be required. Similar operations can be obtained from the embodiments of FIGS. 11B and 11C.

Figure 12:
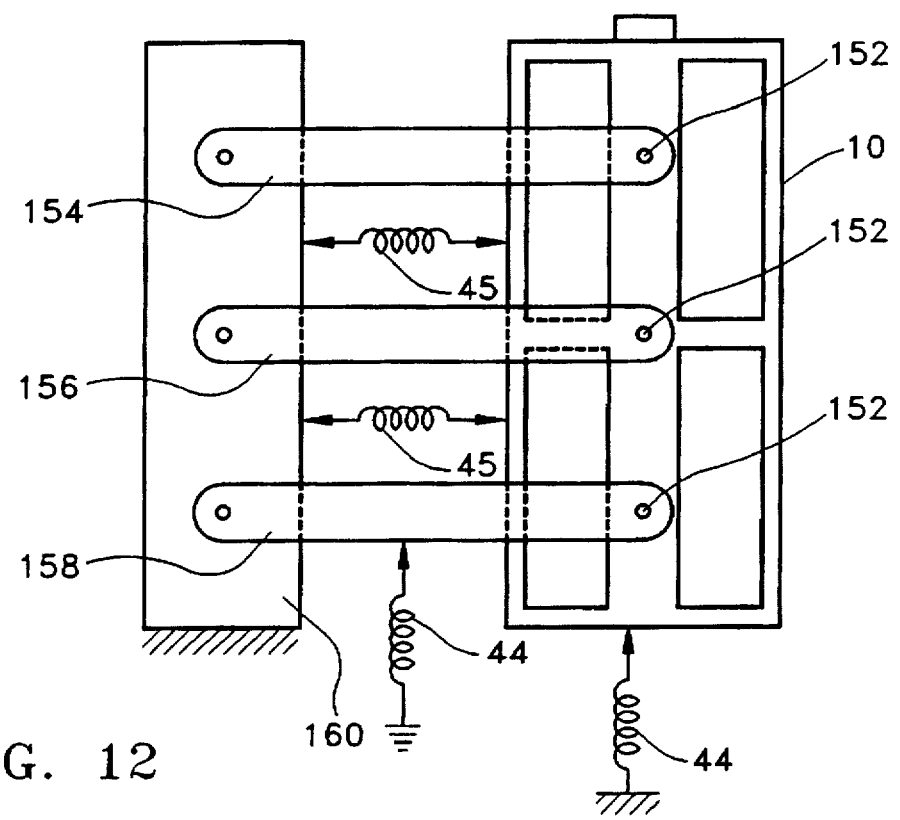
FIG. 12 shows an alternative method for mounting piezoelectric ceramics in accordance with a preferred embodiment of the invention.

An alternative mounting method, suitable for both single and multiple ceramic motors is shown in FIG. 12. In this mounting method holes are formed in piezoelectric ceramic 10 at the center of the ceramic and at the ⅙ and ⅚ points of the longitudinal center line of ceramic 10. These holes preferably have a diameter of between 20% and 30% of the width of ceramic 10. Pins 152 having a clearance of about ±100 micrometers are placed in the holes and have at least one end attached to one end of levers 154, 156 and 158. Preferably the pins are made of a material having an acoustic velocity equal to the velocity in ceramic 10. The pins may be of metal or ceramic or any other suitable material.

For the resonance mode of ceramic 10 which is used in the preferred embodiment of the invention, the ceramic has movement only in the direction of its long axis at the holes. The center hole, in fact, experiences substantially no movement. If the other end of the levers are rotationally attached to a fixed body 160, then ceramic 10 is constrained to move only along its longitudinal axis. This allows for springs 36 and 38 to be omitted. Furthermore, spring 44 may be replaced by a spring 44' which urges one of the levers in the direction of the object to be moved and thus loads the motor against the object to be moved. A plurality of such springs may be used to load others of the levers.

Figure 13:
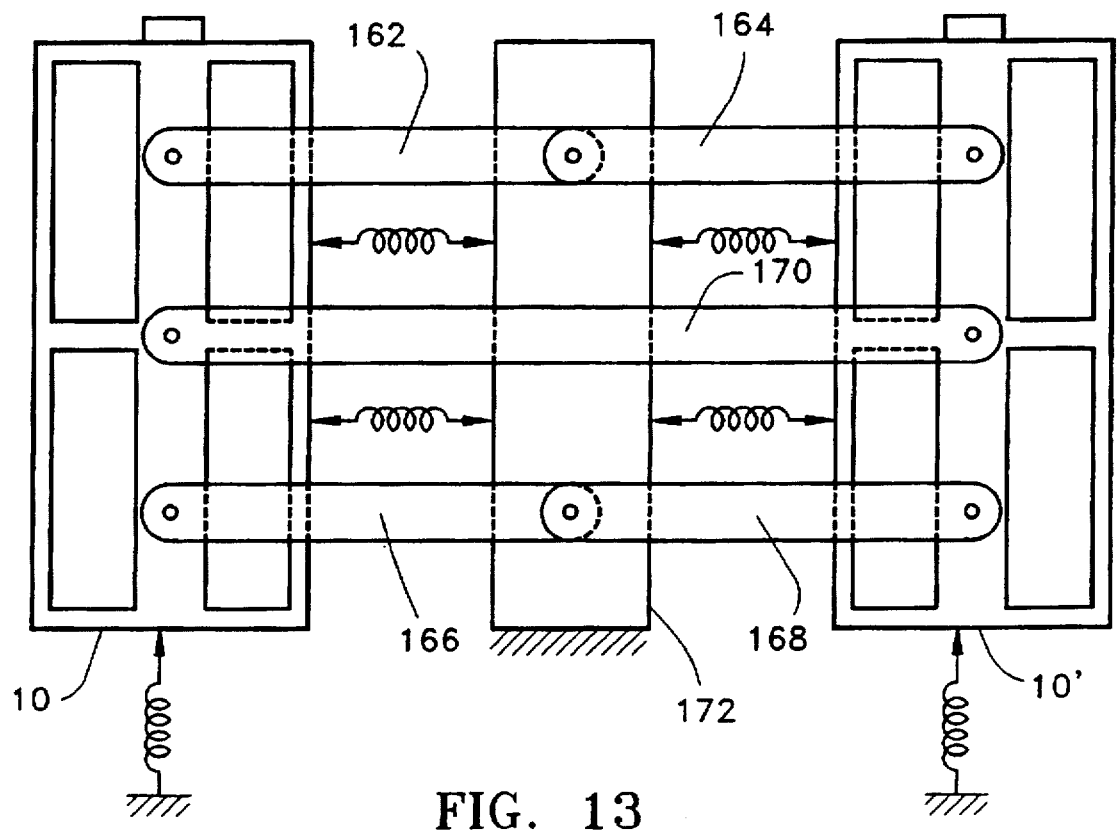
FIG. 13 shows an application of the mounting principle shown in FIG. 12 to mounting two piezoelectric ceramics in accordance with a preferred embodiment of the invention.

The same principles may be applied to a simplified mounting of two side-by-side piezoelectric ceramic elements 10 and 10' as shown in FIG. 13. In this configuration piezoelectric ceramics 10 and 10' are mounted on five levers 162, 164, 166, 168 and 170 using the method described above. It should be noted that lever 170 is a single lever which is preferably attached to the center of both ceramics and fixedly attached at its center to a plate 172. The other levers are rotatably attached at one end to a hole in one of the ceramics and are rotatably attached at their other ends to plate 172. Each of the ceramics 10 and 10' is separately loaded by a spring 44 at their lower ends.

In an alternative configuration, ceramics 10 and 10' are not spring loaded. However, plate 172, which is constrained to move only in the vertical direction, is loaded by a spring (not shown) at its lower end, in order to load ceramics 10 and 10' against the object to be moved. A wide variety of mounting methods, using the lever principle of these preferred embodiments, will of course occur to a person of skill in the art.

A major benefit of mounting the piezoelectric ceramics on pins as described above is the significant reduction of temperature of the ceramics which is achieved by conduction of heat from the attachment points, which are also hot spots in the preferred mode of operation. In particular, it has been found that the temperature of these points can be reduced from 50°–80° C. to about 30° C. by using this method.

The cooling effect of the pins is enhanced when heat conduction from the ceramic to the pins is good. In order to assure such conduction, the pin should be fitted into a heat conductive, relatively soft, material such as an elastomer which coats the inner wall of the holes. One such suitable material is epoxy in which an insufficient amount of hardener is used. Such material elastic enough to take up the small partial rotations of the pins in the holes. In a preferred embodiment of the invention, the epoxy is filled with about 40% of PZT powder (of the same material as the piezoelectric ceramic itself). Such filling helps to match the acoustic velocity of the epoxy to that of the piezoelectric ceramics.

It has also been found that the motion of the device to be moved can be estimated based on the amount of time that the ceramic 26 is in contact with the object to be moved. To facilitate such a measurement, the surface of ceramic facing the object to be moved is coated with metal and an electrode is attached to this coating which extends, for this purpose to the side of ceramic 26. The object to be moved is of metal (or has a metal coating) and the time of contact can thus be measured as the time during which there is a short circuit between the metal coating of ceramic 26 and the object to be moved.

Figure 14A:
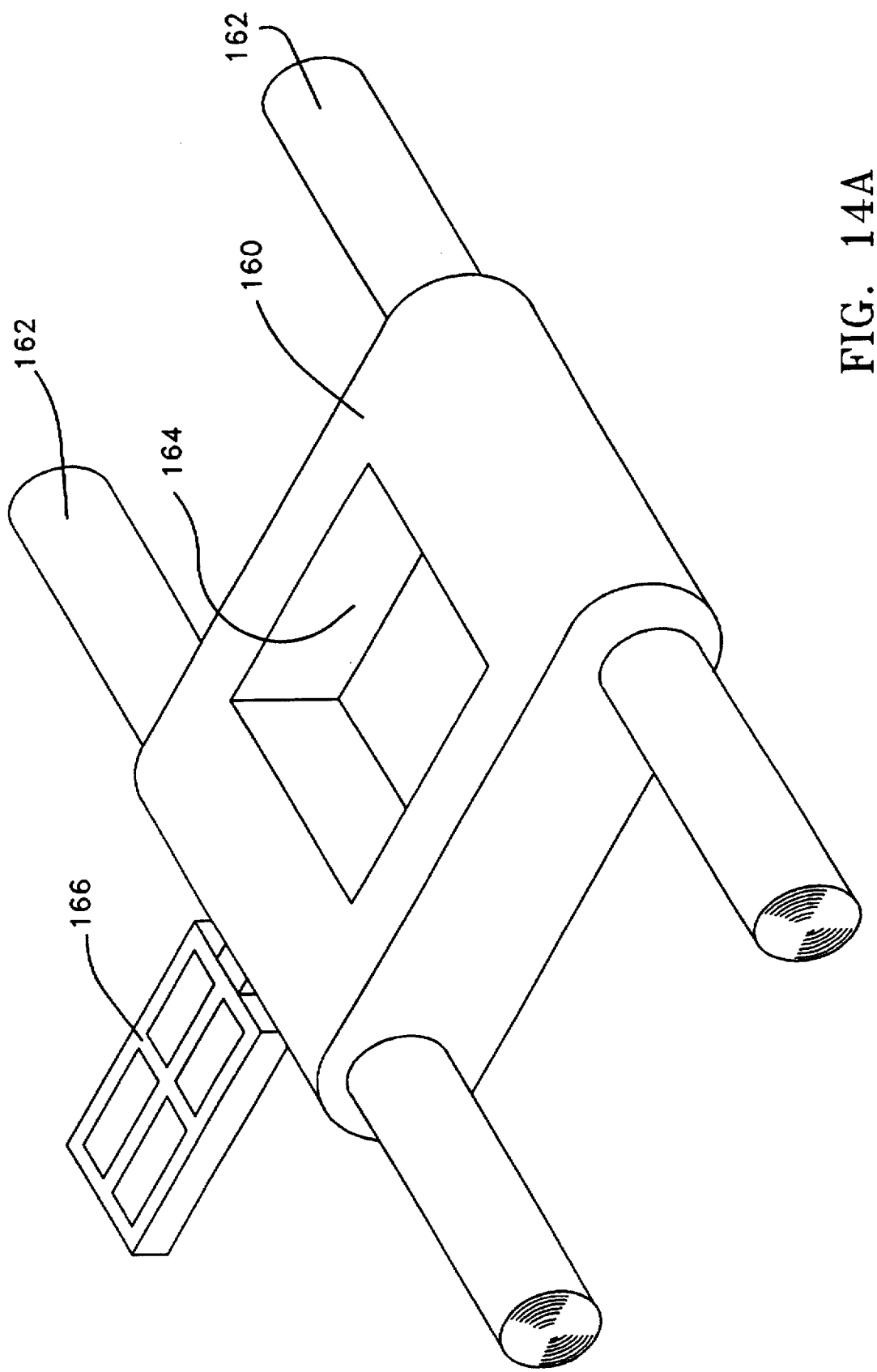
FIGS. 14A, 14B and 14C show alternative configurations for using a ceramic motor in a stage of a CD reader in accordance with a preferred embodiment of the invention.
Figure 14B:
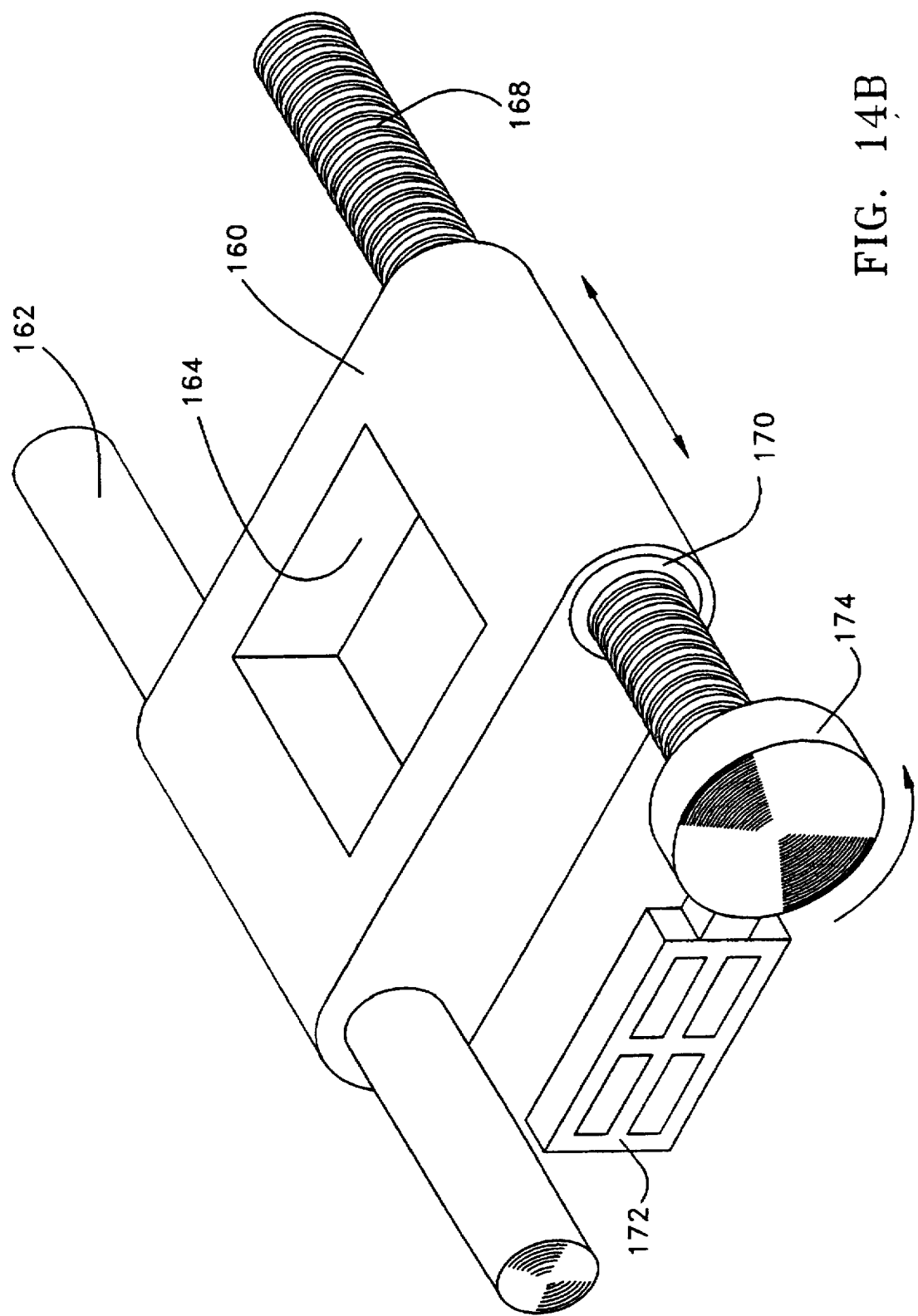
Figure 14C:
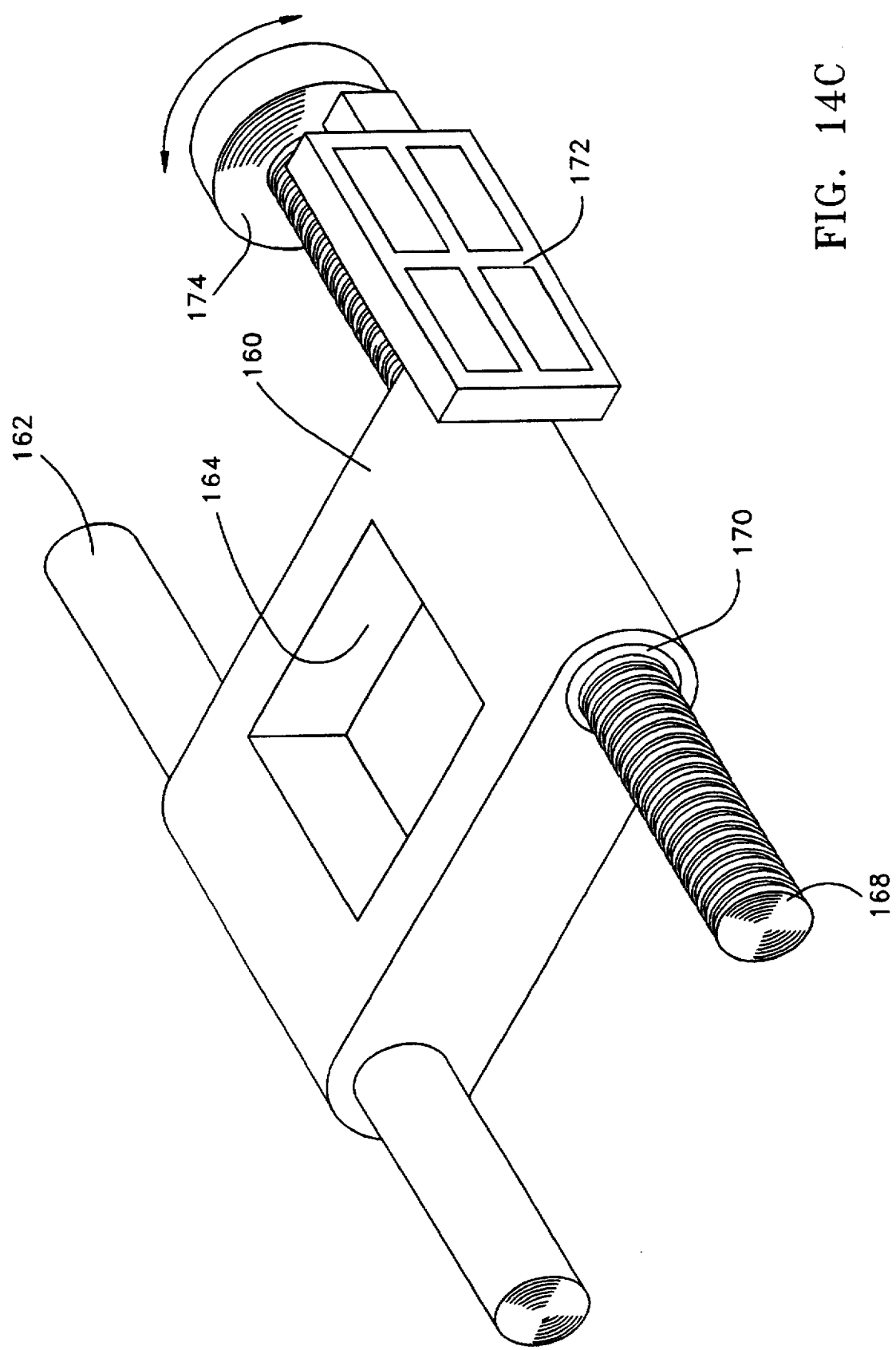

FIGS. 14A, 14B and 14C show the application of a ceramic motor to the movement of a stage, such as that used in an optical disc reader such as a CD reader. In such a device a stage 160 is mounted on at least one rail such as a rod 162. Stage 160 is formed with a hole 164 through which an optical reader (not shown for simplicity) which is mounted on stage 160 views (and reads) an optical disc.

In FIG. 14A stage 160 is mounted on two rails 162 and a ceramic motor 166, which is preferably of one of the types described herein, is operatively associated with one edge of stage 160 so as to cause movement of the stage along the rails.

In FIGS. 14B and 14C one side of stage 160 is mounted on a rail and the other side is mounted on a worm 168 via a rack 170. A ceramic motor 172, which is preferably of one of the types described herein, drives a wheel 174 mounted on one end of the worm. FIGS. 14B and 14C differ in the manner in which the motor drives the wheel.

In all of the embodiments described above the spacer between the ceramic plate and the surface engaged by the micromotor is attached to one of the short edges of the ceramic plate, preferably to the center of the short edge, such that the long dimension of the plate is substantially perpendicular to the engaged surface. This arrangement is preferred since optimal driving motion is produced at the short edges of the ceramic plate. However, in some applications, for example when a motor is to be installed between a slide and a housing of the slide, the usable space perpendicular to the engaged surface is limited and may be shorter then the long dimension of the ceramic plate. To avoid this problem, the present inventor has devised an alternative ceramic micromotor in which the long dimension of the ceramic plate is substantially parallel to the engaged surface, while the optimal motion produced at the short edges of the ceramic plate is still utilized.

According to this aspect of the present invention, a ceramic spacer is attached to one end of a long edge of the piezoelectric plate and engages a surface substantially parallel to the long edge. Since the spacer so attached is near a short edge of the ceramic plate, the spacer moves substantially in accordance with the resonant motion at the short edge. This motion of the spacer results in movement of the surface engaged by the spacer or movement of the micromotor, depending on which of the two is constrained, in parallel to the long axis of the ceramic plate. However, the location of the spacer at or near the end of the long edge of the plate, rather than at the middle of the edge, yields asymmetric motion of the spacer whereby movement of the engaged surface or the micromotor in one direction may be different, e.g. less powerful or slower, than corresponding movement in the other direction. To avoid this asymmetry, piezoelectric ceramic plates are preferably used in pairs as described in detail below.

Figure 15:
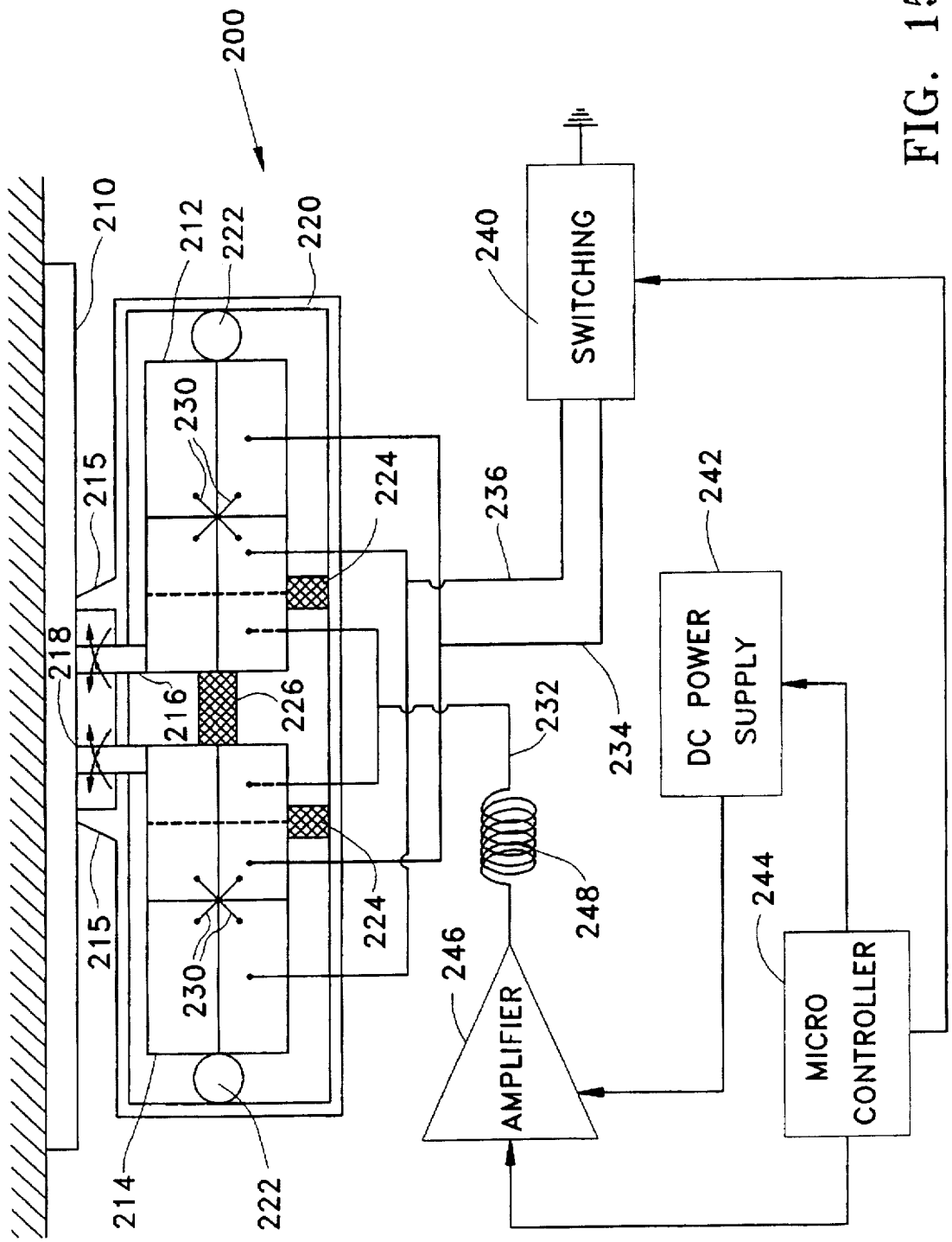
FIG. 15 is a partially schematic, partially block diagram, illustration of a paired piezoelectric micromotor constructed and operative in accordance with a further, preferred, embodiment of the present invention.

Reference is now made to FIG. 15 which schematically illustrates a paired piezoelectric micromotor 200 engaging a surface 210. As in the unpaired embodiments described above, motion of either surface 210 or micromotor 200 is constrained, depending on the application, to allow movement of the other. Micromotor 200 includes two piezoelectric ceramic plates 212 and 214 mounted within a, preferably aluminum, housing 220. Housing 220 is preferably pressed against surface 210. The outer short edges of plates 212 and 214, i.e. the right edge of plate 212 and the left edge of plate 214 in FIG. 15, are supported by horizontal supports 222 which are preferably formed of a relatively hard material such as a ceramic material. The inner short edges of plates 212 and 214, i.e. the left edge of plate 212 and the right edge of plate 214, are preferably supported by a, preferably resilient, connecting member 226 which is preferably formed of hard rubber or plastic material. Plates 212 and 214 are supported from the bottom by bottom supports 224 which may be formed of the same material as member 226 or, preferably, of a harder material.

According to a preferred embodiment of the present invention, a preferably ceramic spacer 216 is attached to the top surface of plate 212 at the left end thereof, and a similar spacer 28 is attached to the top surface of plate 214 at the right end thereof. Spacers 212 and 214 operatively engage surface 210 when micromotor 200 is pressed against surface 210. In a preferred embodiment of the invention, housing 220 includes a protective frame 215, preferably formed of or coated with a low-friction material such as teflon, which at least partially isolates the area of surface 210 engaged by spacers 216 and 218 and prevents undesired accumulation of dust and the like on surface 210.

Four electrodes are plated or otherwise attached onto a front face of each of piezoelectric ceramic plates 212 and 214 to form a checkerboard pattern of rectangles, each substantially covering one-quarter of the front face, as described above with reference to electrodes 14, 16, 18, and 20 in FIG. 1A. The back face of each piezoelectric ceramic plate is substantially fully covered with a single electrode (not shown), as described above with reference to FIG. 1A. As in the embodiment of FIG. 1A, diagonally located electrodes are electrically connected by wires 230 preferably placed near the junction of the four electrodes. The electrode on the back face of each of the ceramic plates is preferably grounded. Alternatively, the electrodes can be connected by printed circuit techniques similar to those used to form the electrodes.

The electrodes on plates 212 and 214 are preferably driven by excitation circuitry, shown in FIG. 15 in block diagram form. The excitation circuitry includes a controller, for example, a microcontroller 244 which controls the energizing of a regulated power supply 242 and a switch/ modulator circuit 240. Switches in switch modulator 240 are connected to preselected, respective, groups of electrodes on the front surface of plates 212 and 214 via wires 234 and 236 or via printed circuit equivalents thereof. The electrodes on the back faces of ceramic plates 212 and 214 are connected to ground, preferably via a tuning circuit which may include an amplifier 246 and a coil 248.

Apart from specific excitation modes described below, the electrodes on each of ceramic plates 212 and 214 may be interconnected and excited in accordance with any of the modes described above with reference to the unpaired embodiments of the present invention, so as to provide micromotor 200 with desired features in accordance with given applications. Similarly, ceramic spacers 214 and 216 may be formed of relatively soft or relatively hard ceramics, as in the embodiments described above. However, excitation of the electrodes on plate 212 must be inverted with respect to that of the electrodes on plate 214 in order to obtain movement of spacers 216 and 218 in the same horizontal direction relative to surface 210, as described below.

Figure 16:
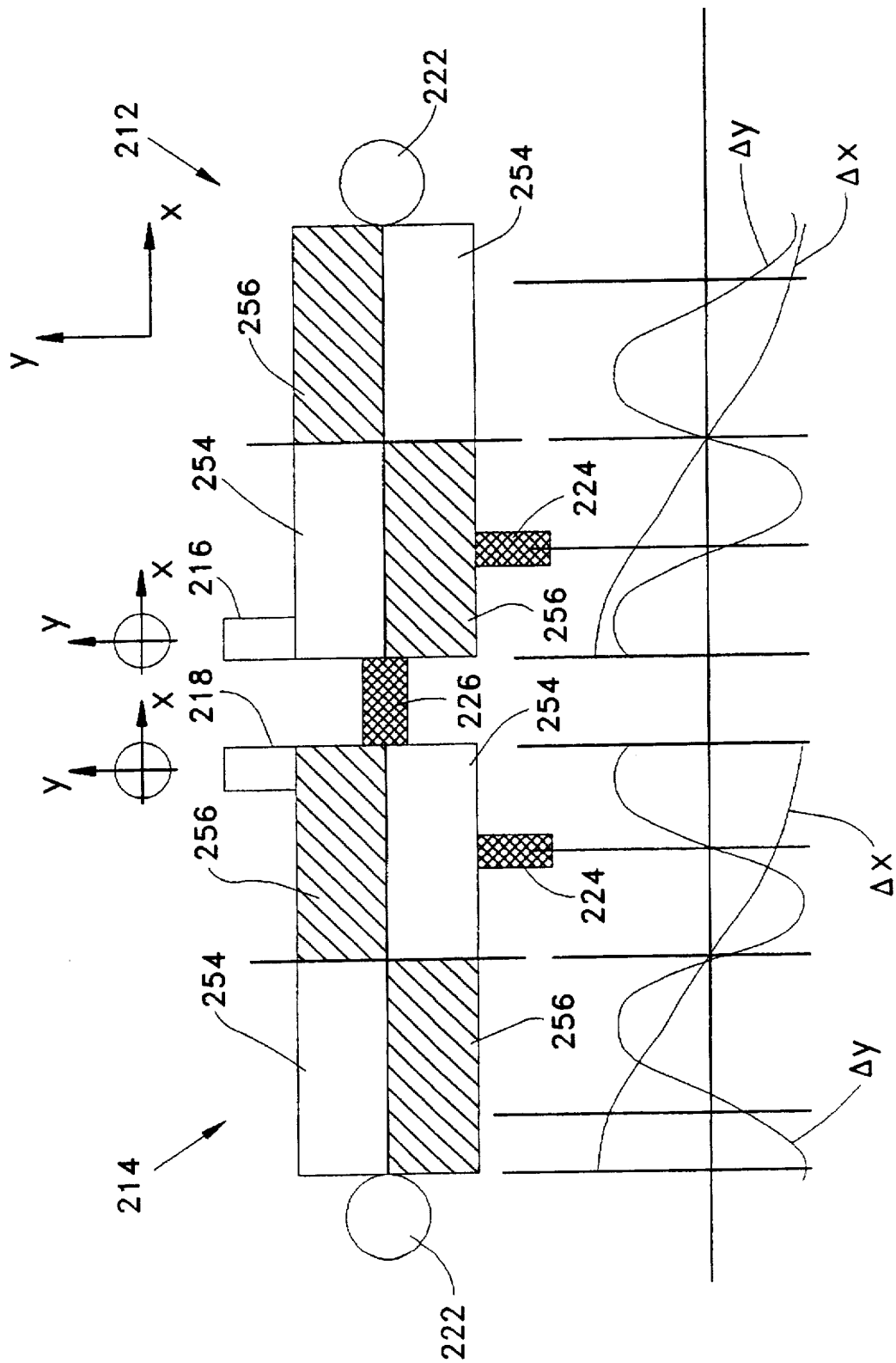
FIG. 16 is a simplified illustration of the micromotor of FIG. 15, showing preferred x-y resonant modes of the piezoelectric ceramics of the micromotor.

Reference is now made also to FIG. 16 which is a simplified schematic illustration of part of micromotor 200, showing preferred x-y resonant modes of piezoelectric ceramic plates 212 and 214. As shown in FIG. 16, the electrodes on plates 212 and 214 are preferably divided into two groups of electrodes, electrodes 254 and electrodes 256. The excitation voltage applied to electrodes 254 is generally of a polarity opposite that applied to electrodes 256, i.e. electrodes 254 are electrified to a positive voltage when electrodes 256 are electrified to a negative voltage and vice versa.

It should be appreciated that, since spacer 216 is attached to the left end of plate 212 while spacer 218 is attached to the right end of plate 214, an excitation scheme as in FIG. 16 results in movement of spacers 216 and 218 to the same direction along the X-axis, i.e. left or right, when the two spacers move in the same direction along the Y-axis, i.e. up or down. Thus, spacers 216 and 218 always move in the same direction relative to surface 210, as desired. Schematic graphs of the X and Y resonant modes of piezoelectric ceramics 212 and 214, in response to this excitation scheme, are shown schematically underneath plates 212 and 214. As further shown in FIG. 16, bottom supports 224 are preferably positioned underneath the points on plates 212 and 214 where motion along the Y-axis, i.e. Δy, is substantially zero. This improves the stability of micromotor 200 and maximizes the amplitudes obtained by micromotor 200 along the y-axis.

Figure 17:
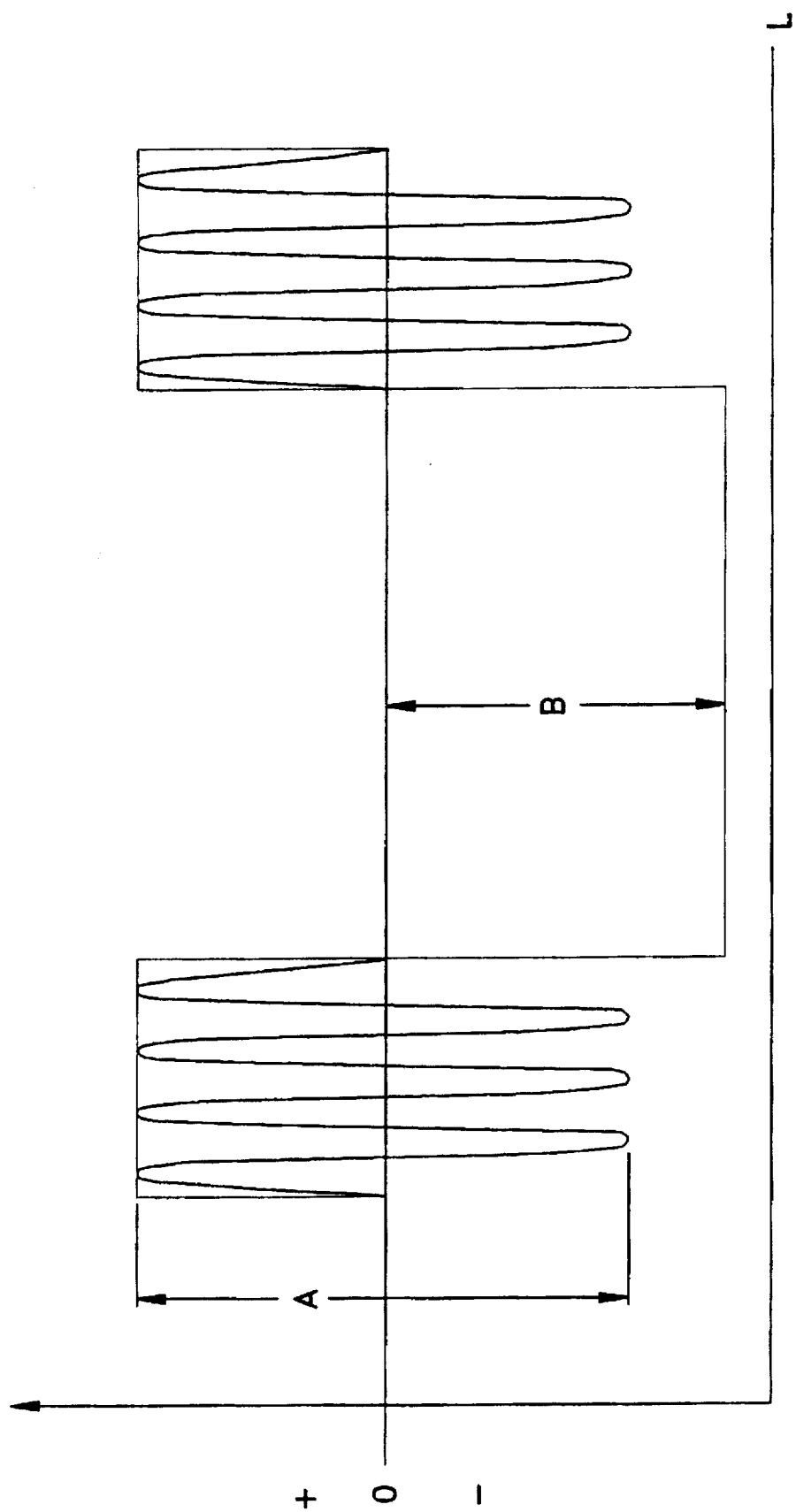
FIG. 17 is a schematic illustration of a pulsed excitation signal for driving the piezoelectric ceramics of the micromotor of FIG. 15 in accordance with one preferred embodiment of the present invention.

Reference is now made to FIG. 17 which schematically illustrates a pulsed excitation signal, controlled by microcontroller 244 (FIG. 15), provided to electrodes 254 and 256 according to one preferred embodiment of the present invention. The excitation signal of FIG. 17 consists of pulses of a driving excitation voltage separated by intervals of a predetermined DC voltage which operates to move the spacers out of contact with surface 210. In FIG. 17, the difference in voltage between the top peaks and the bottom peaks of the excitation voltage is denoted "A", and the DC voltage between pulses is denoted "B". According to this embodiment of the present invention, also suitable for the unpaired micromotors described above, the pulsed rate of the excitation signal is substantially in accordance with a self-resonance frequency of the body engaged by the micromotor.

Since the typical resonant frequencies of bodies driven by the micromotor, e.g. frequencies on the order of 300 Hz, are generally much lower than the driving AC frequencies used, each pulse includes a substantial number of driving AC periods. The DC voltage, B, applied to electrodes 254 and 256 (FIG. 15) between pulses is generally either lower than the bottom peaks of the driving frequency or higher than the top peaks of the driving frequency, depending on which of electrodes 254 or 256 is driven, such that spacers 216 and 218 are drawn away from surface 210 between pulses. The driven body thus moves autonomously between pulses. This correlation between the pulsed rate of the excitation signal and the self-resonance of the engaged body prevents destructive interference between the driving pulses and the response of the driven body thereto. Thus, optimal driving efficiency can be achieved.

Figure 18:
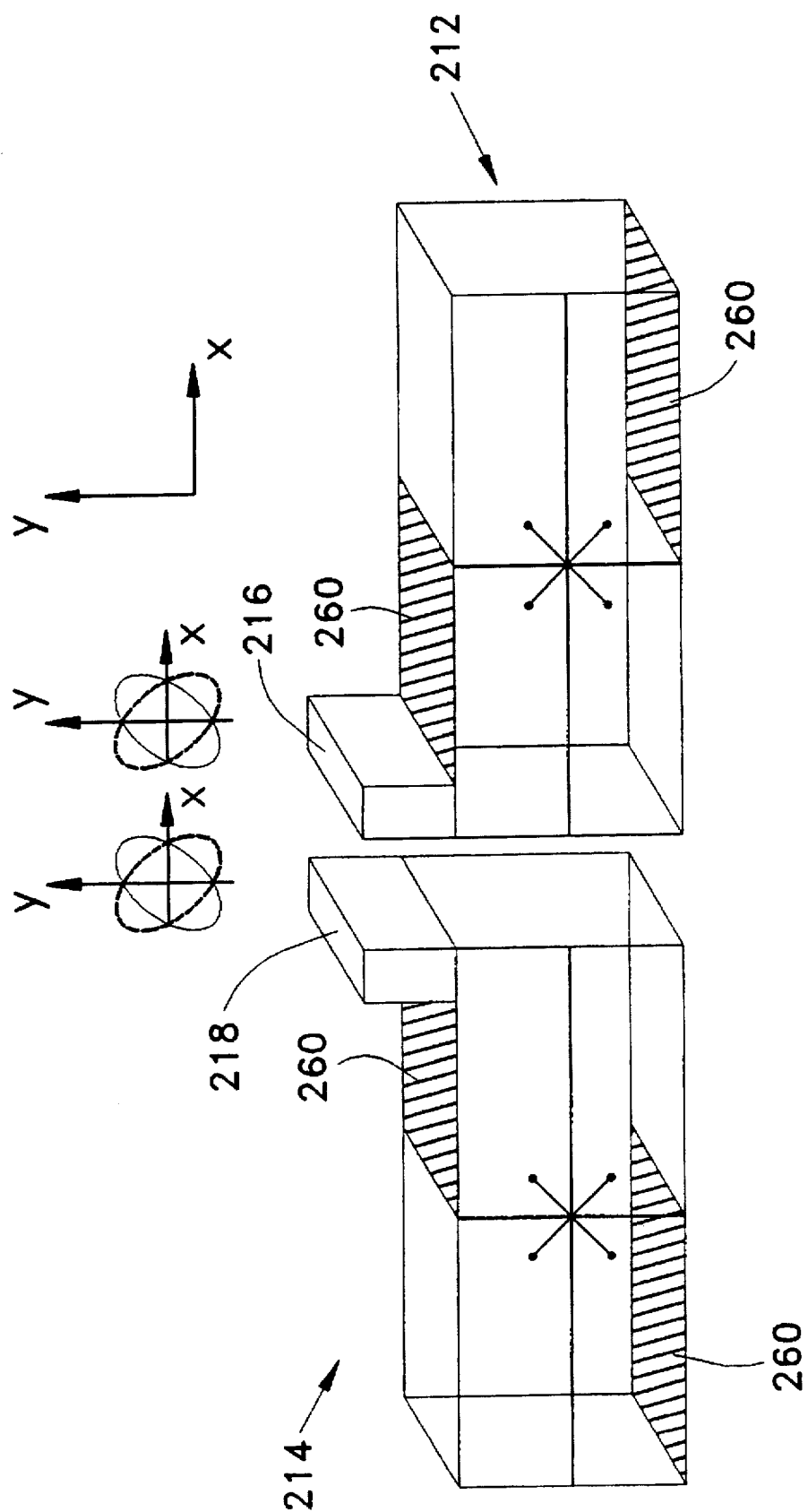
FIG. 18 is a simplified, schematic, illustration of a paired piezoelectric micromotor driven with different x and y excitation amplitudes.
Figure 19:
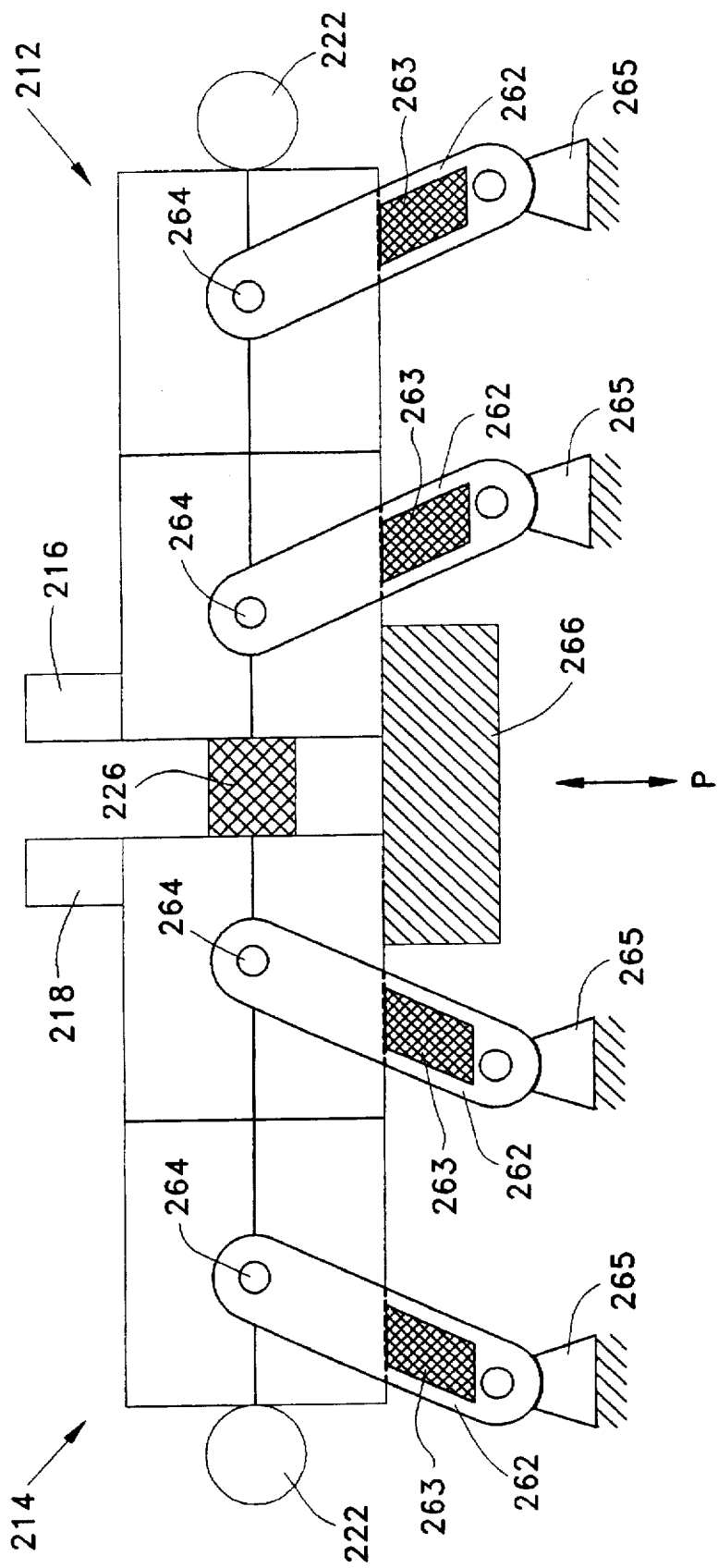
FIG. 19 is a schematic illustration of an alternative mounting arrangement for the ceramic plates of the paired piezoelectric micromotor of FIG. 15.

Reference is now made to FIG. 18 which illustrates schematically an alternative electrode configuration on ceramic plates 212 and 214. According to this embodiment of the invention, additional electrodes 260 are provided on the upper and lower edges of plates 212 and 214. Electrodes 260 are preferably excited by the same excitation voltages used for driving electrodes 256 (FIG. 16). It should be appreciated that, in this configuration, the motional amplitude of spacers 216 and 218 along the Y-axis is higher than the motional amplitude of the spacers along the X-axis, as shown schematic above spacers 216 and 218. This, slightly angled, elliptical motion of spacers 216 and 218, in contrast to the substantially circular motion of the spacers in FIG. 16 (shown schematically above the spacers), provides micromotor 200 with greater driving force and better traction between the spacers and surface 210, since such motion increases the time of contact between of spacers 216 and 218 with surface 210. Reference is now made to FIG. 19 which illustrates an alternative mounting arrangement of piezoelectric ceramic plates 212 and 214. In addition to horizontal supports 222, and connecting member 226, plates 212 and 214 are supported by a base 266 mounted in housing 220 (FIG. 15) underneath and between plates 212 and 214. Plates 212 and 214 are also supported by a plurality of, preferably resilient, holders 262. One end of each holder 262 is preferably rotatably mounted on a respective mount 265 which is fixedly attached to housing 220, while the other end of each holder 262 is rotatably mounted on a respective pin 264 which extends through a respective hole in plate 212 or 214. Four pins 264 are preferably mounted on plates 212 and 214, two on each plate, at points where the amplitude along the Y-axis is substantially zero as described above. In a preferred embodiment, two holders 262 are mounted on each pin 264, one on each side of plate 212 or 214. A resilient bottom support 263 is preferably mounted between the lower end of each holder 262 and the bottom edge of plate 212 or plate 214. The provision of holders 262, which support plates 212 and 214 at optimal locations as described above, improves the stability of micromotor 200. Spacers 262 are preferably angled, as shown in FIG. 19, to allow driving motion of piezoelectric plates 212 and 214 along the Y-axis.

Figure 20:
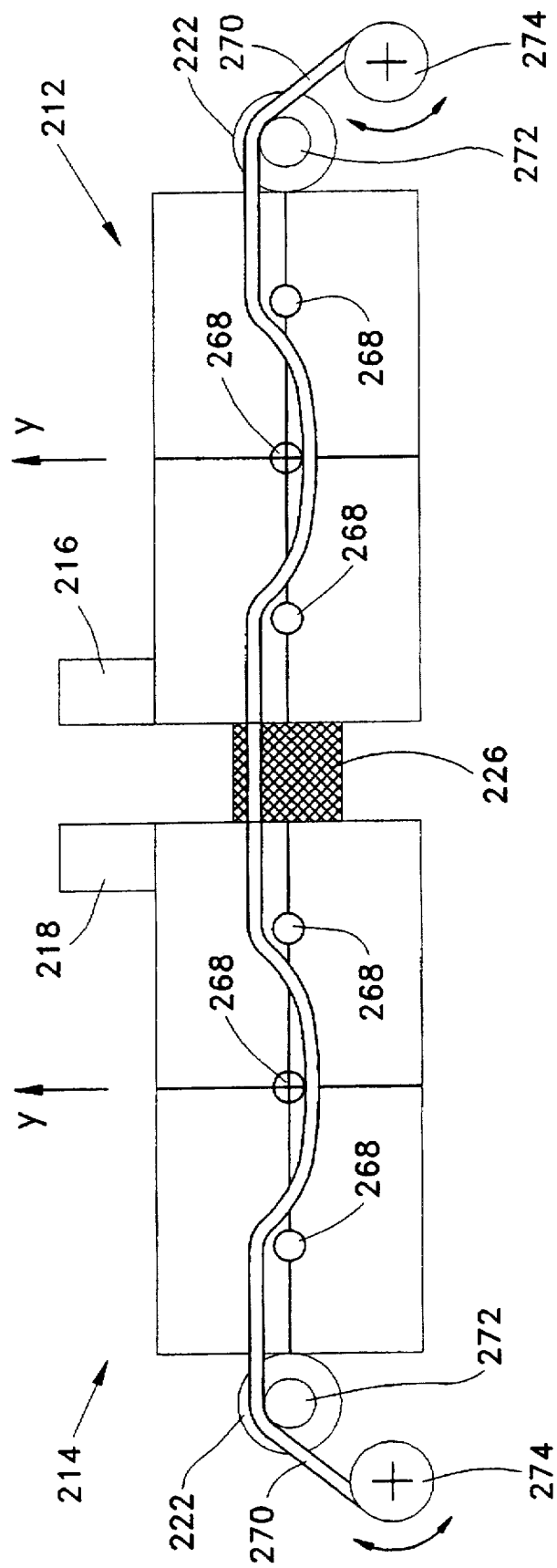
FIG. 20 is a schematic illustration of another alternative mounting arrangement for the ceramic plates of the paired piezoelectric micromotor of FIG. 15.

Reference is now made to FIG. 20 which illustrates another, alternative, mounting arrangement for plates 212 and 214. According to this arrangement, a plurality of pins 268, similar to pins 264 of FIG. 19, are mounted on plates 212 and 214 at locations where the motional amplitude is substantially zero, as described above. Thus, according to the resonant modes described above, three pins 268 may be mounted on each plate. At least one spring 270, preferably a steel spring, is mounted on pins 268 in the manner shown in FIG. 20. The ends of spring 270 are preferably connected to adjustment screws 274, in housing 220, such that spring 70 is stretched between bobbins 272 which are preferably mounted on horizontal supports 222. This stretching also urges horizontal supports 222 against the outer short edges of plates 212 and 214, providing better support to the piezoelectric plates. The tension in spring 70, which may be adjusted using screws 274, controls the resiliency of plates 212 and 214 to motion along the y-axis. Thus, the traction, the speed and the force of micromotor 200 may be controlled.

Figure 21:
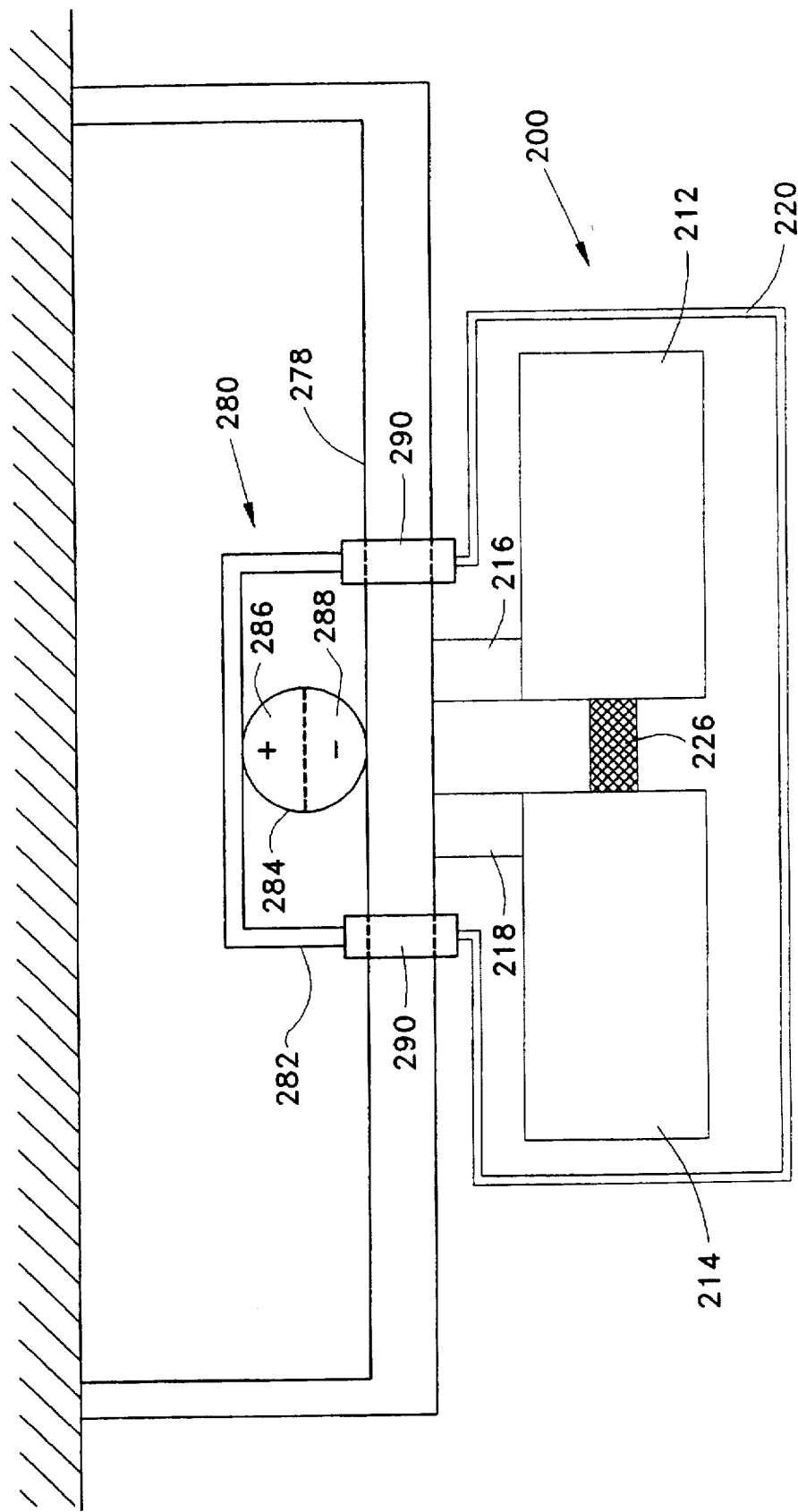
FIG. 21 is a simplified schematic illustration of a preferred arrangement for operatively coupling the micromotors of FIGS. 15, 16 and 18–20 to a body.

Reference is now made to FIG. 21 which schematically illustrates a preferred arrangement for operatively engaging micromotor 200 with a relatively thin body 278. It is appreciated that, in general, when a micromotor engages a thin body, the pulsed force applied to the body by the motor may slightly damage or bend the body at the region of engagement. Thus, the present inventor has devised a counter-bearing arrangement 280 which minimizes this problem. According to this, preferred, embodiment of the invention, counter-bearing arrangement 280 includes a housing 282 which is preferably fixedly connected to housing 220 of micromotor 200 via connectors 290. At least one bearing 284 in housing 282 provides rigid support to the back surface of body 278 (i.e. the surface not engaged by micromotor 200) against the forces applied by spacers 216 and 218 to the front surface of body 278. Bearing 278 may be any bearing known in the art, for example a metal cylinder.

In a particularly preferred embodiment of counter-bearing arrangement 280, bearing 284 includes a piezoelectric ceramic, similar to that of plates 212 and 214. In this embodiment, a ground electrode (not shown) substantially covers one flat surface of bearing 284, while the other surface of bearing 284 includes two separate electrodes, 286 and 288, each covering substantially one half of the surface. When electrodes 286 and 288 are configured as shown in FIG. 21, i.e. one above the other, and excited by an AC voltage as described above, bearing 284 oscillates at a resonant frequency along the y-axis. When bearing 284 is driven at the y-axis frequency of plates 212 and 214 and in the appropriate direction, i.e. up when spacers 216 and 218 are down and down when the spacers are up, it provides extremely efficient counter-bearing to the forces applied by micromotor 200. It should be appreciated that this embodiment of the invention, with appropriate constructional adjustments, is equally suitable for the unpaired micromotors described above.

It should be understood that although micromotor 200 has been described to include only one plate 212 and one plate 214, variations of the embodiments of FIGS. 15–21 using a plurality of pairs of piezoelectric plates 212 and 214 are also within the scope of the present invention. In such case, the pairs of plates are preferably mounted parallel to each other.

Figure 26A:
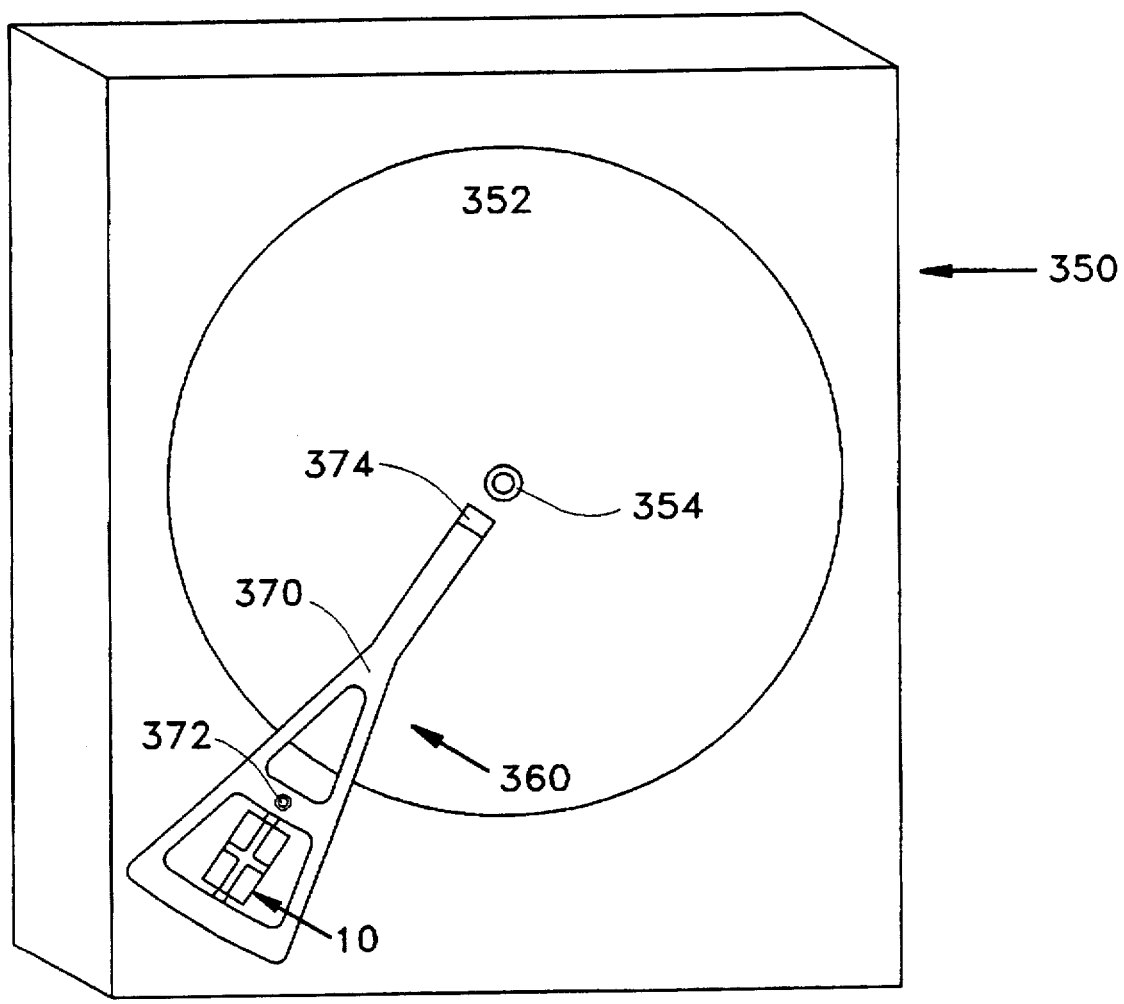
FIG. 26A is a schematic block diagram of a disc drive in accordance with a preferred embodiment of the invention which uses a piezoelectric micromotor to move a read/write head.

In accordance with several preferred embodiments of the invention, piezoelectric ceramic 10 is utilized in a disc drive to move and position a read/write head thereof. Such configurations are shown in FIGS. 26A–26D. FIG. 26A is a schematic block diagram of a disc drive including a piezoelectric micromotor for moving a read/write head. Disc drive 350 accommodates a disc 352 which is rotatable about an axis 354 and a read/write assembly 360. Read/write assembly 360 includes an arm 370 pivotable about a shaft 372, and a piezoelectric ceramic 10 which is utilized to pivot arm 370 about shaft 372. Scanning of disc 352 is performed by rotating disc 352 about axis 354 while rotating arm 370 about shaft 372. Reading or writing on disc 352 is performed via a read/write head 374, which may be any read/write head known in the art, attached to the end of arm 370.

Figure 26B:
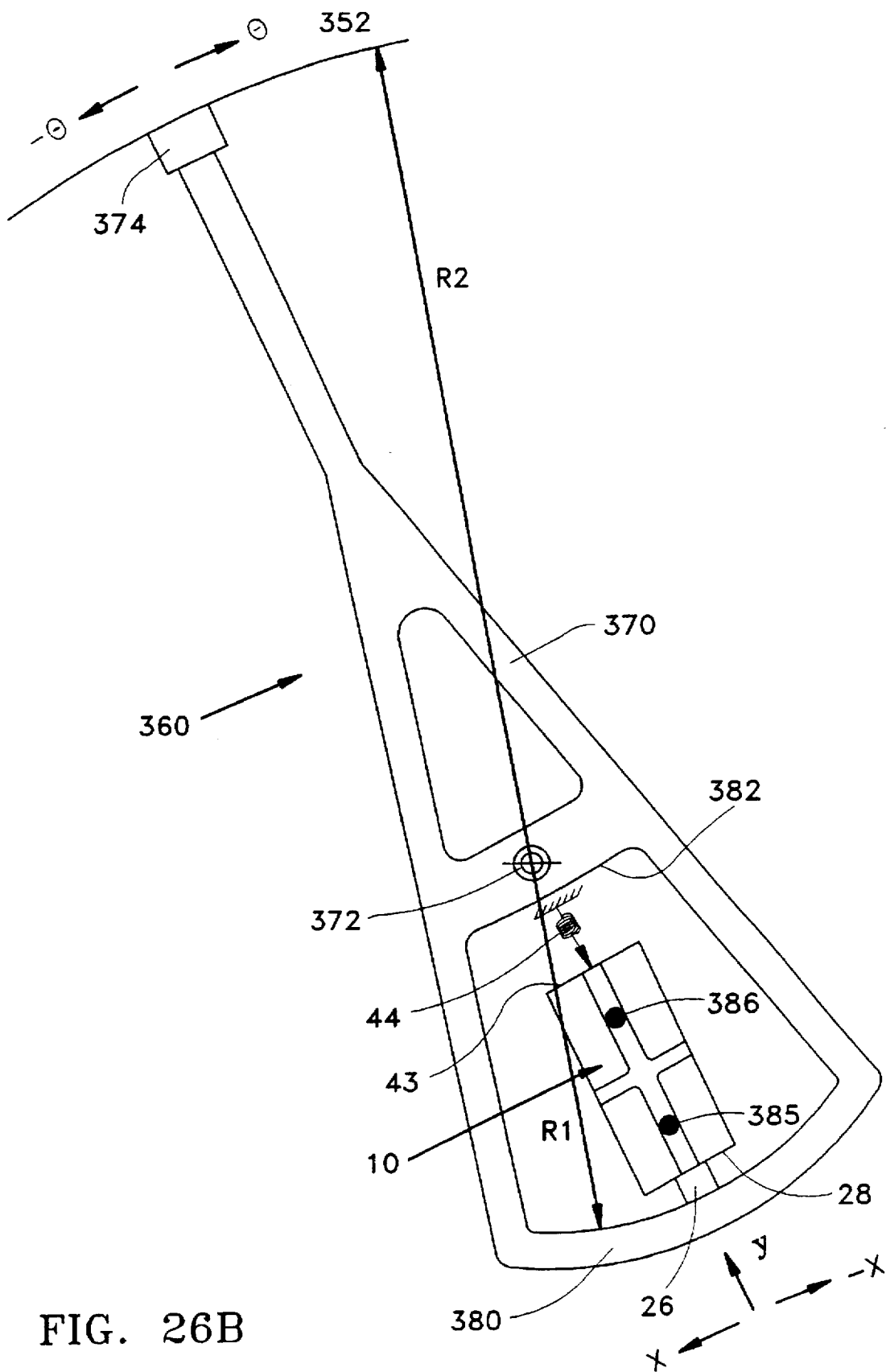
FIGS. 26B, 26C and 26D are schematic illustrations of three alternative configurations of a read/write arm of the disc drive of FIG. 26A in accordance with three preferred embodiments of the present invention.

FIG. 26B is a detailed illustration of read/write assembly 360. As shown in FIG. 26B, piezoelectric ceramic 10, which can take any of the forms described above, is preferably fixedly mounted on an element slidably mounted on a fixed base (not shown) via a pair of through mounts 385 and 386. Piezoelectric ceramic 10 is resiliently urged against a rigid element 380 of arm 370 via resilient element 44, which is preferably pressed against a fixed element in the fixed base (not shown). When excited in accordance with one of the excitation configurations described above, piezoelectric ceramic 10 causes spacer 26, which is urged against rigid element 380, to move in either the x or the −x direction, depending on the electrifying configuration. The relative motion between spacer 26 and arm 370, via rigid element 380, results in pivoting of arm 370 about shaft 372. As a result read/write head 374 moves in either a θ or a −θ direction, respectively, generally tangent to a radius of disc 352.

Mounts 385 and 386 extend through holes in piezoelectric ceramic 10 which are preferably positioned along the long axis of ceramic 10 between the electrodes, at approximately ⅙ and ⅚ of the length of ceramic 10, respectively. At these points the displacement and dimensional variations of ceramic 10 along the x axis are substantially zero.

Figure 26C:
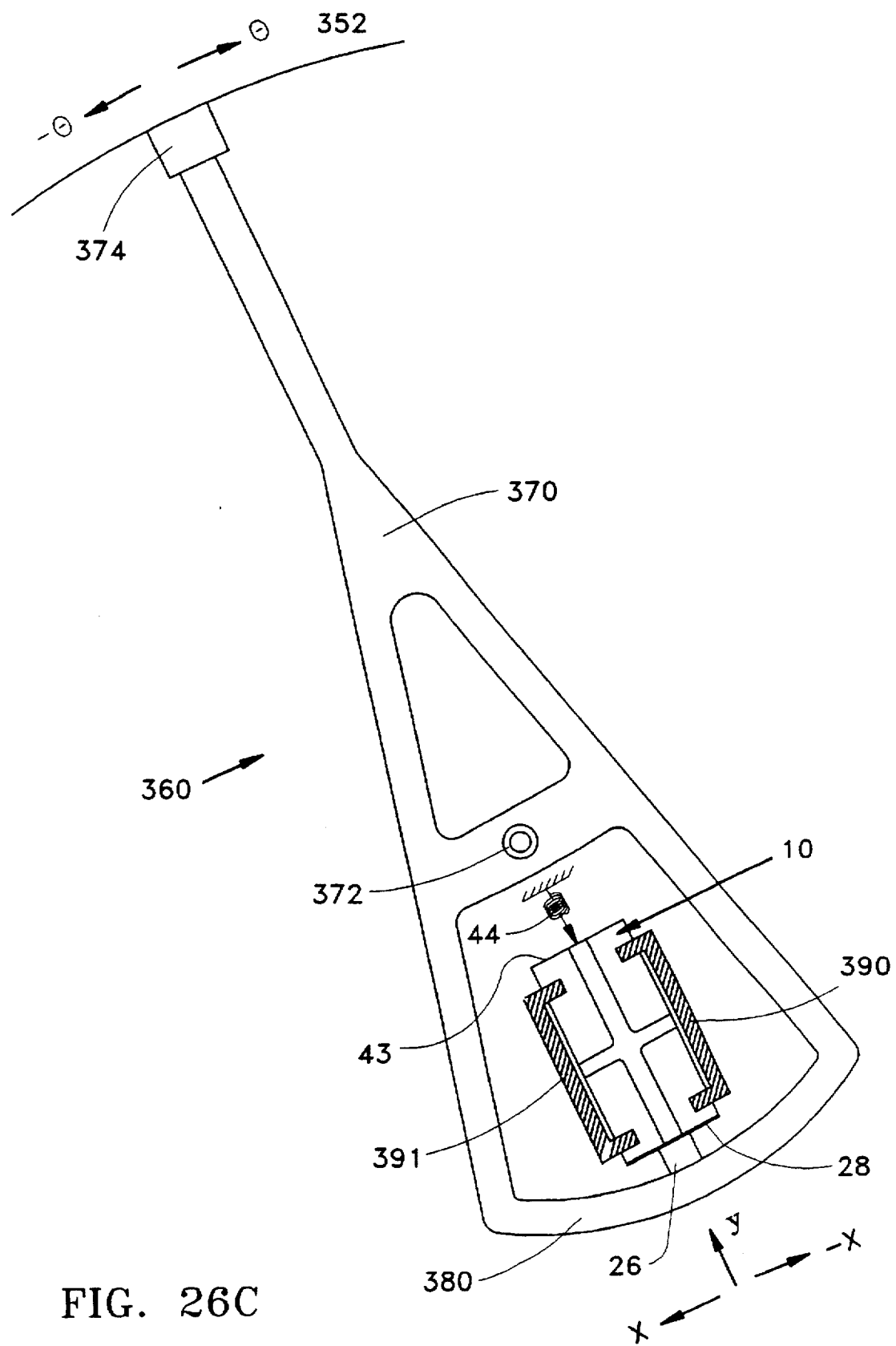
Figure 26D:
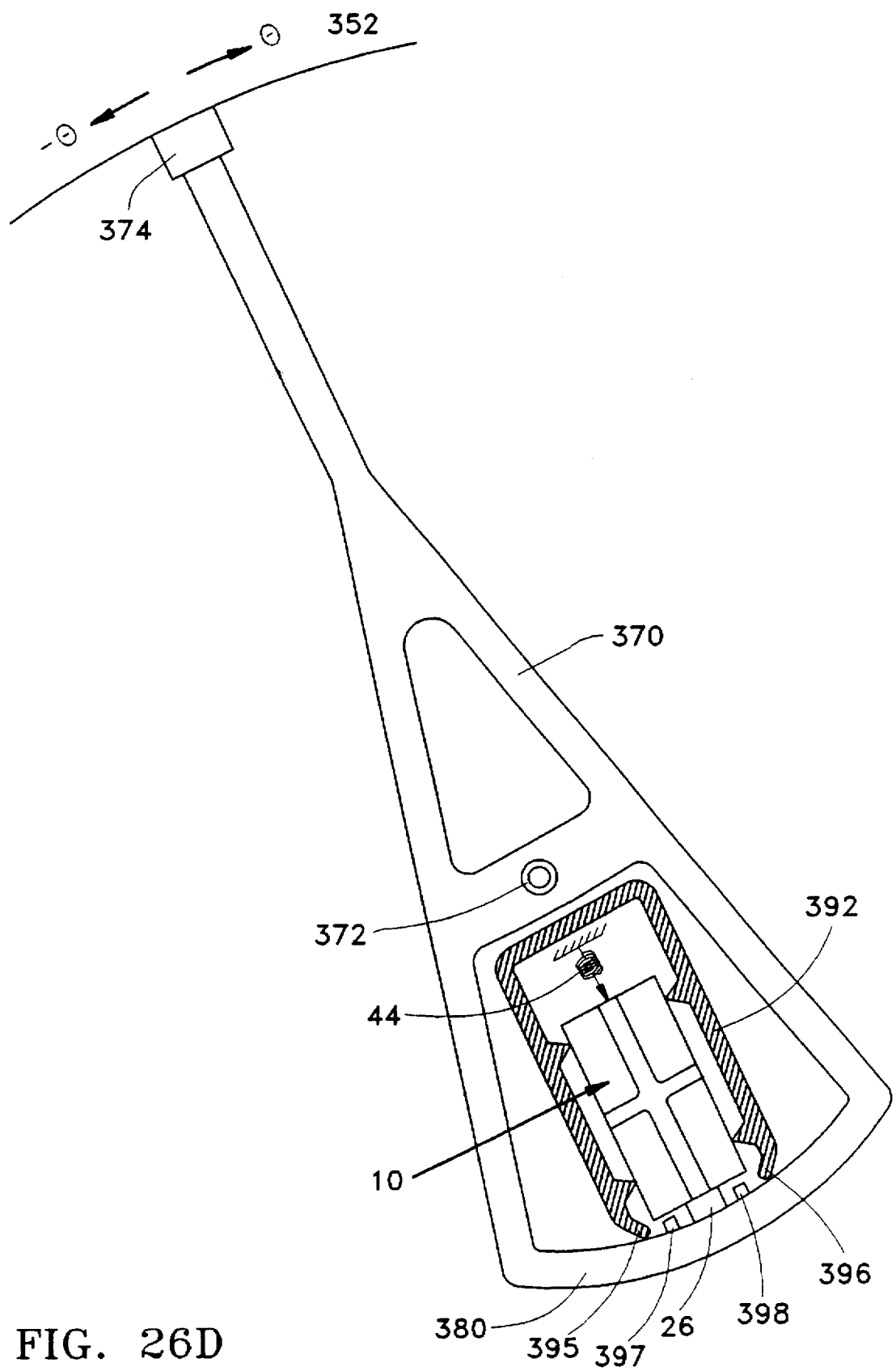

FIGS. 26C and 26D differ from FIG. 26B in the manner in which piezoelectric ceramic 10 is mounted on the fixed base. As shown in FIG. 26C, piezoelectric ceramic 10 can be mounted on the fixed base via a pair of fastening elements 390 and 391, which preferably engage piezoelectric ceramic 10 at approximately ⅙ and ⅚ of the ceramic's length. Piezoelectric ceramic 10 may be situated in guiding slots formed in elements 390 and 391 so as to enable motion of ceramic 10 along the long axis of ceramic 10 while constraining ceramic 10 from motion perpendicular to the long axis of ceramic 10.

Alternatively, as shown in FIG. 26D, piezoelectric ceramic 10 may be attached to the fixed base by a resilient supporting element 392. The supporting resiliency is determined by the stiffness of the material of which supporting element 392 is composed. Supporting element 392 is preferably attached to a fixed base (not shown) and preferably engages ceramic 10 along the long edges of ceramic 10 at approximately ⅙ and ⅚ of the ceramic's length.

Ends 395 and 396 of supporting element 392 preferably engage element 380 of arm 370, so as to remove dust which settles on element 380. Protrusions 397 and 398, which are preferably situated on the spacer facing side of element 380 between spacer 26 and ends 395 and 396, respectively, limit the range of angular displacement of arm 370 and further suppress accumulation of dust in the vicinity of spacer 26.

For a practical embodiment the ratio between the radius of rotation of a point on element 380 with respect to shaft 372, R1, and the radius of rotation of a point on read/write head 374 with respect to shaft 372, R2, is of the order of 1 to 3 or 1 to 5. Therefore, a linear displacement of read/write head 374 on disc 352 is approximately 3 to 5 times larger than a linear displacement of spacer 26 for a given angular displacement Δθ, respectively.

Figure 27:
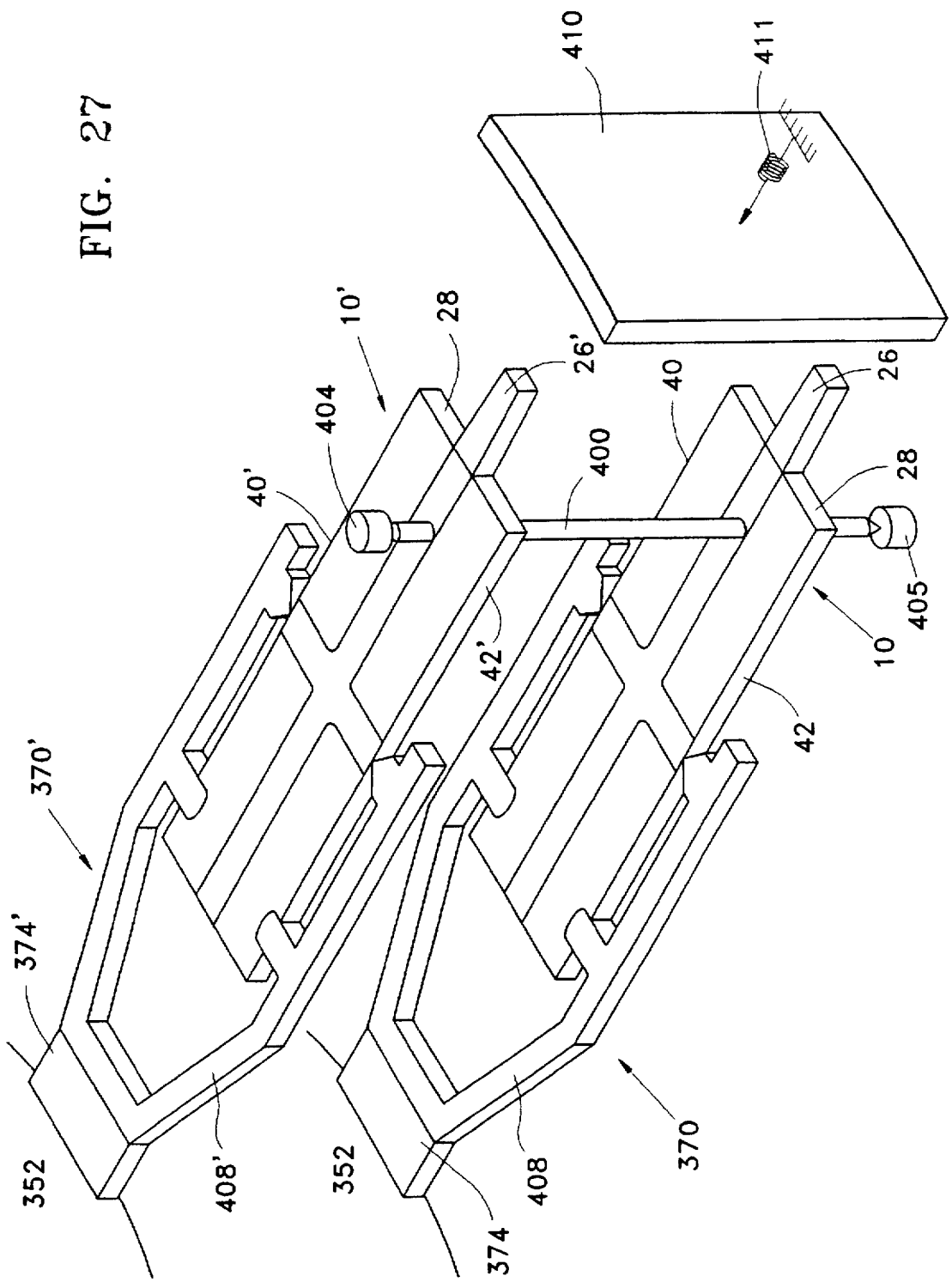
FIG. 27 is schematic illustration of a dual disk drive arrangement, in accordance with a preferred embodiment of the invention.

In accordance with a preferred embodiment of the invention, a plurality of piezoelectric ceramics are used in order to increase the reading or writing capacity of a disc drive. An example of such an arrangement is shown in FIG. 27, which illustrates two parallel piezoelectric ceramics 10 and 10' mounted onto an shaft 400. This arrangement can be utilized for simultaneously reading or writing on opposite sides of a single disc, or alternatively, for simultaneously reading or writing on more than one disc. However, for reading or writing on a single sided disc, only one piezoelectric ceramic, either 10 or 10', is used.

In the arrangement shown in FIG. 27 both arms 370 and 370' are pivotable about shaft 400, which extends through holes in piezoelectric ceramics 10 and 10'.

For each of ceramics 10 and 10' the hole is preferably located in the space between adjacent electrodes along respective short edge 28 and is distant from respective short edge 28 by approximately ⅙ of the ceramic's length. Piezoelectric ceramics 10 and 10' may be fixedly attached to rotatable shaft 400 and be cooperatively moved by rotating shaft 400. Alternatively, piezoelectric ceramics 10 and 10' may be rotatably attached to shaft 400 which is fixedly held between retaining elements 404 and 405, to independently move each of piezoelectric ceramics 10 and 10'. Retaining elements 404 and 405 are preferably attached to a fixed base (not shown).

Piezoelectric ceramics 10 and 10' are attached to read/write heads 374 and 374' via connecting elements 408 and 408', respectively. Element 408 is preferably attached to or clamps piezoelectric ceramic 10 along long edges 40 and 42. Element 408 preferably engages piezoelectric ceramic 10 at points which are distant from short edge 28 by about ½ and ⅚ of the ceramic's length. Corresponding element 408' preferably engages piezoelectric ceramic 10' at the ½ and ⅚ points along long edges 40' and 42'. At the ½ and ⅚ points there is substantially zero movement or dimensional variations of ceramics 10 and 10' in the x direction. A rigid element 410 is preferably urged against spacers 26 and 26' of ceramics 10 and 10' respectively, preferably using a resilient element 411.

In a practical arrangement, such as shown in FIG. 27, the ratio between the radius of rotation of a point on element 410 with respect to shaft 400 to the radius of rotation of a point on read/write head 374 with respect to shaft 400 is between 1 to 5 and 1 to 10. Therefore, for a given angular displacement, Δθ, the linear displacement of read/write head 374 on disc 352 may be 5 to 10 times larger than the linear displacement of spacer 26, respectively.

The system incorporating piezoelectric ceramics 10 and 10' may be operated in a closed loop mode, incorporating disc drive tracks controllers (not shown) to determine the position of the writing head.

Figure 28:
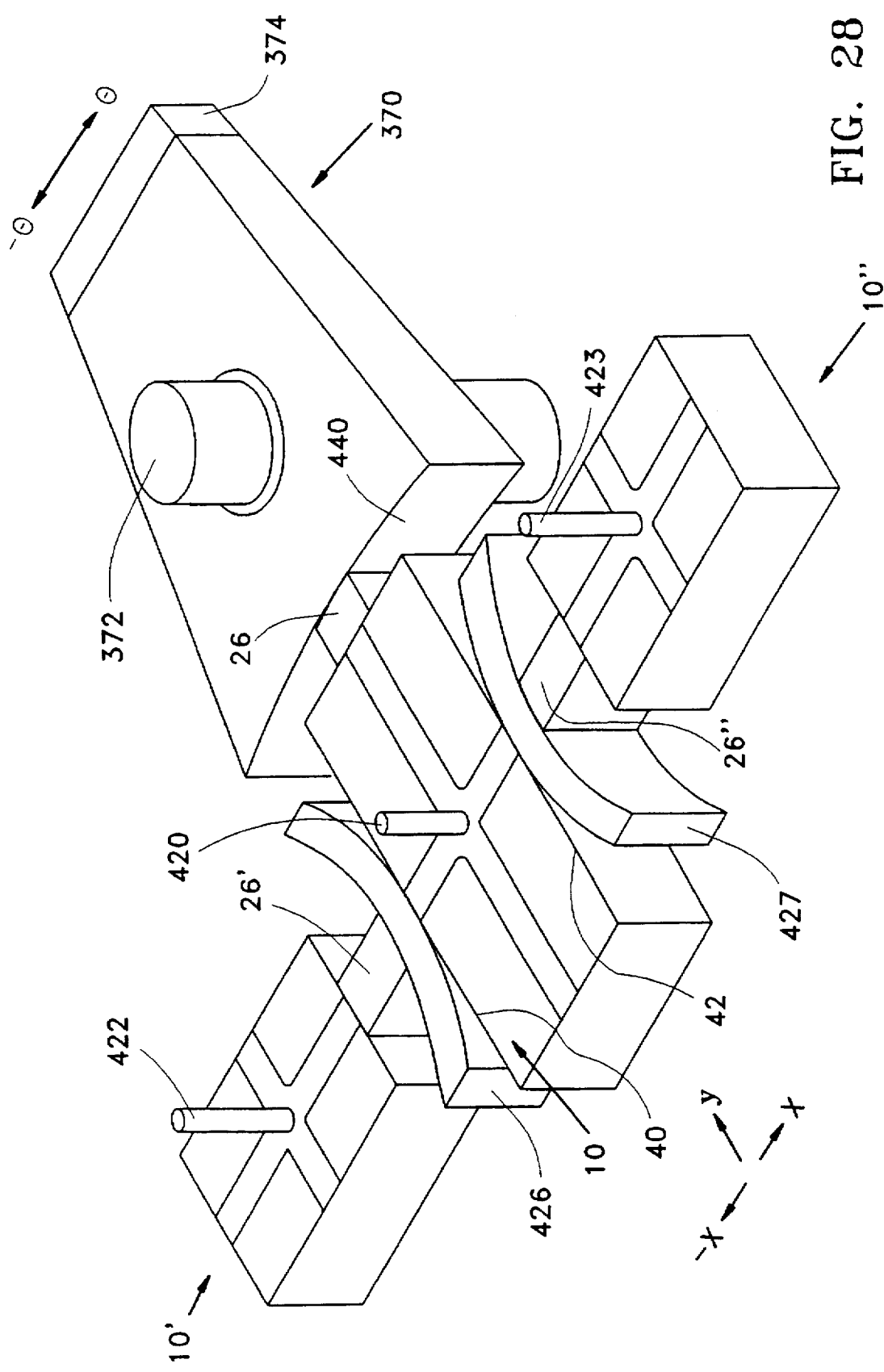
FIG. 28 is a schematic illustration of a three piezoelectric plate arrangement adapted to provide increased angular and linear displacement ranges while enabling fine tuning of the motion of a read/write head in accordance with a preferred embodiment of the invention.

In a preferred embodiment of the invention, a plurality of piezoelectric ceramics are used in order to enhance the tuning capability and increase the overall angular displacement of the read/write head. FIG. 28 illustrates one such an arrangement, in which three piezoelectric ceramics are employed. A pair of piezoelectric ceramics 10' and 10" are utilized to rotate piezoelectric ceramic 10 about a shaft 420, which is preferably attached to a fixed base (not shown). Spacer 26, which is attached to piezoelectric ceramic 10, is urged against an edge 440 of arm 370. The force exerted by spacer 26 on edge 440 of arm 370 causes rotation of arm 370 and the read/write head 374 attached thereto about shaft 372 in accordance with the motion of spacer 26.

In a preferred embodiment of the invention, piezoelectric ceramics 10' and 10" may be stationary with respect to shaft 420 and may be attached to a fixed base (not shown) by shafts mounted on elements slidably mounted on the fixed base, as described above with reference to FIG. 26B. Alternatively, ceramics 10' and 10" may be attached to the fixed base by fastening elements, as shown in FIG. 26C or by other methods described herein. Shaft 420 extends through a hole in the center of piezoelectric ceramic 10, preferably located in the cross junction of the spaces between the four electrodes of the ceramic. A spacer 26', which is attached to piezoelectric ceramic 10', is urged against the concave side of a solid arc shaped element 426. The convex side of element 426 is preferably attached to long edge 40 of piezoelectric ceramic 10, at about the center of long edge 40. Excitation of piezoelectric ceramic 10' causes spacer 26' to move in the y or the −y direction, according to the electrifying voltages. The force exerted on element 426 by spacer 26' causes movement of element 426 in accordance with the motion of spacer 26'.

The force exerted by element 426 on piezoelectric ceramic 10 causes rotation of ceramic 10 in the θ or the −θ direction, respectively. An arc shaped element 427, similar to element 426, is preferably urged against long edge 42 of piezoelectric ceramic 10, in order to couple the motion of spacer 26" of piezoelectric ceramic 10" and the rotation of piezoelectric ceramic 10, as described above with reference to element 426. Movement of spacer 26" in y or −y direction, causes piezoelectric ceramic 10 to rotate in the −θ or the θ direction, respectively, in opposite sense to the direction induced by piezoelectric ceramic 10' with substantially the same displacement Δy as spacer 26'. Additionally, motion of spacer 26 which induces linear displacement of the body in the x or the −x direction, can be achieved by direct excitation of piezoelectric ceramic 10.

Piezoelectric ceramics 10, 10' and 10" are preferably electrically linked, in order to correlate the movements of spacers 26, 26' and 26", which are attached to ceramics 10, 10' and 10", respectively. The overall movement of spacer 26 and the resultant movement of read/write head 374, consist of a superposition of the movements produced by each of piezoelectric ceramics 10, 10' and 10" separately. Utilizing the apparatus shown in FIG. 28 and described above in conjunction with the previously described modes of electrification described above provides read/write head 374 with extended ranges of angular and linear displacements, while enhancing the capability of finely tuning the motion of the read/write head over its entire displacement range, compared to a disc drive in which no such configuration is employed. Excitation of piezoelectric ceramics 10, 10' and 10" can be configured to achieve a wide variety of motion profiles for read/write head 374.

In principle, the piezoelectric micromotor arrangements described above, with reference to FIGS. 26A–28, are suitable for driving read/write heads of computer discdrives. Nevertheless, during operation of the piezoelectric micromotors, the ceramic spacers of the micromotors generate ceramic dust which may reach the surface of disc. This ceramic dust may interfere with the operation of the read/write head. Thus, in further preferred embodiments of the present invention, the ceramic motors driving the read/write heads are isolated from the region where reading/writing takes place, as described in detail below.

Figure 29A:
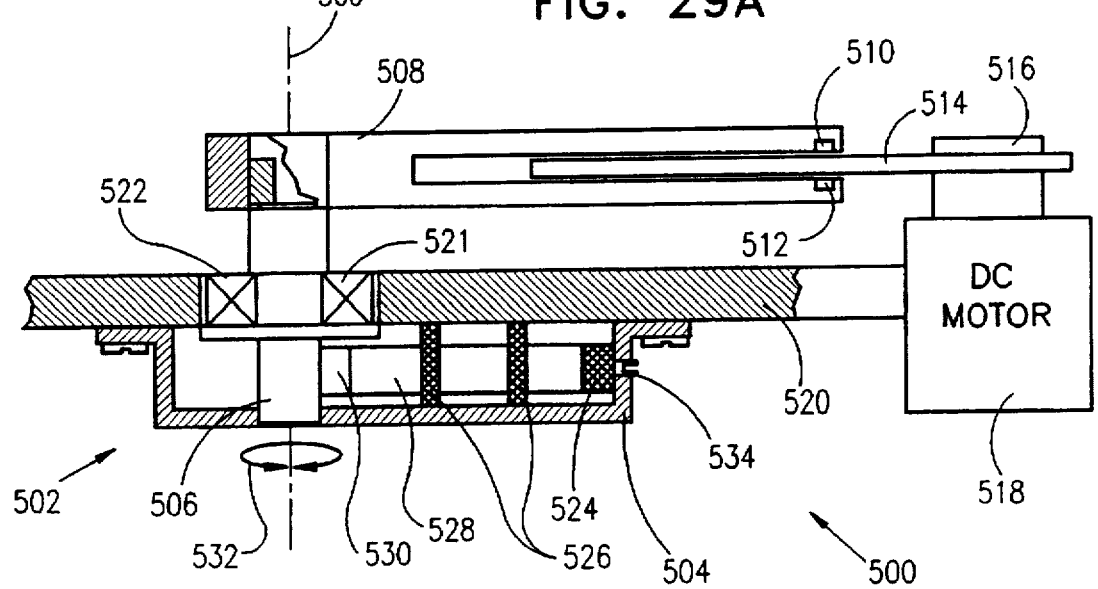
FIG. 29A is a side view, schematic, cross-sectional, illustration of a disc drive utilizing an isolated piezoelectric micromotor arrangement, in accordance with a further, preferred, embodiment of the present invention.

Reference is now made to FIG. 29A which schematically illustrates a disc drive 500 employing an isolated piezoelectric micromotor arrangement 502, constructed and operative in accordance with a preferred embodiment of the present invention. Disc drive 500 includes a housing 520, having a reinforced bottom portion 521, and a DC motor 518 which drives a disc 514, preferably a double sided magnetic disc, using a shaft 516. The disc drive further includes an arm 508 carrying first and second read/write heads 510 and 512 operatively associated with two opposite sides of disc 514, as is known in the art. Arm 508 is mounted on an axle 506 and is pivoted about an axis 560 by rotation of axle 506 as indicated by arrow 532. As known in the art, pivoting of arm 508 about axis 560 results in motion of heads 510 and 512 generally along a radius of disc 514. In a preferred embodiment of the invention, axle 506 extends downward through reinforced bottom portion 521 of housing 520 into a casing 504 of micromotor arrangement 502. A sealed bearing 522 is preferably provided between axle 506 and reinforced portion 521, to enable low-friction rotation of axle 506 about axis 560 and to isolate the interior of housing 520 from dust which may accumulate in casing 504.

Figure 29B:
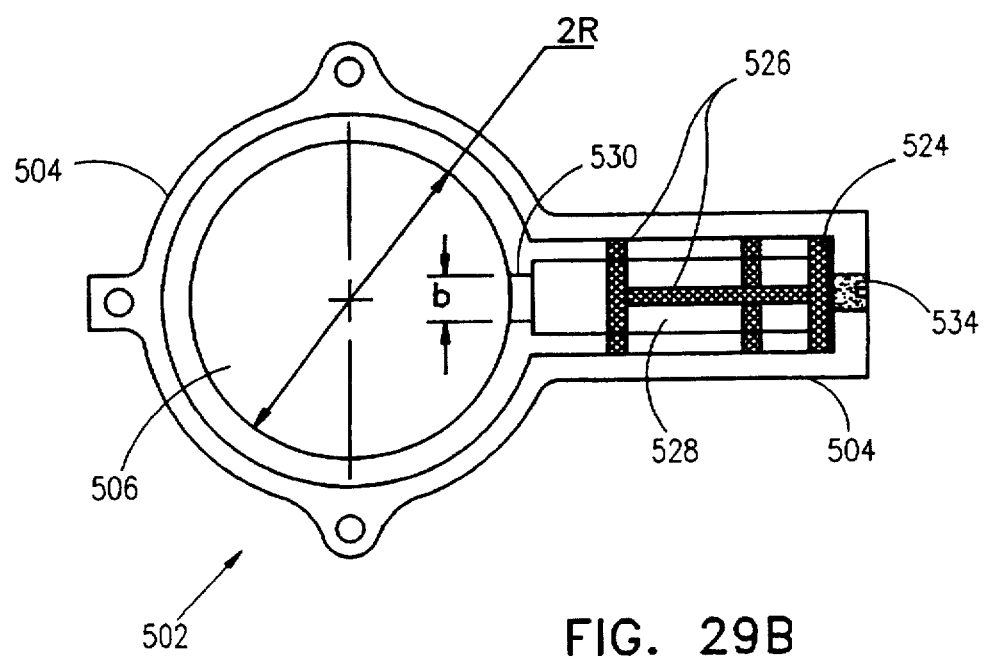
FIG. 29B is a bottom view, schematic, illustration of the isolated micromotor arrangement of FIG. 29A.

Reference is now also made to FIG. 29B which schematically illustrates a bottom, cross-sectional, view of micromotor arrangement 502, and to FIG. 30 which is a perspective, schematic, illustration of a portion of micromotor arrangement 502. As shown in FIGS. 29A, 29B and 30, micromotor arrangement 502 includes a piezoelectric plate 528 having a, preferably ceramic, spacer 530 attached to one of the short edges thereof and engaging the surface of axle 506. The operative edge of ceramic spacer 530 is preferably curved in accordance with the curvature of the surface of axle 506, as clearly shown in FIGS. 29B and 30. The width, b, of spacer 530 is preferably equal to approximately $\frac{1}{3}$–$\frac{1}{2}$ times the radius, R, of axle 506. This ratio provides optimal interaction between spacer 530 and axle 506. Spacer 530 may be formed of any of the ceramic materials mentioned above, in context of other preferred embodiments of the present invention, however, Alumina FG-995 is a particularly suitable material for spacer 530.

Piezoelectric plate 528 is preferably mounted in an elastic support structure 526 which tightly supports plate 528 against the inner surface of casing 504. Such mounting enables movement of plate 528 along the direction of its longer dimension while motion along the direction of the shorter dimension of plate 528 is substantially limited to piezoelectric displacements only, as described below. Support structure 526 may be formed of any suitable material, such as a rubber or plastic material, but is preferably formed of silicone, preferably having a Shore A hardness of 80. The back edge of plate 528, i.e. the edge opposite that of spacer 530, is preferably supported by a resilient member 524, preferably formed of silicone and/or metal, which urges plate 528 with spacer 530 against the surface of axle 506. In a preferred embodiment of the invention, the force applied by resilient member 524 to plate 528 may be adjusted using an adjustment screw 534.

It is appreciated that prolonged operation of the micromotor may result in erosion and, thus, shortening of spacer 530 due to the mechanical interaction between the spacer and axle 526. However, since support structure 526 allows motion of plate 528 along its longer dimension, any shortening of spacer 530 is compensated by a corresponding forward displacement of plate 528 which is urged towards axle 506 by resilient member 524. This mechanism ensures that the useful life of micromotor arrangement 502 will not be appreciably shortened due to erosion of ceramic spacer 530. It should be appreciated that the appropriate curvature at the operative edge of spacer 530 is maintained during erosion of the spacer.

Piezoelectric plate 528 may be driven in accordance with any of the excitation modes described above, with reference to other preferred embodiments of the present invention, so as to yield a desired motion of ceramic spacer 530.

Figure 31A:
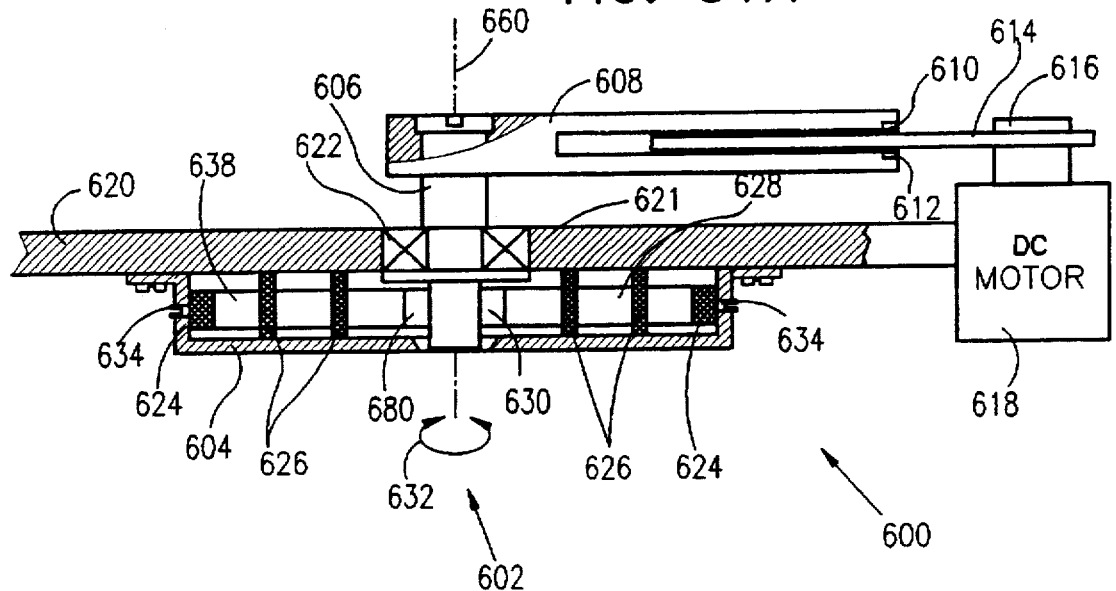
FIG. 31A is a side view, schematic, cross-sectional, illustration of a disc drive utilizing an isolated, double piezoelectric micromotor arrangement, in accordance with another, preferred, embodiment of the present invention.

Reference is now made to FIG. 31A which schematically illustrates a disc drive 600 employing an isolated, double piezoelectric micromotor arrangement 602, constructed and operative in accordance with another preferred embodiment of the present invention. Disc drive 600 includes a housing 620 and a DC motor 618 which drives a disc 614, preferably a double sided magnetic disc, using a shaft 616. The disc drive further includes an arm 608 carrying first and second read/write heads 610 and 612 operatively associated with two opposite sides of disc 614, as is known in the art. Arm 608 is mounted on an axle 606 and may be pivoted about an axis 660 by rotation of axle 606 as indicated by arrow 632. As known in the art, pivoting of arm 608 about axis 660 results in motion of heads 610 and 612 generally along a radius of disc 614. In a preferred embodiment of the invention, axle 606 extends downward through a reinforced bottom portion 621 of housing 620 into a casing 604 of micromotor arrangement 602. A sealed bearing 622 is preferably provided between axle 606 and reinforced portion 621, to enable low-friction rotation of axle 606 about axis 660 and to isolate the interior of housing 620 from dust which may accumulate in casing 604.

Figure 31B:
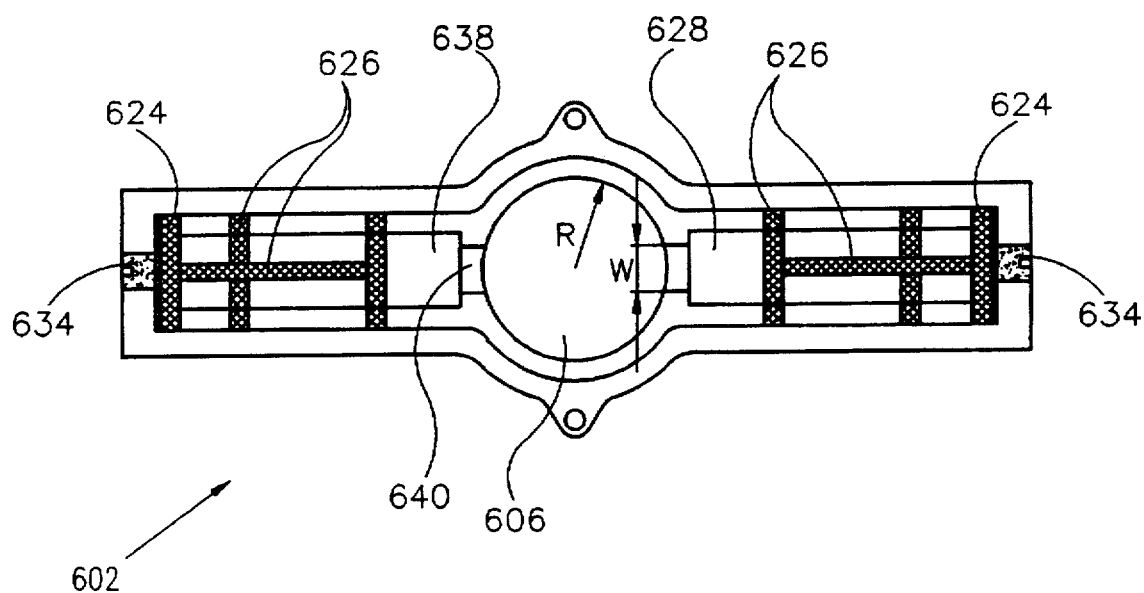
FIG. 31B is a bottom view, schematic, illustration of a portion of the isolated micromotor arrangement of FIG. 31A.

Reference is now also made to FIG. 31B which schematically illustrates a bottom, cross-sectional, view of micromotor arrangement 602. As shown in FIGS. 31A and 31B, micromotor arrangement 602 includes first and second piezoelectric plates 628 and 638. A first, preferably ceramic, spacer 630 is attached to one of the short edges of plate 628 and engages a first portion of the surface of axle 606. A second, preferably ceramic, spacer 640 is attached to one of the short edges of plate 638 and engages a second portion, opposite the first portion, of the surface of axle 606. The operative edges of ceramic spacers 630 and 640 are preferably curved in accordance with the curvature of the surface of axle 606, as clearly shown in FIG. 31B. The width, w, of spacers 630 and 640 is preferably equal to approximately $\frac{1}{3}$–$\frac{1}{2}$ times the radius, R, of axle 606. This ratio provides optimal interaction between spacers 630 and 640 and axle 606. Spacers 630 and 640 may be formed of any suitable ceramic material, however, Alumina FG-995 is a particularly suitable material for spacers 630 and 640.

Piezoelectric plates 628 and 638 are preferably mounted in elastic support structures 626 which tightly support plates 628 and 638, respectively, against the inner surface of casing 604. Such mounting enables movement of plates 628 and 638 along the direction of their longer dimension while motion along the direction of their shorter dimension is substantially limited to piezoelectric displacements only, as described below. Support structures 626 may be formed of any suitable material, such as rubber or plastic, but are preferably formed of silicone, preferably having a Shore A hardness of 80. The back edges of plates 628 and 638, i.e. the edges opposite those of spacers 630 and 640, are preferably supported by resilient members 624, similar to resilient member 524 in FIGS. 29A-30, which urge plates 628 and 638 with spacers 630 and 640, respectively, against the opposite portions of the surface of axle 606. In a preferred embodiment of the invention, the forces applied by resilient members 624 to plates 628 and 638 may be adjusted using respective adjustment screws 634.

As in the single micromotor embodiment of FIGS. 29A-30, any shortening of spacers 630 and 640 is compensated by corresponding forward displacements of the respective plates 628 and 638 which are urged towards axle 606 by resilient members 624. This lengthens the useful life of the spacers. It should be appreciated that the appropriate curvatures at the operative edges of spacers 630 640 are maintained during erosion of the spacers.

Piezoelectric plates 628 and 638 may be driven in accordance with any of the excitation modes described above, with reference to other preferred embodiments of the present invention, so as to yield a desired motion of ceramic spacers 630 and 640. However, in a preferred embodiment of the present invention, the excitation modes of plates 628 and 638 are identical and synchronized, such that spacers 630 and 640 engage and disengage axle 606 substantially simultaneously. Thus, during operation of the micromotor, the force applied to axle 606 by spacer 630 is counteracted by a corresponding, opposite, force applied by spacer 640. This ensures more balanced and more efficient operation of the double micromotor.

Figure 32:
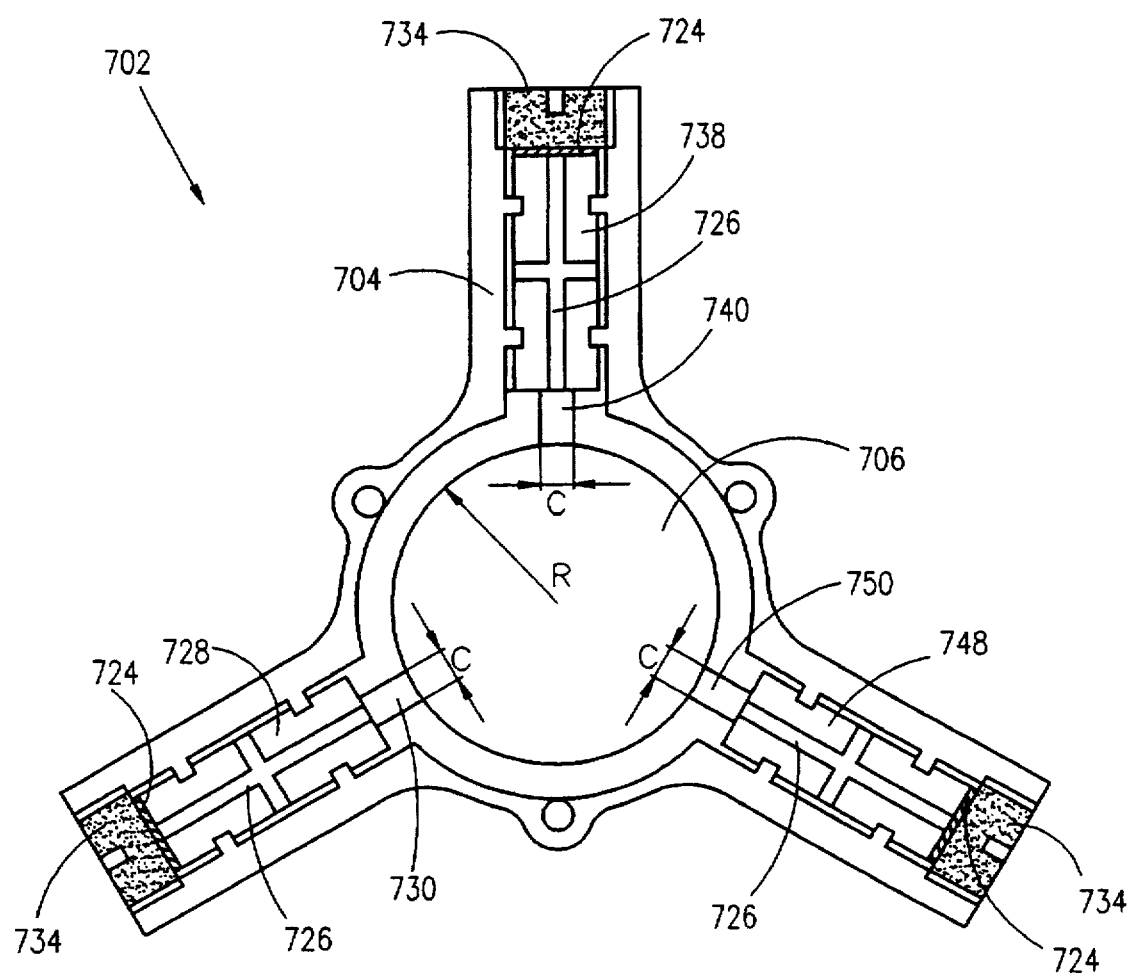
FIG. 32 is a bottom view, schematic, cross-sectional, illustration of a portion of an isolated, triple piezoelectric micromotor arrangement, in accordance with another, preferred, embodiment of the present invention.

Reference is now made to FIG. 32A which schematically illustrates a bottom, cross-sectional, view of a triple micromotor arrangement 702, in accordance with yet another preferred embodiment of the present invention, adapted for providing rotational motion to an axle 706. Axle 706 is preferably connected to an arm of a read/write head of a disc drive, in analogy to axle 506 (FIGS. 29B and 29B) or to axle 606 (FIGS. 31A and 31B). As shown in FIG. 32A, micromotor arrangement 702 includes three piezoelectric plates 728, 738 and 748, respectively, having preferably ceramic spacers 730, 740 and 750, respectively, attached to respective short edges thereof. Spacers 730, 740 and 750 engage three, respective, portions of the surface of axle 706. The operative edges of ceramic spacers 730, 740 and 750 are preferably curved in accordance with the curvature of the surface of axle 706. The width, c, of each of spacers 730, 740 and 750 is preferably equal to approximately ⅓–½ times the radius, R, of axle 706. This ratio provides optimal interaction between spacers 730, 740 and 750 and axle 706. Spacers 730, 740 and 750 may be formed of any suitable ceramic material, however, in a preferred embodiment of the invention, two of the three spacers, e.g. spacers 730 and 740, are formed of Alumina AD-96 while the third spacer, e.g. spacer 750, is formed of Silicon Carbide.

Piezoelectric plates 728 are preferably mounted in elastic support structures 726 which tightly support plates 728, 738 and 748, respectively, against the inner surface of a triple micromotor casing 704. Such mounting enables movement of plates 728, 738 and 748 along the direction of their longer dimension while motion along the direction of the shorter dimension of the plates is substantially limited to piezoelectric displacements only, as described below. Support structures 726 may be formed of any suitable material, such as rubber or plastic, but are preferably formed of silicone, preferably having a Shore A hardness of 80. The back edges of plates 728, 738 and 748, i.e. the edges opposite those of spacers 730, 740 and 750, respectively, are preferably supported by respective resilient members 724 which urge plates 728, 738 and 748 with spacers 730, 740 and 750, respectively, against the respective portions on the surface of axle 706. In a preferred embodiment of the invention, the forces applied by resilient members 724 to plates 728, 738 and 748 may be adjusted using respective adjustment screws 734.

As in the single and double micromotor embodiments of FIGS. 29A–31B, any shortening of spacers 730, 740 or 750 is compensated by corresponding forward displacements of plates 728, 738 or 748, respectively, which are urged towards axle 706 by resilient members 724. This lengthens the useful life of the spacers. It should be appreciated that the appropriate curvatures at the operative edges of spacers 730, 740 and 750 are maintained during erosion of the spacers.

Piezoelectric plates 728, 738 and 748 may be identical and may be driven in accordance with any of the excitation modes described above, with reference to other preferred embodiments of the present invention, so as to yield desired motions of ceramic spacers 730, 740 and 750. However, individual micromotors may be driven out of phase to provide a more uniform rotational force. Thus, two of the micromotors may be driven at the same phase while the third micromotor may be driven 180° out of phase relative to the other two micromotors. Furthermore, the three motors may be driven at 120° phase intervals, resulting in a high "duty cycle" of the driving force which is applied to axle 706. Furthermore, a suitable choice of at least one relatively soft piezoelectric plate will result in an even smoother, more continuous drive. Finally, the piezoelectric micromotors may have differing hardnesses which will result in the advantages described above in the context of composite hard/soft micromotors. It should be understood that when different excitations and/or piezoelectric characteristics are used for the micromotors, some radial force may result.

In one preferred embodiment of the present invention, piezoelectric plates 728, 738 and 748 are not identical but, rather, piezoelectric plates 728 and 738 are preferably formed of harder material than that used for plate 748. Preferably, a PZT-5 plate, available from Phillips Ltd., the Netherlands, is used for each of plates 728 and 738, and a PZT-4 plate, also available from Phillips Ltd., the Netherlands, is used for plate 748. The PZT-5 plate, which is harder than the PZT-4 plate, also provides higher mechanical amplitudes. Thus, in this configuration, more than two thirds of the total driving power is provided by plates 728 and 738 while plate 748 provides smoother, more accurate motion. When used on a computer disc drive, the above described triple micromotor arrangement provides the read/write head of the disc drive with a linear velocity of 5–8 meters per second and a position accuracy of better than 1 nanometer, when in motion along the surface of the disc. The micromotors in this preferred embodiment of the present invention may be driven in accordance with any of the excitation modes described above.

Figure 33A:
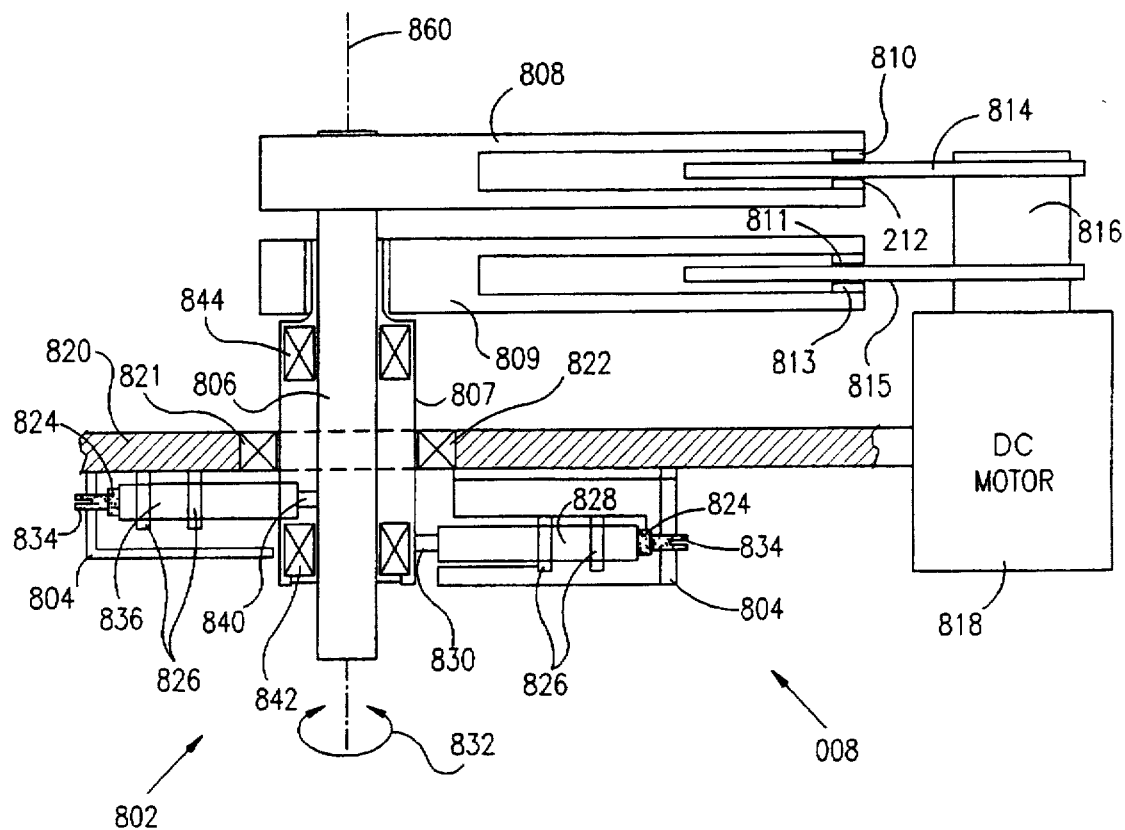
FIG. 33A is a side view, schematic, cross-sectional, illustration of a double disc drive utilizing an isolated piezoelectric micromotor arrangement, in accordance with an additional, preferred, embodiment of the present invention.
Figure 33B:
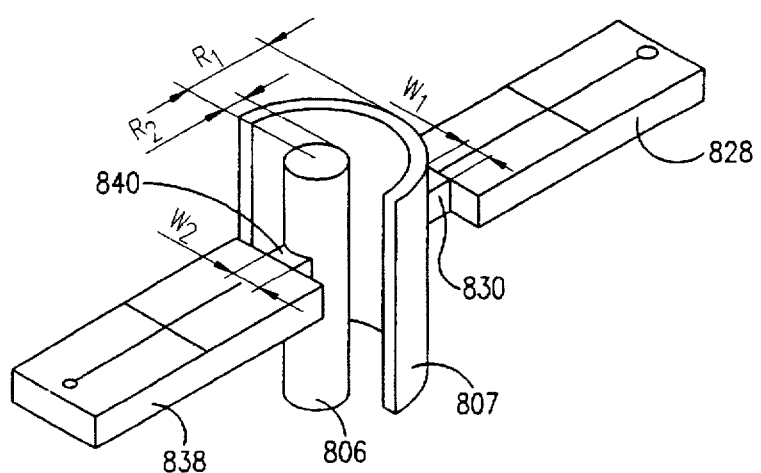
FIG. 33B is a perspective, schematic, illustration of the isolated micromotor arrangement of FIG. 33A.

Reference is now made to FIG. 33A which schematically illustrates a side cross-section of a double disc drive 800 utilizing an isolated piezoelectric micromotor arrangement 802, in accordance with an additional, preferred, embodiment of the present invention, and to FIG. 33B which is a perspective illustration of a portion of the isolated micromotor arrangement of FIG. 33A. Double disc drive 800 includes a housing 820 and a DC motor 818 which drives discs 814 and 815, preferably double sided magnetic discs, using a shaft 816. The disc drive further includes a top arm 808, carrying first and second read/write heads 810 and 812 juxtaposed with two opposite sides of disc 814, and a bottom arm 809, carrying first and second read/write heads 811 and 813 juxtaposed with two opposite sides of disc 815, as is known in the art. In a preferred embodiment of the invention, arms 808 and 809 are co-axially pivotable as described below.

Top arm 808 is preferably mounted on an inner axle 806 and may be pivoted about an axis 860 by rotation of axle 806 as indicated by arrow 832. Bottom arm 809 is mounted on an outer, hollow, axle 807 which is coaxial with axle 806, and may be pivoted about axis 860 by rotation of axle 807, as indicated by arrow 832. Pivoting of arm 808 about axis 860 results in motion of heads 810 and 812 generally along a radius of disc 814. Pivoting of arm 809 about axis 860 results in motion of heads 811 and 813 generally along a radius of disc 815. In a preferred embodiment of the invention, axle 807 extends downward through a reinforced portion 821 of housing 820 into the interior of a casing 804 of micromotor arrangement 802. A sealed bearing 822 is preferably provided between axle 807 and reinforced portion 821 of housing 820, to enable low-friction rotation of axle 807 about axis 860 and to isolate the interior of housing 820 from dust build-up in casing 804. Axle 806 preferably extends downward through the hollow interior of axle 807 into the interior of a casing 804. A bearings 842 and a sealed bearing 844 are preferably provided between axle 806 and axle 807, to enable low-friction rotation of axle 806 about axis 860 and to further isolate the interior of housing 820 from dust build-up in casing 804.

As shown in FIGS. 33A and 33B, micromotor arrangement 802 includes two piezoelectric plates, 828 and 838, having a preferably ceramic spacers 830 and 840, respectively, attached to short edges thereof. Spacer 830 engages a portion of the outer surface of axle 807, while spacer 840 engages a portion of the surface of axle 806. The operative edges of ceramic spacers 830 and 840 are preferably curved in accordance with the surface curvatures of axles 807 and 806, respectively, as clearly shown in FIG. 33B. The width, w1, of spacer 830 is preferably equal to approximately ⅓ times the radius, R1, of axle 807, while the width, w2, of spacer 840 is preferably equal to approximately ¼–½ times the radius, R2, of axle 806. These ratios provide optimal interaction between spacers 830 and 840 and axles 807 and 806, respectively. Spacers 830 and 840 may be formed of any suitable ceramic material, however, Alumina FG-995 is a particularly suitable material for spacers 830 and 840.

Piezoelectric plates 828 and 838 are preferably mounted in elastic support structures 826 which tightly support the plates against the inner surface of casing 804. Such mounting enables movement of plates 828 and 838 in the direction of their longer dimension, while motion in the direction of the shorter dimension of the plates is limited to piezoelectric displacements only, as described below. Support structures 826 may be formed of any suitable material, such as rubber or plastic, but are preferably formed of silicone, preferably having a Shore A hardness of 80. The back edges of plates 828 and 838, i.e. the edges opposite those of spacers 830 and 840, respectively, are preferably supported by resilient members 824 which urge plates 828 and 838 with spacers 830 and 840, respectively, against the surfaces of axles 807 and 806, respectively. In a preferred embodiment of the invention, the forces applied by resilient members 824 to plates 828 and 838 may be adjusted using respective adjustment screws 834.

As in the single disc-drive embodiments of FIGS. 29A–32, any shortening of spacers 830 and 840 is compensated by corresponding forward displacements of the plates 828 and 838, respectively, which are urged towards axles 807 and 806, respectively, by resilient members 824. This lengthens the useful life of the spacers. It should be appreciated that the appropriate curvatures at the operative edges of spacers 830 and 840 are maintained during erosion of the spacers.

Piezoelectric plates 828 and 838 may be driven in accordance with any of the excitation modes described above, with reference to other preferred embodiments of the present invention, so as to yield desired motions of ceramic spacers 830 and 840.

In all the embodiments described above, with reference to FIGS. 29A–33B, the preferred dimensions of the piezoelectric plates are approximately 5 millimeters×2.5 millimeters× 2.5 millimeters. The ceramic spacer of such a plates is preferably attached to one of the 2.5 mm×2.5 mm faces of the plate.

The embodiments of FIGS. 29A–33B have been described in the context of magnetic disc drives using magnetic read/write heads. However, it should be appreciated that the present invention is also applicable to optical disc-drives using optical read/write heads.

It will be appreciated by persons skilled in the art that the present invention is not limited by what has been particularly shown and described herein. Rather the scope of the present invention is defined only by the claims which follow:

I claim:
1. A disc drive comprising:
   a housing;
   an arm having first and second ends and having at least one read/write head mounted to the first end thereof;
   an axle fixedly connected to said arm at the second end thereof and extending substantially perpendicularly with respect to said arm and through a portion of said housing; and
   at least one piezoelectric plate having a spacer attached to an edge thereof,
   wherein the spacer of said at least one piezoelectric plate is resiliently urged against at least one, respective, portion of said axle outside said housing.

2. A disc drive according to claim 1 wherein said portion of the housing forms a substantially dust-proof barrier between said at least one piezoelectric plate and the interior of said housing.

3. A disc drive according to claim 1 and further comprising a sealed bearing where said axle extends through said portion of the housing.

4. A disc drive according to claim 2 and further comprising a sealed bearing where said axle extends through said portion of the housing.

5. A disc drive according to claim 1 wherein each of said at least one piezoelectric plate comprises two long edges and two short edges and wherein said spacer is attached to one of the short edges.

6. A disc drive according to claim 2 wherein each of said at least one piezoelectric plate comprises two long edges and two short edges and wherein said spacer is attached to one of the short edges.

7. A disc drive according to claim 3 wherein each of said at least one piezoelectric plate comprises two long edges and two short edges and wherein said spacer is attached to one of the short edges.

8. A disc drive according to claim 4 wherein each of said at least one piezoelectric plate comprises two long edges and two short edges and wherein said spacer is attached to one of the short edges.

9. A disc drive according to claim 1 wherein said at least one piezoelectric plate comprises at least two piezoelectric plates and wherein the spacers of the two piezoelectric plates engage and disengage said axle at two different locations.

10. A disc drive according to claim 2 wherein said at least one piezoelectric plate comprises at least two piezoelectric plates and wherein the spacers of the two piezoelectric plates engage and disengage said axle at two different locations.

11. A disc drive according to claim 3 wherein said at least one piezoelectric plate comprises at least two piezoelectric plates and wherein the spacers of the two piezoelectric plates engage and disengage said axle at two different locations.

12. A disc drive according to claim 4 wherein said at least one piezoelectric plate comprises at least two piezoelectric plates and wherein the spacers of the two piezoelectric plates engage and disengage said axle at two different locations.

13. A disc drive according to claim 5 wherein said at least one piezoelectric plate comprises at least two piezoelectric plates and wherein the spacers of the two piezoelectric plates engage and disengage said axle at two different locations.

14. A disc drive according to claim 6 wherein said at least one piezoelectric plate comprises at least two piezoelectric plates and wherein the spacers of the two piezoelectric plates engage and disengage said axle at two different locations.

15. A disc drive according to claim 7 wherein said at least one piezoelectric plate comprises at least two piezoelectric plates and wherein the spacers of the two piezoelectric plates engage and disengage said axle at two different locations.

16. A disc drive according to claim 8 wherein said at least one piezoelectric plate comprises at least two piezoelectric plates and wherein the spacers of the two piezoelectric plates engage and disengage said axle at two different locations.

17. A disc drive according to claim 9 wherein the spacers of the two piezoelectric plates engage and disengage said axle substantially simultaneously.

18. A disc drive according to claim 10 wherein the spacers of the two piezoelectric plates engage and disengage said axle substantially simultaneously.

19. A disc drive according to claim 11 wherein the spacers of the two piezoelectric plates engage and disengage said axle substantially simultaneously.

20. A disc drive according to claim 12 wherein the spacers of the two piezoelectric plates engage and disengage said axle substantially simultaneously.

21. A disc drive according to claim 13 wherein the spacers of the two piezoelectric plates engage and disengage said axle substantially simultaneously.

22. A disc drive according to claim 14 wherein the spacers of the two piezoelectric plates engage and disengage said axle substantially simultaneously.

23. A disc drive according to claim 15 wherein the spacers of the two piezoelectric plates engage and disengage said axle substantially simultaneously.

24. A disc drive according to claim 16 wherein the spacers of the two piezoelectric plates engage and disengage said axle substantially simultaneously.

25. A disc drive according to claim 8 wherein the spacers of the two piezoelectric plates engage and disengage said axle from substantially opposite directions.

26. A disc drive according to claim 9 wherein the spacers of the two piezoelectric plates engage and disengage said axle from substantially opposite directions.

27. A disc drive according to claim 10 wherein the spacers of the two piezoelectric plates engage and disengage said axle from substantially opposite directions.

28. A disc drive according to claim 11 wherein the spacers of the two piezoelectric plates engage and disengage said axle from substantially opposite directions.

29. A disc drive according to claim 12 wherein the spacers of the two piezoelectric plates engage and disengage said axle from substantially opposite directions.

30. A disc drive according to claim 14 wherein the spacers of the two piezoelectric plates engage and disengage said axle from substantially opposite directions.

31. A disc drive according to claim 15 wherein the spacers of the two piezoelectric plates engage and disengage said axle from substantially opposite directions.

32. A disc drive according to claim 16 wherein the spacers of the two piezoelectric plates engage and disengage said axle from substantially opposite directions.

33. A disc drive according to claim 17 wherein the spacers of the two piezoelectric plates engage and disengage said axle from substantially opposite directions.

34. A disc drive according to claim 18 wherein the spacers of the two piezoelectric plates engage and disengage said axle from substantially opposite directions.

35. A disc drive according to claim 19 wherein the spacers of the two piezoelectric plates engage and disengage said axle from substantially opposite directions.

36. A disc drive according to claim 20 wherein the spacers of the two piezoelectric plates engage and disengage said axle from substantially opposite directions.

37. A disc drive according to claim 21 wherein the spacers of the two piezoelectric plates engage and disengage said axle from substantially opposite directions.

38. A disc drive according to claim 22 wherein the spacers of the two piezoelectric plates engage and disengage said axle from substantially opposite directions.

39. A disc drive according to claim 23 wherein the spacers of the two piezoelectric plates engage and disengage said axle from substantially opposite directions.

40. A disc drive according to claim 24 wherein the spacers of the two piezoelectric plates engage and disengage said axle from substantially opposite directions.

41. A disc drive according to claim 1 wherein said at least one piezoelectric plate comprises at least three piezoelectric plates and wherein the spacers of each of said at least three plates engage at least three, respective, locations on said axle.

42. A disc drive according to claim 2 wherein said at least one piezoelectric plate comprises at least three piezoelectric plates and wherein the spacers of each of said at least three plates engage at least three, respective, locations on said axle.

43. A disc drive according to claim 3 wherein said at least one piezoelectric plate comprises at least three piezoelectric plates and wherein the spacers of each of said at least three plates engage at least three, respective, locations on said axle.

44. A disc drive according to claim 4 wherein said at least one piezoelectric plate comprises at least three piezoelectric plates and wherein the spacers of each of said at least three plates engage at least three, respective, locations on said axle.

45. A disc drive according to claim 5 wherein said at least one piezoelectric plate comprises at least three piezoelectric plates and wherein the spacers of each of said at least three plates engage at least three, respective, locations on said axle.

46. A disc drive according to claim 9 wherein said at least one piezoelectric plate comprises at least three piezoelectric plates and wherein the spacers of each of said at least three plates engage at least three, respective, locations on said axle.

47. A disc drive according to claim 17 wherein said at least one piezoelectric plate comprises at least three piezoelectric plates and wherein the spacers of each of said at least three plates engage at least three, respective, locations on said axle.

48. A disc drive according to claim 25 wherein said at least one piezoelectric plate comprises at least three piezoelectric plates and wherein the spacers of each of said at least three plates engage at least three, respective, locations on said axle.

49. A disc drive according to claim 41 wherein at least two of said at least three plates do not engage and disengage said axle simultaneously.

50. A disc drive according to claim 42 wherein at least two of said at least three plates do not engage and disengage said axle simultaneously.

51. A disc drive according to claim 43 wherein at least two of said at least three plates do not engage and disengage said axle simultaneously.

52. A disc drive according to claim 44 wherein at least two of said at least three plates do not engage and disengage said axle simultaneously.

53. A disc drive according to claim 45 wherein at least two of said at least three plates do not engage and disengage said axle simultaneously.

54. A disc drive according to claim 46 wherein at least two of said at least three plates do not engage and disengage said axle simultaneously.

55. A disc drive according to claim 47 wherein at least two of said at least three plates do not engage and disengage said axle simultaneously.

56. A disc drive according to claim 48 wherein at least two of said at least three plates do not engage and disengage said axle simultaneously.

57. A double disc drive comprising:

a first arm having first and second, spaced apart, sites;

a second arm substantially parallel to said first arm and having first and second, spaced apart, sites;

a first axle fixedly connected to the first site of the first arm and extending substantially perpendicularly with respect to said arm;

a second axle fixedly connected to the first site of the second arm and extending substantially co-axially with said first axle;

at least one read/write head attached to the second site of said first arm;

at least one read/write head attached to the second site of said second arm;

first and second piezoelectric plates each plate having a spacer attached to an edge thereof, wherein the spacer of the first piezoelectric plate is resiliently urged against a portion of the first axle and wherein the spacer of the second piezoelectric plate is resiliently urged against a portion of the second axle.

58. A disc drive according to claim 57 and further comprising a housing, wherein said first and second axles extend through a portion of said housing such that said first and second piezoelectric plates are urged against said first and second axles outside said housing.

59. A disc drive according to claim 58 and further comprising a first sealed bearing between said first axle and said portion of the housing and a second sealed bearing between said first axle and said second axle.

* * * * *